United States Patent
Yu et al.

(10) Patent No.: US 9,841,911 B2
(45) Date of Patent: Dec. 12, 2017

(54) GREEN NAND DEVICE (GND) DRIVER WITH DRAM DATA PERSISTENCE FOR ENHANCED FLASH ENDURANCE AND PERFORMANCE

(71) Applicant: Super Talent Technology, Corp., San Jose, CA (US)

(72) Inventors: Frank Yu, Palo Alto, CA (US); Abraham C. Ma, Fremont, CA (US); Shimon Chen, Los Gatos, CA (US); Yi Syu Yan, Bade City (TW)

(73) Assignee: Super Talent Technology, Corp., San Jose, CA (US)

( * ) Notice: Subject to any disclaimer, the term of this patent is extended or adjusted under 35 U.S.C. 154(b) by 119 days.

(21) Appl. No.: 14/930,801

(22) Filed: Nov. 3, 2015

(65) Prior Publication Data

US 2016/0054942 A1 Feb. 25, 2016

Related U.S. Application Data

(62) Division of application No. 13/927,435, filed on Jun. 26, 2013, now Pat. No. 9,223,642.

(60) Provisional application No. 61/800,604, filed on Mar. 15, 2013.

(51) Int. Cl.
| | |
|---|---|
| *G06F 12/02* | (2006.01) |
| *G06F 3/06* | (2006.01) |
| *G06F 11/00* | (2006.01) |
| *G06F 1/30* | (2006.01) |
| *G06F 11/10* | (2006.01) |
| *G11C 29/08* | (2006.01) |
| *G11C 29/52* | (2006.01) |
| *G06F 9/44* | (2006.01) |

(52) U.S. Cl.
CPC .............. *G06F 3/0619* (2013.01); *G06F 1/30* (2013.01); *G06F 3/064* (2013.01); *G06F 3/0632* (2013.01); *G06F 3/0659* (2013.01); *G06F 3/0679* (2013.01); *G06F 11/00* (2013.01); *G06F 11/1068* (2013.01); *G11C 29/08* (2013.01); *G11C 29/52* (2013.01); *G06F 9/4418* (2013.01)

(58) Field of Classification Search
CPC .. G06F 11/1464; G06F 11/2053; G06F 11/30; H04L 67/1097
See application file for complete search history.

(56) References Cited

U.S. PATENT DOCUMENTS

2015/0237139 A1* 8/2015 Chen ................... H04L 67/1097
709/217

* cited by examiner

*Primary Examiner* — Yong Choe
(74) *Attorney, Agent, or Firm* — Stuart T. Auvinen; gPatent LLC

(57) ABSTRACT

A Green NAND Device (GND) driver application queries AC line and battery status and then stores an image of processor states and caches and a resume routine to DRAM when power failure occurs. A DRAM image is then stored to flash memory for a persistent mode when battery power is available. The image in DRAM may be a partial image that includes entries, flushed caches, processor contexts, ramdisks, write caches, and a resume context. Endurance of flash memory is increased by a Super Enhanced Endurance Device (SEED) SSD. In a power down mode, the GND driver limits DRAM use and only caches in DRAM data that can be deleted on power down. Host accesses to flash are intercepted by the GND driver and categorized by data type. Paging files and temporary files cached in DRAM are optionally written to flash.

4 Claims, 65 Drawing Sheets

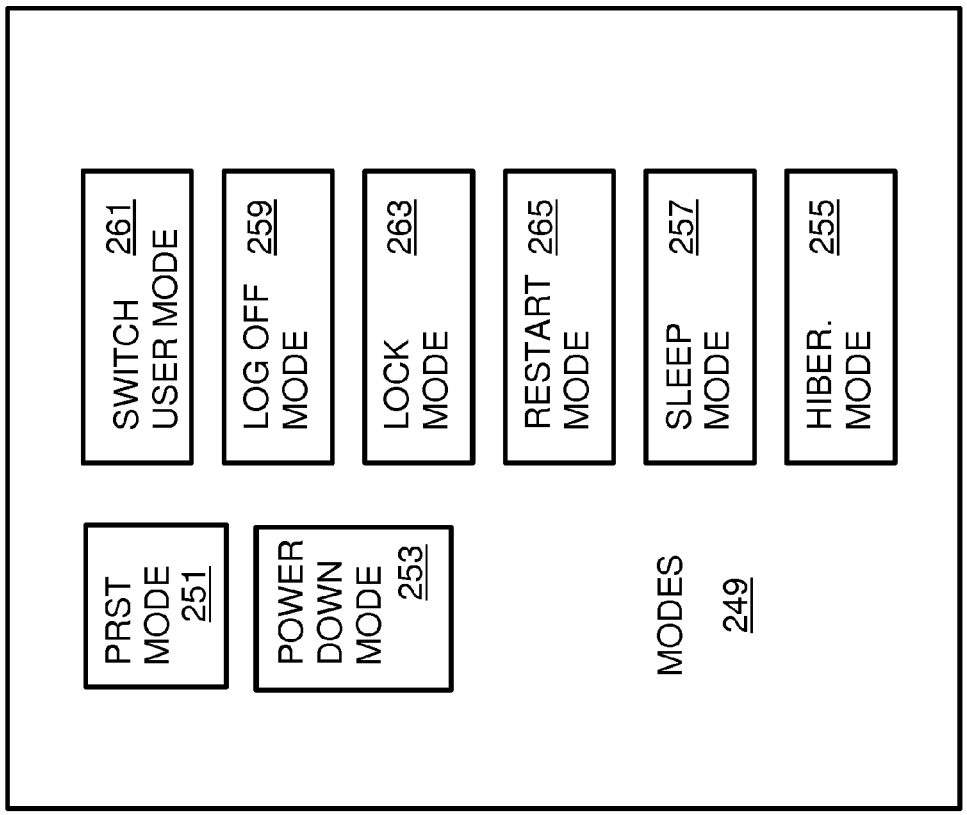

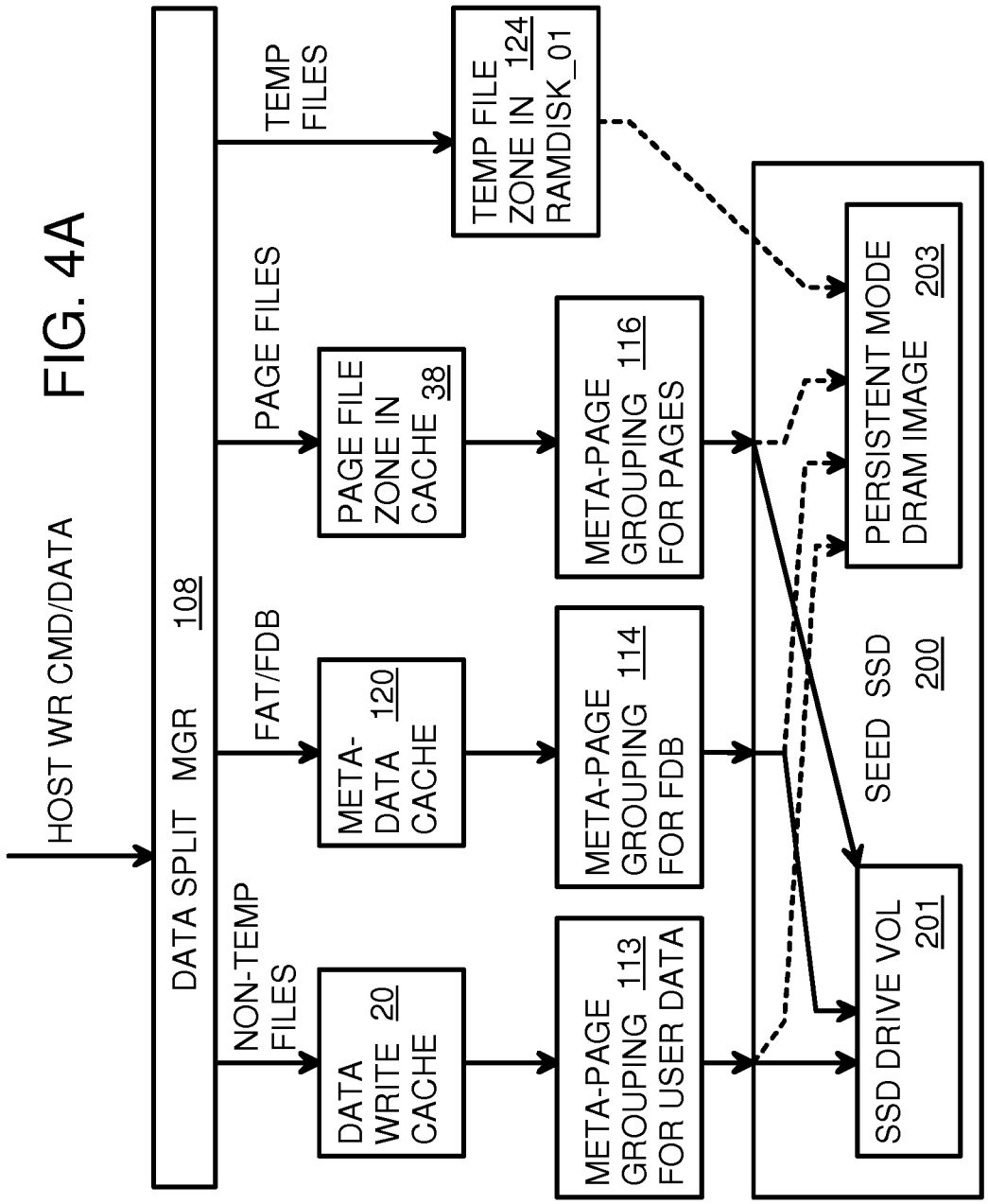

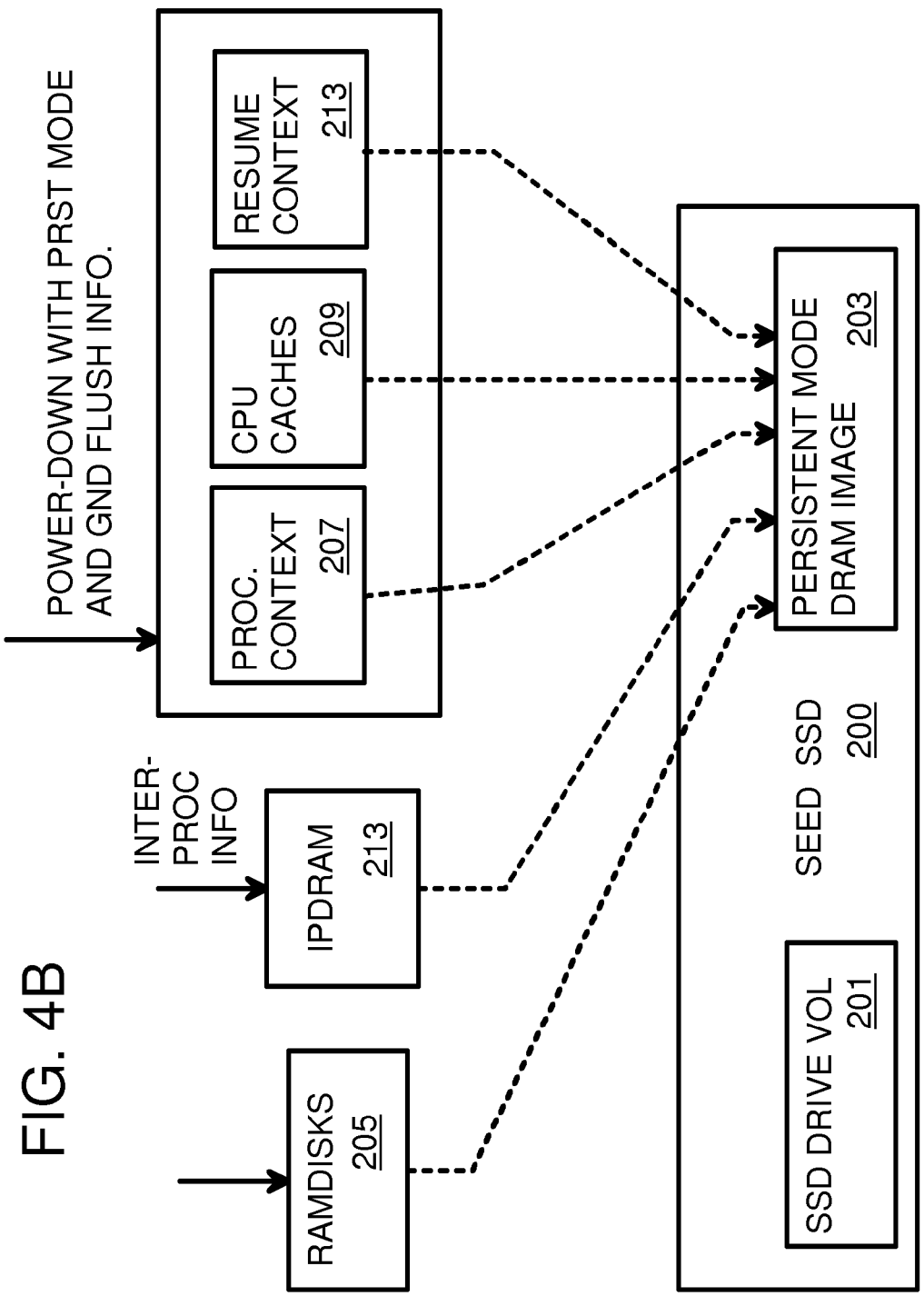

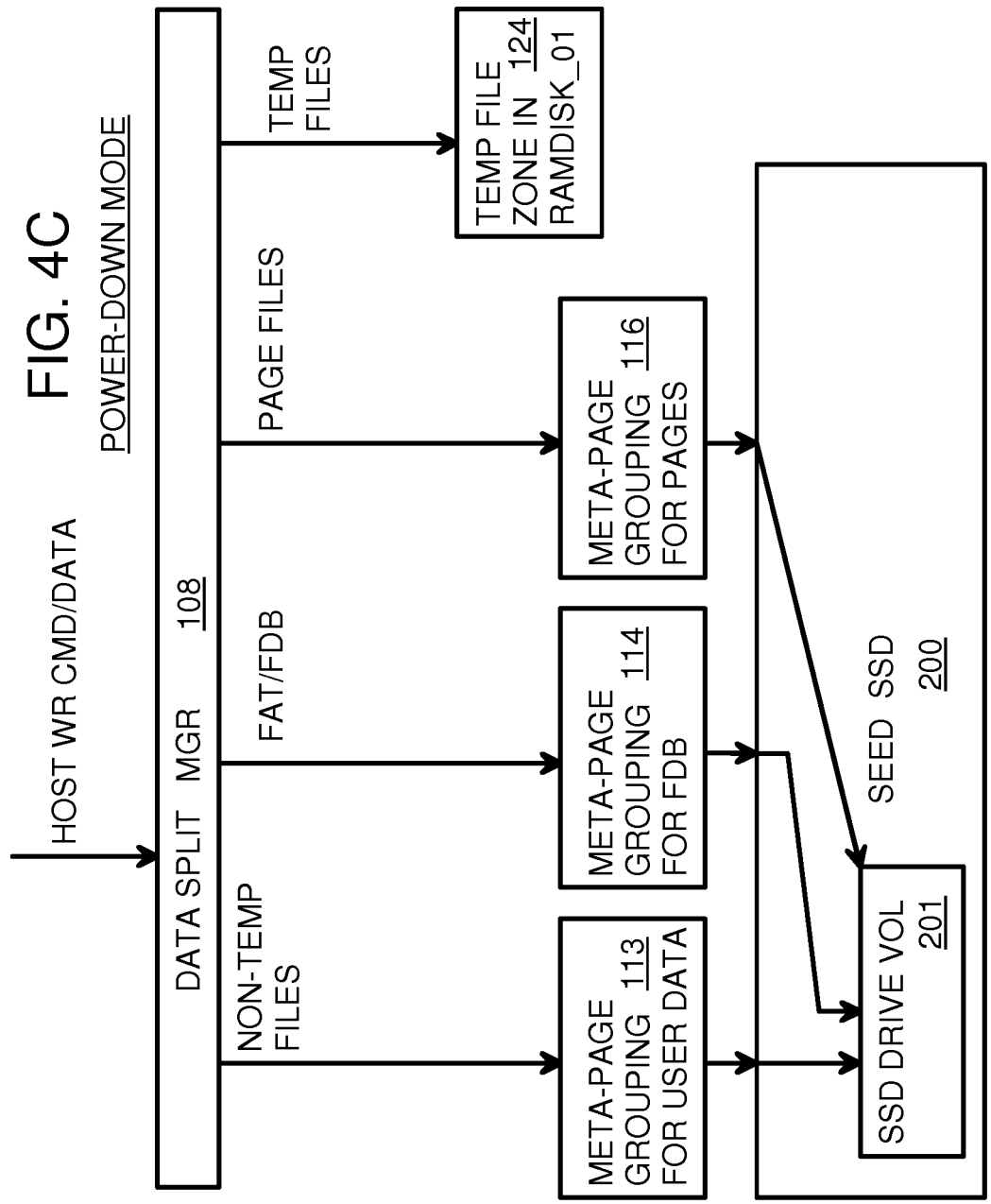

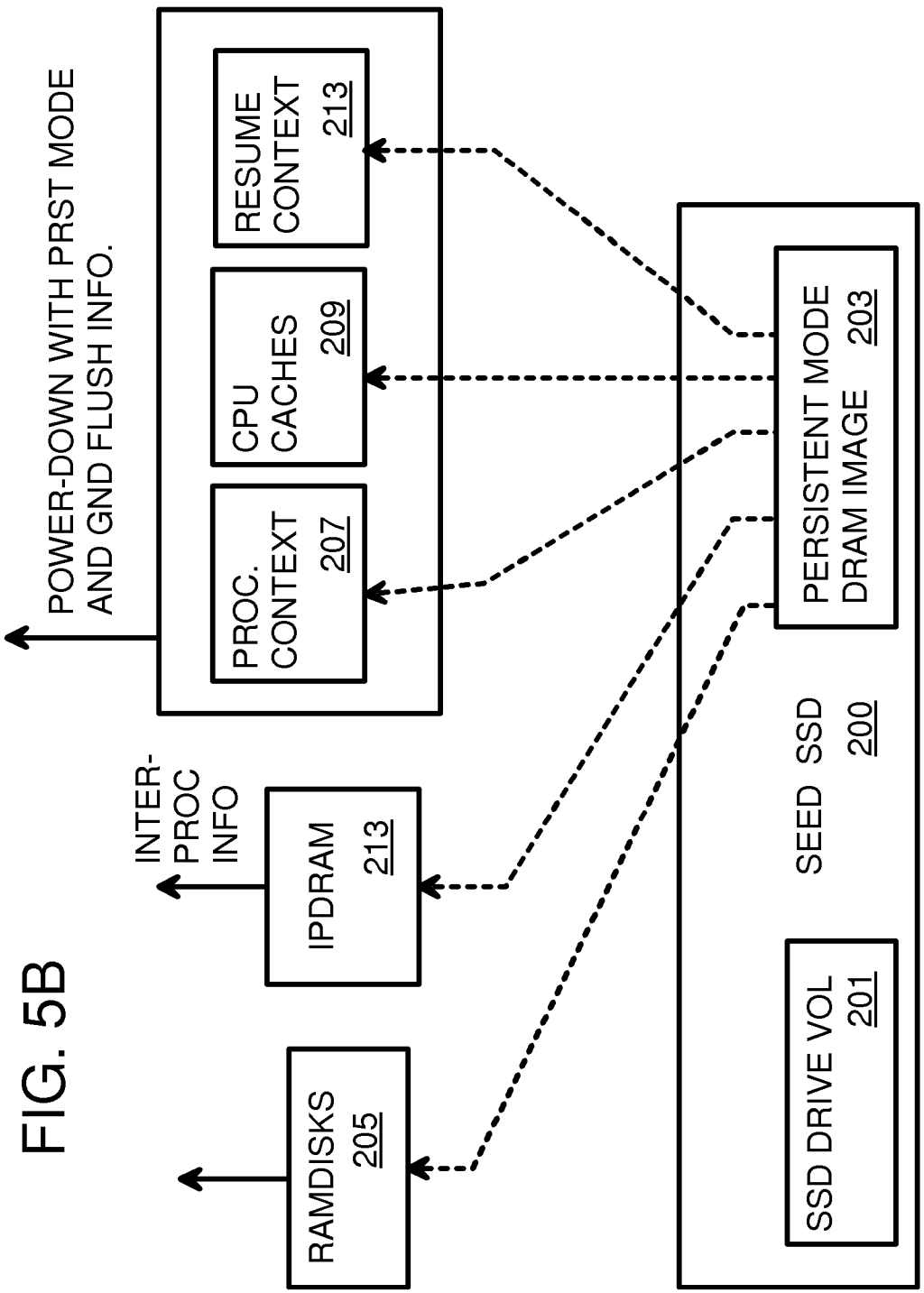

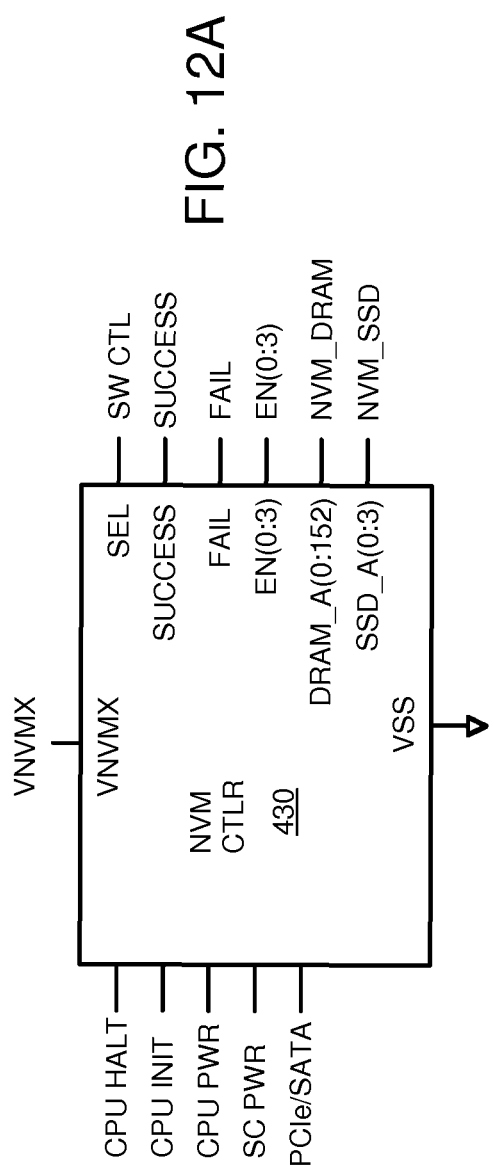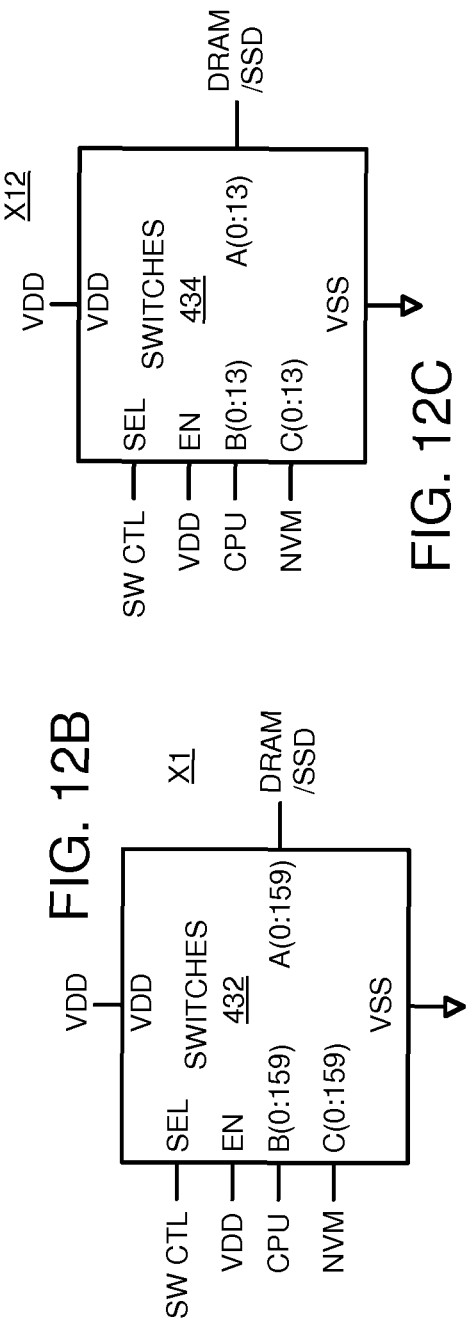

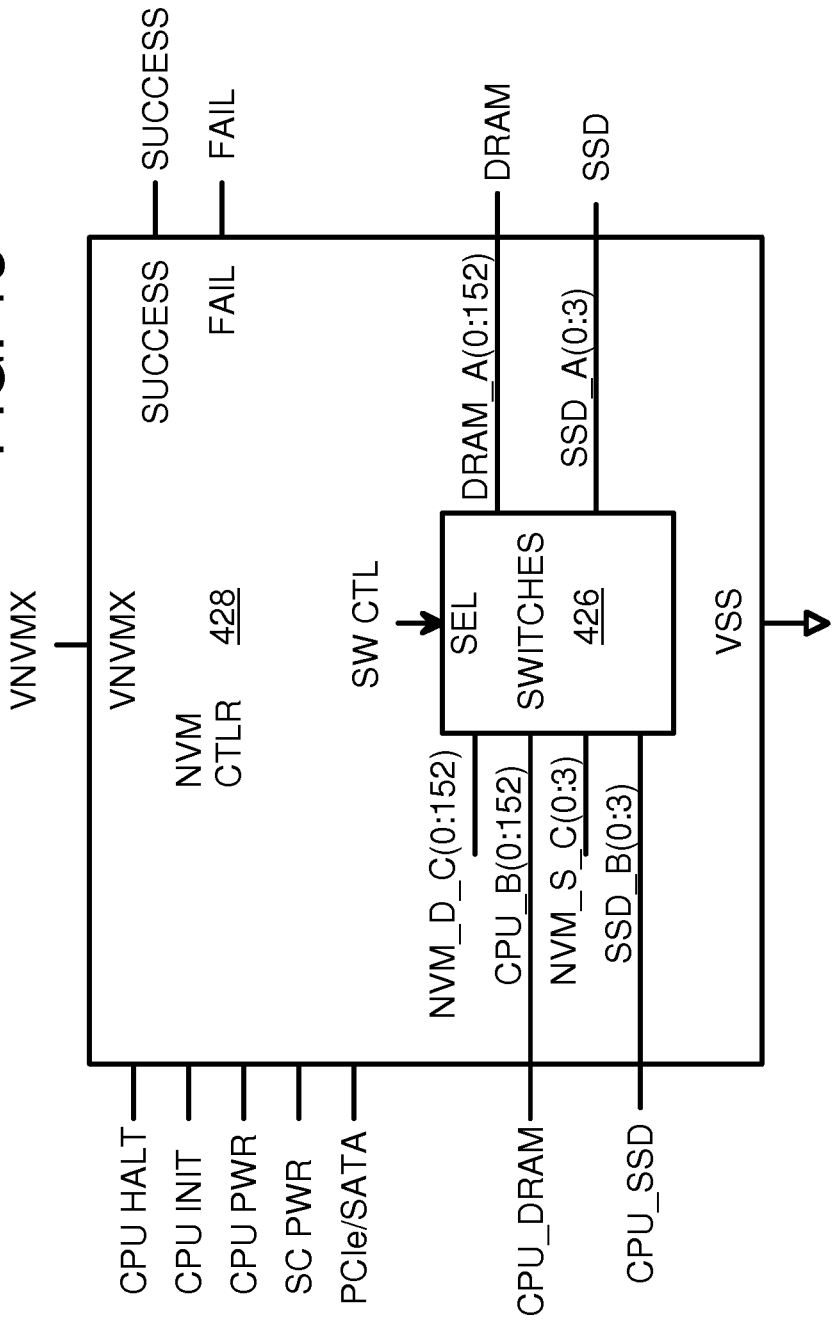

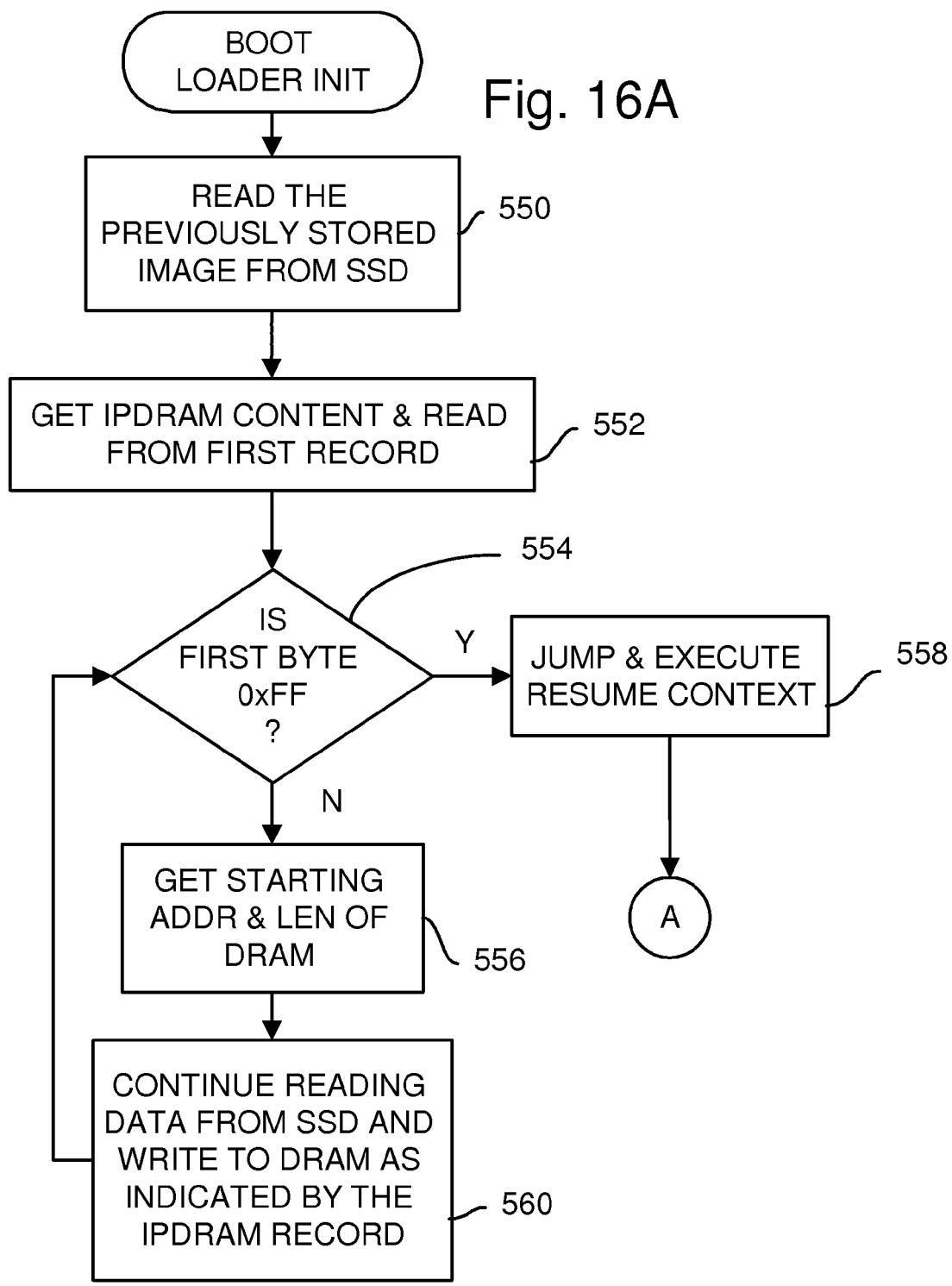

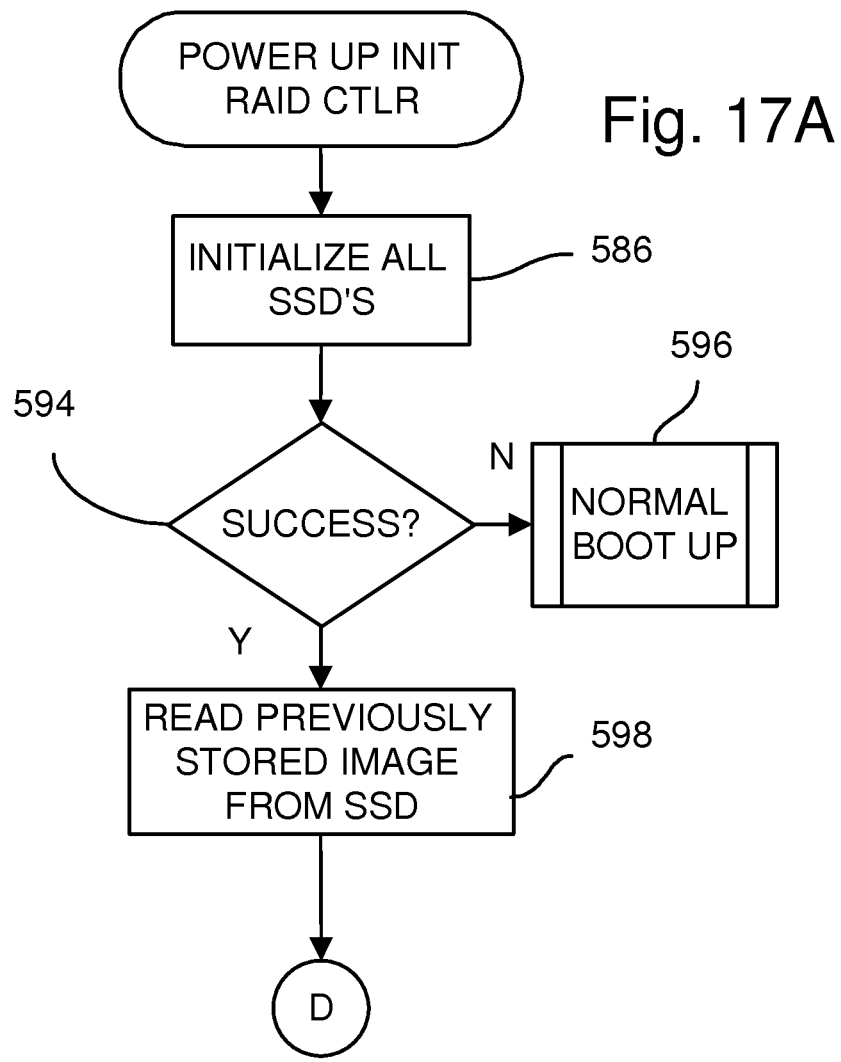

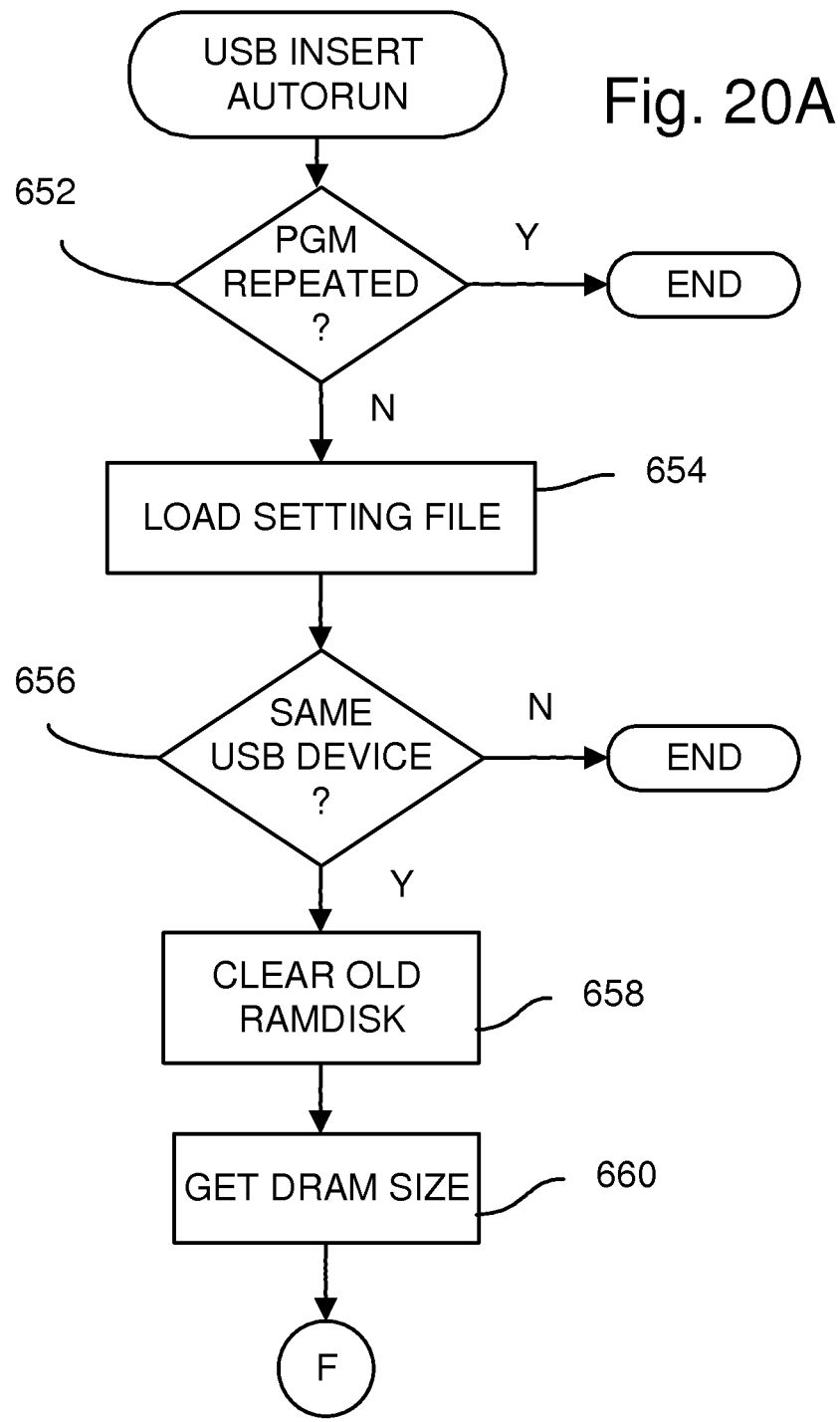

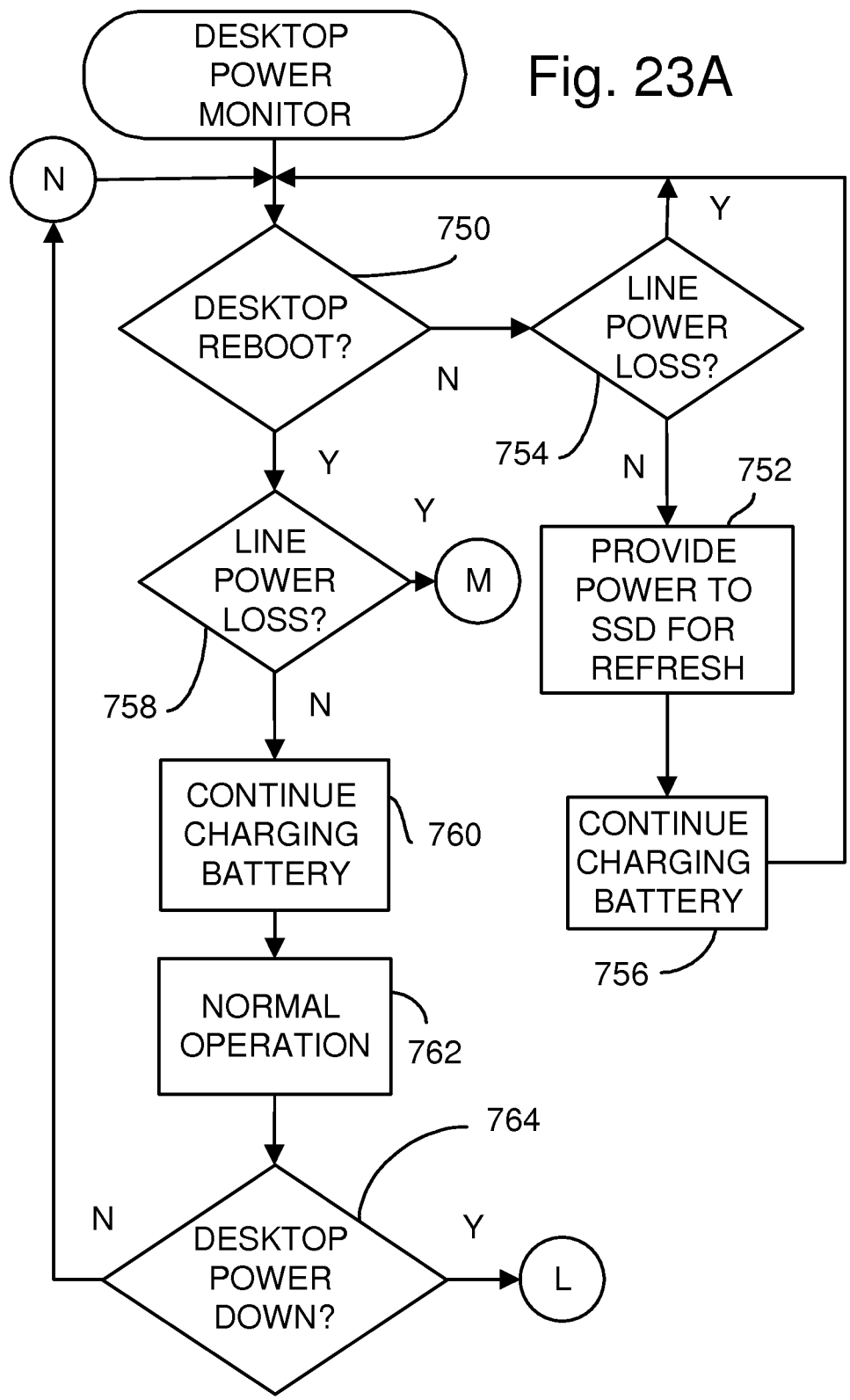

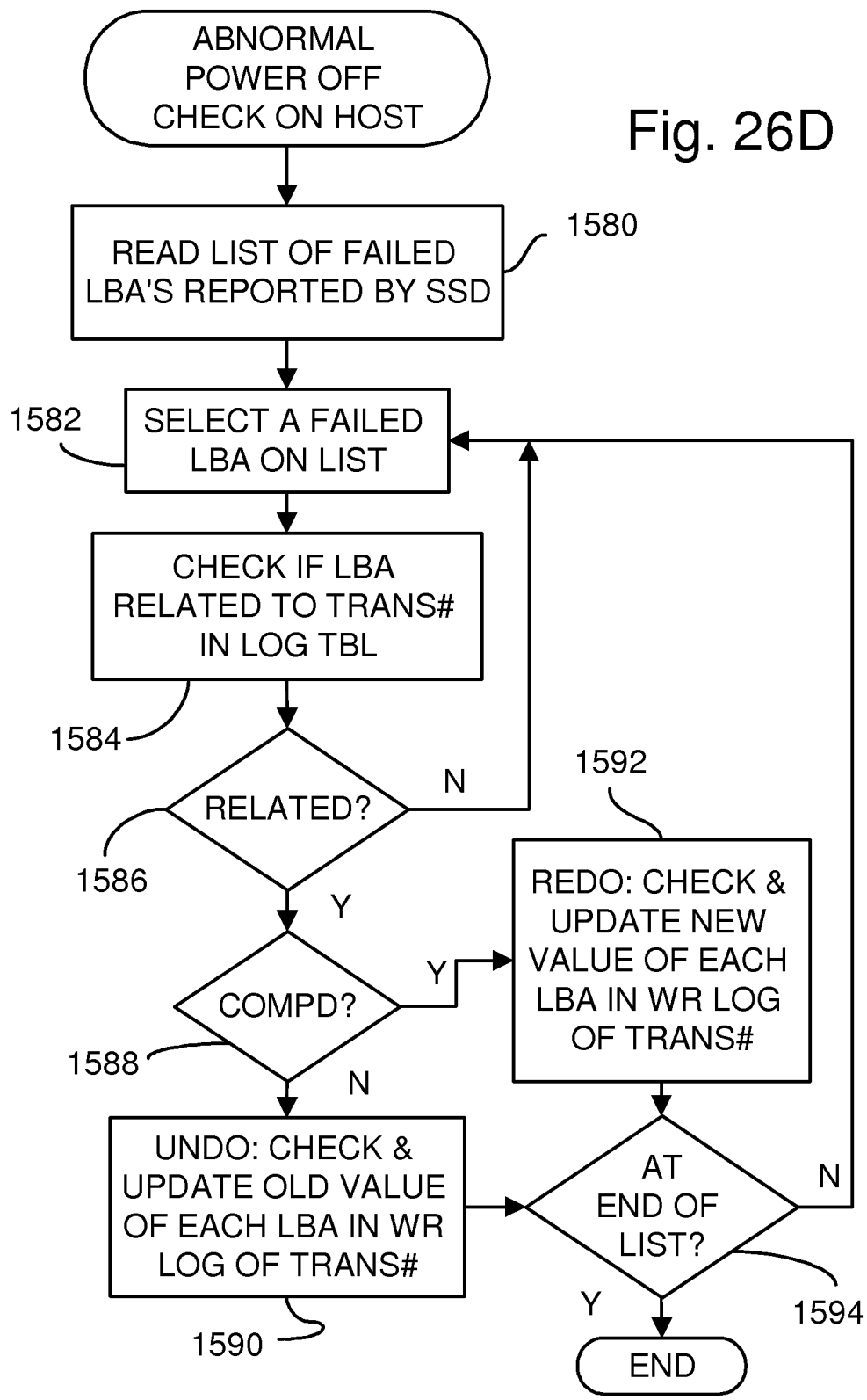

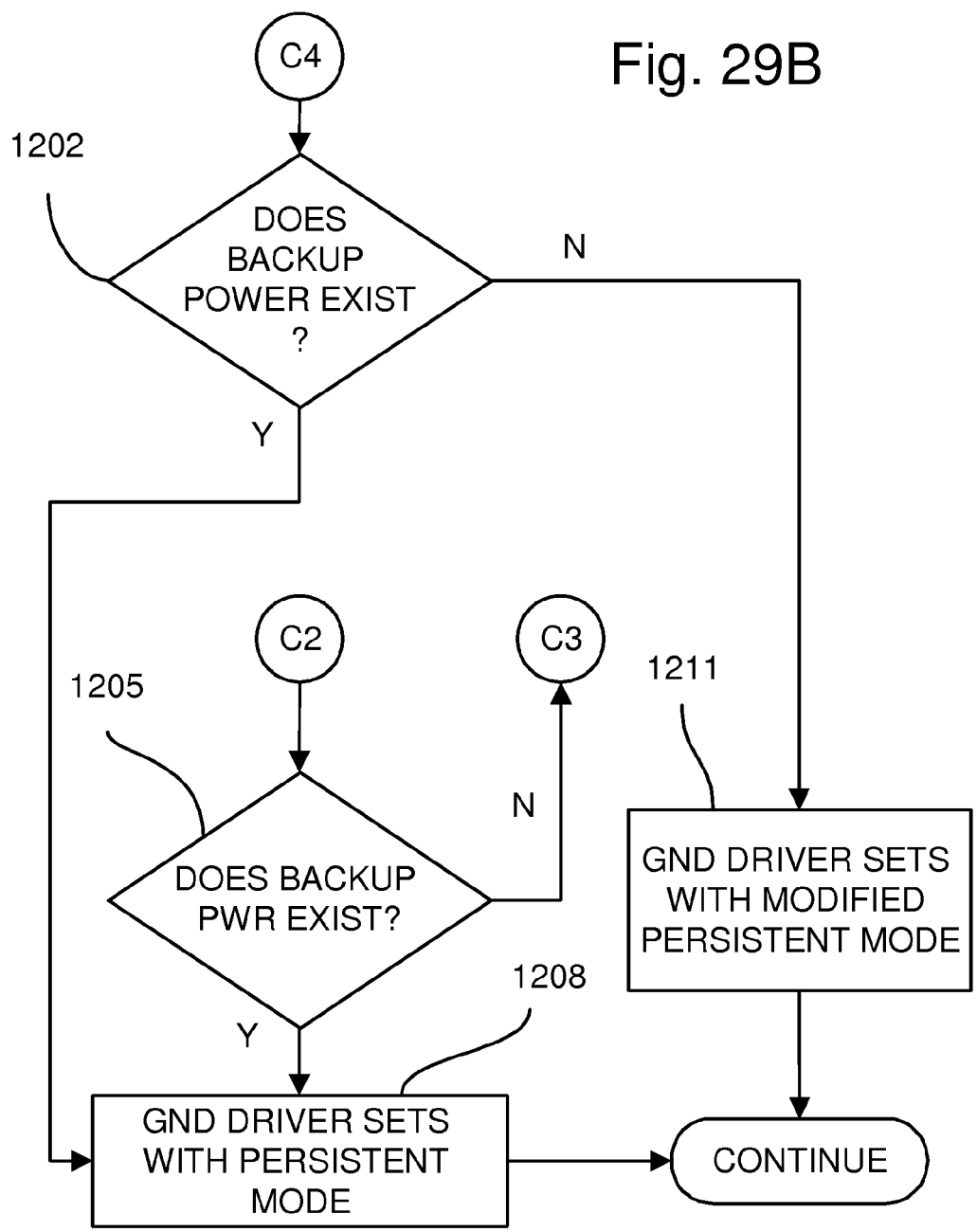

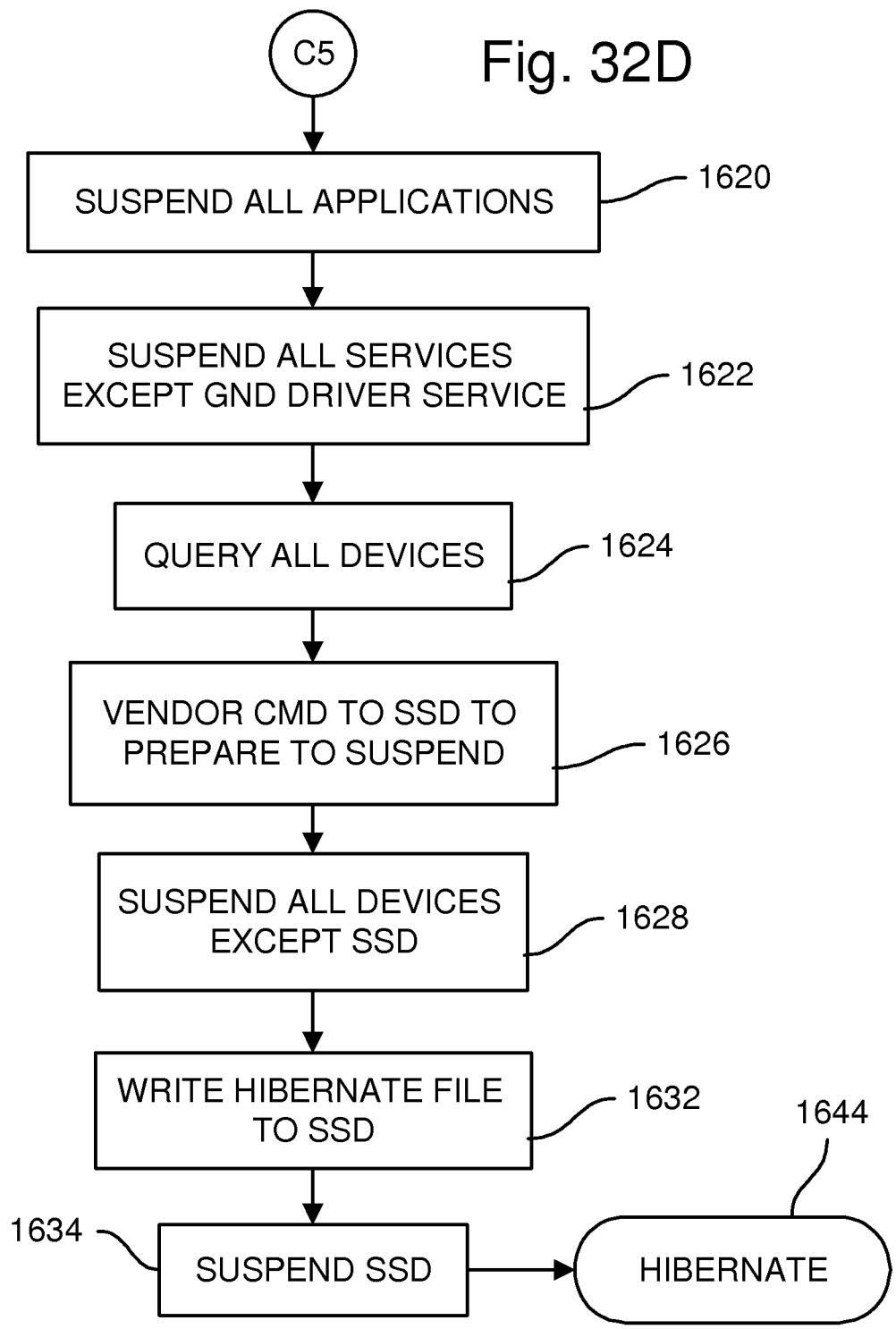

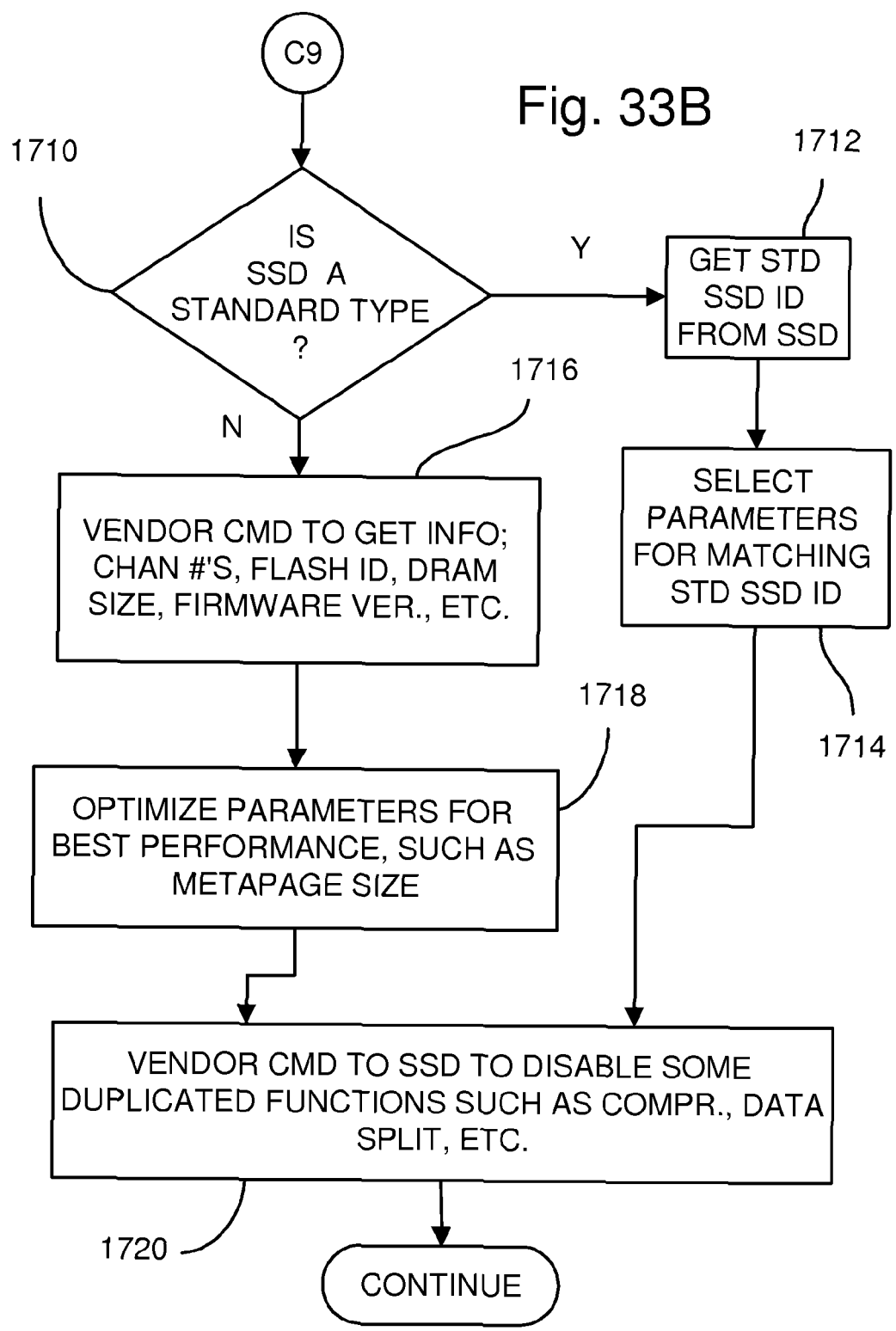

GREEN NAND DEVICE (GND) DRIVER WITH DRAM DATA PERSISTENCE FOR ENHANCED FLASH ENDURANCE AND PERFORMANCE

RELATED APPLICATIONS

This application is a divisional of "Green NAND Device (GND) Driver with DRAM Data Persistence For Enhanced Flash Endurance and Performance", U.S. Ser. No. 13/927,435 filed Jun. 26, 2013, now U.S. Pat. No. 9,223,942.

This application is related to "Endurance and Retention Flash Controller with Programmable Binary-Levels-Per-Cell Bits Identifying Pages or Blocks as having Triple, Multi, or Single-Level Flash-Memory Cells", U.S. Ser. No. 13/788,989, filed on Mar. 7, 2013.

This application is related to "Virtual Memory Device (VMD) Application/Driver with Dual-Level Interception for Data-Type Splitting, Meta-Page Grouping, and Diversion of Temp Files to Ramdisks for Enhanced Flash Endurance", U.S. Ser. No. 13/730,797, filed on Dec. 28, 2012.

This application is related to "Super-Endurance Solid-State Drive with Endurance Translation Layer (ETL) and Diversion of Temp Files for Reduced Flash Wear", U.S. Ser. No. 13/540,569, filed on Jul. 2, 2012.

This application is related to "High Performance and Endurance Non-volatile Memory Based Storage Systems", U.S. Ser. No. 12/141,879, filed Jun. 18, 2008.

FIELD OF THE INVENTION

This invention relates to Solid-State Drives (SSD's), and more particularly to Green NAND device (GND) drivers that operate with various battery and backup powered systems.

BACKGROUND OF THE INVENTION

Hard Disks with rotating magnetic platters are being replaced with more reliable Solid-State Drive (SSD) using semiconductor flash memory. NAND flash memory, invented by Dr. Fujio Masuoka of Toshiba in 1987, uses electrically-erasable programmable read-only memory (EEPROM) cells that store charge on a floating gate. Cells are typically programmed by an avalanche current, and then erased using quantum-mechanical tunneling through a thin oxide. Unfortunately, some electrons may be trapped in the thin oxide during program or erase. These trapped electrons reduce the charge stored in the cell on subsequent program cycles, assuming a constant programming voltage. Often the programming voltage is raised to compensate for trapped electrons.

As the density and size of flash memory has increased, the cell size and its reliability and lifetime have all been reduced. The number of program-erase cycles that a flash memory is guaranteed to be able to withstand was around 100,000 cycles, which allowed for a lengthy lifetime under normal read-write conditions. However, the smaller flash cells have experienced a disturbingly higher wear. Newer flash memories may be spec'ed at less than 10,000 program-erase cycles for two-level cells and about 600 for Triple-Level Cells (TLC). If current trends continue, future flash memories may only allow for 300 program-erase cycles. Such a low endurance could severely limit the applications that flash memory could be used for, and have severe impacts for Solid-State-Disk (SSD) applications.

It is likely that the underlying flash technology will have lower endurance in the future. Flash drives may compensate for the lower wear tolerance of the underlying flash memories by a variety of techniques. For example, a DRAM buffer on the flash drive may act as a write back cache, reducing the number of writes to the underlying flash memories when the host performs writes to the same data location.

Since DRAM is volatile, data is lost when power is removed. Various battery, super-capacitor, and Uninterruptible-Power-Supply (UPS) systems may be used to keep the DRAM powered up and provide the power to store the contents to a non-volatile memory. Software drivers that can make use of the various backup systems that may be present on any given system are desired.

A Green NAND Device (GND) application and driver for a host connected to a standard Solid-State Drive (SSD) or a Super-Endurance flash drive is desired that uses advanced management techniques to reduce the number of writes to flash, hence reducing program-erase cycles on the underlying flash memory. A GND application and driver on the host that operates a super-endurance flash drive with one or more of several possible power backup systems is desired. Furthermore, it is desired to preserve the processor states and DRAM contents in non-volatile memory and then use them at boot up time even in case the AC power line goes down unintentionally.

BRIEF DESCRIPTION OF THE DRAWINGS

FIGS. 2A-B show a more detailed diagram highlighting the SSD driver on the host.

FIGS. 4A-C are flow diagrams showing power down and persistent modes, data splitting and grouping for writes through the GND driver.

FIGS. 5A-C are flow diagrams showing data sorting and un-grouping for reads through the GND driver for power down and persistent modes.

FIGS. 12A-C highlight an NVM controller and isolating power switches for the NVM controller.

FIG. 13 shows a NVM controller with integrated switches.

FIGS. 16A-B show a boot loader routine on the host for DRAM persistent mode.

FIGS. 17A-B show a power reboot routine for DRAM persistent mode for the PCIe RAID controller.

FIGS. 20A-B show a GND Application routine executed by a USB device.

FIGS. 23A-B show operation of a desktop power monitor with battery backup, persistent, and normal power-down modes.

FIGS. 26A-D show routines related to logging.

FIGS. 29A-B highlight mode selection during GND driver initialization.

FIGS. 32A-E show various exit window procedures with the GND Driver.

FIGS. 33A-B show a GND driver parameters initialization routine.

DETAILED DESCRIPTION

Figure 1:
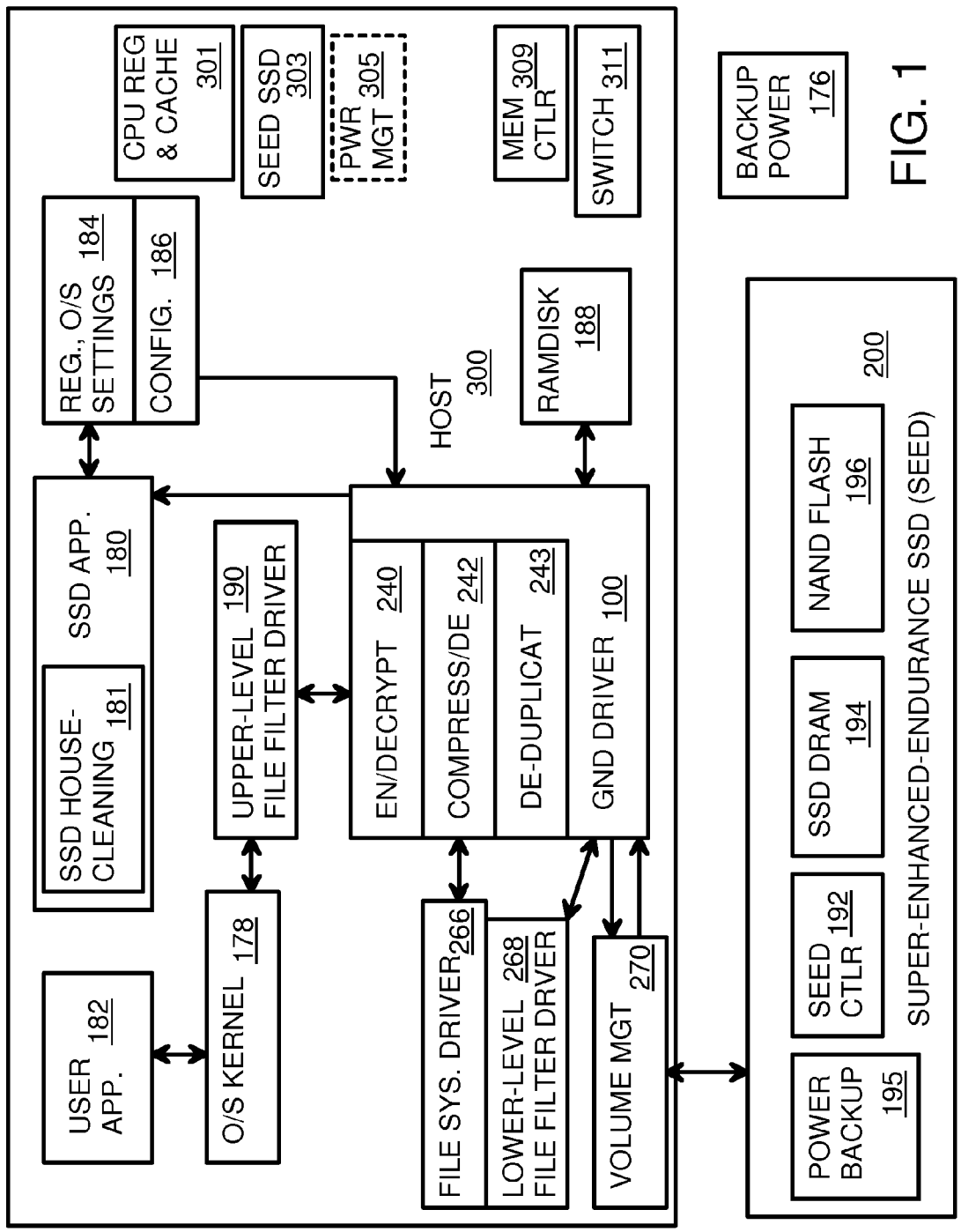
FIG. 1 is a block diagram of a GND application and driver on the host that creates and manages multiple caches and ramdisks on both the host and on a super-endurance flash drive that has low-endurance flash memory.

The present invention relates to an improvement in flash-memory drivers. It also provides way to store processor states to DRAM upon power off/failure then store the DRAM contents to non-volatile memory. At power reboot, the DRAM can be reloaded and the processor states restored. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The wear on underlying flash devices may be reduced by blocking unnecessary writes to the flash memory. A Green NAND Device (GND) application and GND driver executing on a host may block or combine writes before they reach the flash memory, thus reducing the write frequency to the flash memory. The GND diverts host writes to caches and ramdisks in the host's DRAM and/or in the SSD DRAM when sufficient backup power is provided.

DRAM buffers in the host or on the flash drive SSD device can store data that does not need to be stored permanently and thus does not need to be written to flash. The DRAM is not only faster, but also has a much higher endurance since it can be over-written more than one million times.

A typical host creates many temporary files, such as during Internet browsing, or when running certain bloated application programs, that are not critical. The inventors realize that these files do not need to be written to flash memory, reducing flash wear.

A typical system also frequently over-writes certain kinds of data. Such frequently-over-written data is best stored in a DRAM buffer, either on the host or in the flash drive and copied to the flash memory according to a policy (such as based on time elapsed, capacity allocated, etc.) or upon power down (shut down by user or power failure occurred). Storing such frequently-over-written data to flash only on power down can also significantly reduce the wear of the flash devices. Most of the meta data are small in size and grouped together such as in FAT tables. Every update involves a write to only very small portion of the flash page. Storing the meta-data in the DRAM can over time reduce unnecessary writes to flash.

Such frequently-over-written data may include log files that are frequently updated with new events. The latest copy is examined, usually after a system crash. The File Allocation Table (FAT) is another frequently-over-written location, since it is updated when files are created or expanded. The FAT table is a relatively small portion of memory, but its frequent access can significantly increase wear if every update of the FAT is copied to flash. The File Descriptor Block (FDB) is a similar structure that is frequently over-written, such as over-writing the "Date Accessed" when simply accessing and displaying a file list in windows explorer. FDB/FAT holds the meta data for the file system from the host. The various tables used together with the DRAM buffer have meta data created to store the file system to the DRAM and Flash.

Bad-block tables, erase counters, garbage collection, spare and swap blocks, mapping tables, and other files created by the flash drive need to be stored to flash according to a policy or on power down. The flash system meta files may also be stored in the DRAM buffer and copied to flash according to a policy or on power down to reduce flash wear. The above-mentioned tables and meta files are stored in flash memory at power up. They are loaded into a DRAM buffer at device initialization. Subsequent host data read/writes change the data contents. When power down occurs, dirty tables and meta files need to be written or backed up to flash. Host data in the write cache, FIFO buffers, data-in buffer, endurance spare and swap blocks, and other buffers in the flash drive may also be copied to flash on a power failure to allow for system recovery if an exact recovery point is needed for a particular application.

Paging files that the system uses for memory management, when images of the host's main DRAM memory are traditionally moved to a hard disk, or to a flash drive. Page swapping files are not critical if lost on a power failure, since the system would need to be rebooted anyway, and the memory management and paging systems would be re-initialized, wiping out any stored paging files. These paging files may also be stored in the DRAM buffer, and do not have to be copied to flash on a power down, thus reducing flash wear.

Host requests to a flash drive tend to follow regular sequences of data types. For example, a host may first access the FAT, then the FDB, then read or write a data file. This recurring sequence may assist a super-endurance flash drive to categorize data types. The FAT is always in a predetermined memory location that depends on the type of OS (Windows, Linux, Apple OS, Android, etc.). Thus an access to this range of address is a FAT type of access. The access after a FAT access is to the FDB. Then the next access is user data. Thus user data can be identified as following the FAT and FDB access. The FDB can be examined by the super-endurance flash drive to find the file extension so that .tmp files can be detected and handled differently than user data files.

Each type of file contributes to flash wear in a typical flash drive that does not distinguish among data types. Such agnostic systems treat all data equally. Everything is written to flash, at least when its entry in the DRAM buffer, if any, is cast out by another piece of data from the host that has the same cache index into the DRAM buffer. Significant reductions of flash writes can be achieved by identifying the data type and its purpose to the host, and then only writing actual user data to the flash during normal operation, and writing only critical data to flash, and then according to a policy on a power failure.

Further reductions in flash wear can be achieved by packing data. For example, data that is less than a whole page in flash (partial-page data) may be stored with other partial-page data in a single page in flash, rather than in many separate pages. A multi-channel system may have larger units such as meta-pages that have one page per channel, or the number of channels times the page size. Flash wear may be further reduced by packing into meta-pages rather than the smaller pages.

In a hostile environment, the DRAM buffer may have software errors. An extra over-provisioning DRAM can be used for ECC parity for increased reliability.

While the flash-wear savings from each technique may provide various improvements, these techniques when used together may significantly increase flash endurance. A GND application and GND driver may provide higher endurance for the flash drive using these techniques. If power is lost unintentionally, the DRAM contents will be lost causing not only the loss of recent data but the SSD may crash and all valuable data lost. A backup power source in various forms may be utilized to make sure the DRAM contents can be preserved in non-volatile memory. Furthermore, with enough backup power, the processor states can be stored in DRAM before the DRAM contents are stored in the non-volatile memory. The DRAM contents storage can be done under processor control, which requires more power, or using a NVM controller to do the work and disable the majority of the power hungry circuits.

FIG. 1 is a block diagram of a GND application and driver on the host that creates and manages multiple caches and ramdisks on both the host and on a super-endurance flash drive that has low-endurance flash memory. Host 300 has a processor that executes instructions for programs such as user apps 182 and for an operating system (OS) kernel 178 such as Windows, Linux, Apple OS, or Android, etc. Backup power supply 176 provides power to host 300 when the main power source fails, enabling host 300 to send critical data from ramdisk 188 to Super Enhanced Endurance Device (SEED) SSD 200 for storage in NAND flash memory 196 when power fails. Backup power supply 176 can use a battery or an Uninterruptible Power Supply (UPS), etc. This gives the host processor time to turn off applications and to properly power down the attached devices in power down mode. Alternately, in persistent mode, the processor will save its states, caches, and prepare the resume context in DRAM, then store the DRAM contents to the non-volatile disk. SEED SSD 200 has its own power backup 195, allowing SEED SSD 200 to write critical data to NAND flash memory 196 when the main power fails. Power backup 195 can utilize capacitors, super-capacitors, or a battery. Alternatively, if backup power supply 176 has enough power to gracefully turn off the system, power backup 195 in SEED SSD 200 is not needed, such as when host 300 is notebook or a Smart Phone.

SSD application 180 is an application executing on host 300. SSD application 180 and SSD driver 100 can be used to ease the loads of SEED SSD 200. SSD application 180 and SSD driver 100 can separate and/or store data such as temporary files, paging files etc., that are not meant to be permanently stored to flash. SSD driver 100 can manage ramdisk 188 to store such temporary data. Ramdisk 188 may be part of the host's DRAM.

SSD driver 100 may use the host CPU to perform tasks such as compression/decompression engine 242, and encryption/decryption engine 240. De-Duplication engine 243 finds and deletes duplicate copies of data files to reduce the write load. Data from user apps 182 that is written by OS kernel 178 is intercepted by upper-level file filter driver 190 and passed to SSD driver 100 for compression and/or encryption before being sent to file system driver 266. Then low-level file filter driver 268 again intercepts the data for more processing by SSD driver 100, such as for storage in ramdisk 188.

Data that is finally ready to be written to SEED SSD 200 is sent from SSD driver 100 to volume manager 270, which manages storage volumes such as SEED SSD 200. SEED controller 192 in SEED SSD 200 may store the data in SSD DRAM buffer 194 and then to NAND flash memory 196 on power down or when SSD DRAM buffer 194 is full.

SSD housecleaning 181 in SSD application 180 performs various high-level functions such as garbage collection, removing old unused files. SSD housecleaning 181 may be performed periodically, such as daily, weekly, or when SSD driver 100 manages ramdisk 188. Configuration settings 186 and registry and OS settings 184 may be set by OS kernel 178 or by other programs to define the size of ramdisk 188 or other system variables, and to manage preferred functions of SSD application 180 and SSD driver 100.

Configuration settings 186 and registry and OS settings 184 may have various settings that may improve flash endurance and performance. For example, settings may enable or disable write caching, drive indexing, search indexing, defragmentation, host hibernation, prefetching, superfetching, and windows write cache buffer flushing. Prefetching, indexing, hibernation, and defragmentation may cause additional writes to flash and thus reduce endurance. Write caching and write cache buffer flushing is disabled since the GND Driver has its own write caching and flushing functions. Thus flash endurance may be improved by disabling these features.

Some optional components shown in FIG. 1 are useful for abnormal power down situations. Power management 305 stores energy when power is on and provide power to host 300 when power fails. CPU registers and cache controller 301 writes the CPU registers and caches to host DRAM and then to SEED SSD 200 when power fails. In another embodiment SEED SSD 303 is another SSD that connects to host 300, such as through a PCIe port, USB port, NVMe port, etc. In yet another embodiment SEED SSD 303 can be located in a DRAM module and controlled by memory controller 309. CPU registers and cache controller 301 writes the CPU registers and caches to host DRAM and then to SEED SSD 200 or SEED SSD 303 when power fails in this alternative. Switch 311, when preset, isolates unnecessary components on host 300 so that they do not receive backup power, thus extending the period of backup power for critical components. Memory controller 309 may be present to transfer data between the host DRAM and SEED SSD 303 during abnormal power off and power restore. Alternately, memory controller 309 can be integrated into the processor of host 300.

Below are details of a GND driver for improved endurance and performance with configuration and OS settings:

Disable Drive Indexing: SSD drives seek is fast, about 0.1 ms, so that that indexing is not needed.

Disable Drive Search Indexing:

Disabling Search Indexing can help increase both the performance and longevity of the SSD. Disabling this option prevents windows from trying to keep track of every file for search purposes. Drawback is that SSD searches may be slower.

Reduce page file size

Leave pagefile on the SSD but set it to a fixed and reasonable size.

The Operating System will allocate a pagefile to be the same size as installed DRAM—For a large size DRAM machine it starts to chew up SSD space pretty quickly. Pagefile performs well on the SSD, depending on the amount of DRAM in the system. It may be set it to 1 or 2 GB in size (fixed, min and max the same value). It should be a balance between available space on the SSD and how much DRAM is available and regularly used.

Disable System Restore

The System Restore feature allows for software installations, drivers and other updates to be rolled back. Disabling this feature can free up between a couple of hundred Megabytes and a couple of Gigabytes. It may be turned down the amount of disk space System Restore can use, or turned off completely at the risk of not being able to automatically recover from problems caused by system changes. However, if this feature is disabled, the user should use some other form of backup, like creating a disk image backage.

Disable Hibernate

SSD space may be freed up, (up to the amount of DRAM), by disabling the Hibernation feature in Windows. By default, the size of the hibernation file (hiberfil.sys) is the same as the amount of installed DRAM on the computer. Naturally, disabling Hibernate will prevent the user from using this power-saving mode. Disabling the hibernation feature will lose the equivalent of quick boots and shutdowns. Also it provides no real benefit to a SSD due to its quick load time of 10-20 seconds, which, in some cases, equals Hibernation. But the user can elected to enable the Hibernate function by selecting it from the shut down menu.

Disable Write Caching and using a GND driver's caches. The GND driver will use its caches fully when a backup power is available.

Turning Off Write-Cache Buffer Flushing may increase the performance of SSD.

Disable Prefetch

SSDs have extremely low seek times and no rotational delay, so access times are not dependent of the location of particular segments. Prefetch therefore loses its main purpose. In addition, reducing writes to the SSD is part of optimizing its performance, so prefetch should be disabled.

Cache boot only Superfetch

A better way would be to set to cache boot files only. SuperFetch does have a purpose and just turning it completely off will only gain some disk space, and that is only if the cached files are deleted after disabling. Disabling SuperFetch will cause a busy machine to slow down as it swaps applications from disk to ram. Just because it's an SSD doesn't mean swapping won't occur or won't be noticeable.

Reduce the Recycle Bin size

Set recycle bin to a fixed and small size. Windows will set the size used as 10% of the SSD size. Using a smaller size such as 300 MB can help to free up space and reduce writes to SSD.

Reduce logging

Operating System (OS) writes extensive event logs. With the exception of some necessary logs (EventLog-Application, Security, System, Security Essentials), some logs can be safely stopped that write to the drive periodically.

Windows reliability Monitor

If the OS is on the SSD, this monitor provides an overview of hardware and software problems over time. It writes to the drive on events, and every hour. The activities of monitoring can slow down a stable system.

Use a RAMDISK on GND Driver a) Ramdisk is a good idea for all PCs (at least, those that have DRAM to spare). Put all Temp folders, Internet Explorer, Firefox, and Tbird caches, Windows event logs, and etc.in the ramdisk. For power down mode with no backup power, those temp files are lost at power down. Temp files that do not need to be written to the disk may safely be lost at power down.

b) Ramdisk only increases boot and shut down times if their contents are read/write to an image file on SSD. It is important to make a decision which is to be written back to the SSD. Other than storing temp files in the ramdisk to increase the system performance, some frequently used application software can be stored in ramdisk to decrease the startup time for those applications. The data in ramdisk will be lost after the system shuts down. The application software needs to be copies to ramdisk at every boot up. If copied with batch files, the time will be lengthy since there are too many small sized files to be accessed. Using an image file is helpful. But if the image file is included with all the different data and application software, the image file size will be too big and take a long time to load to the ramdisk. In this situation, multiple ramdisks can be used to separate the data, and frequently used application software stored into different ramdisks. So the ramdisk with frequent application software can be loaded and executed to save bootup time. Also, at power down, this kind of ramdisk can be just discarded.

c) With battery backup power available, ramdisk can be used to store data. Not only the temp files need to be preserved at power failure or off. The only time ramdisks need be stored in SSD is when the computer is shut-down (and writing the .img back to SSD) either at power failure or off.

Figure 2A:
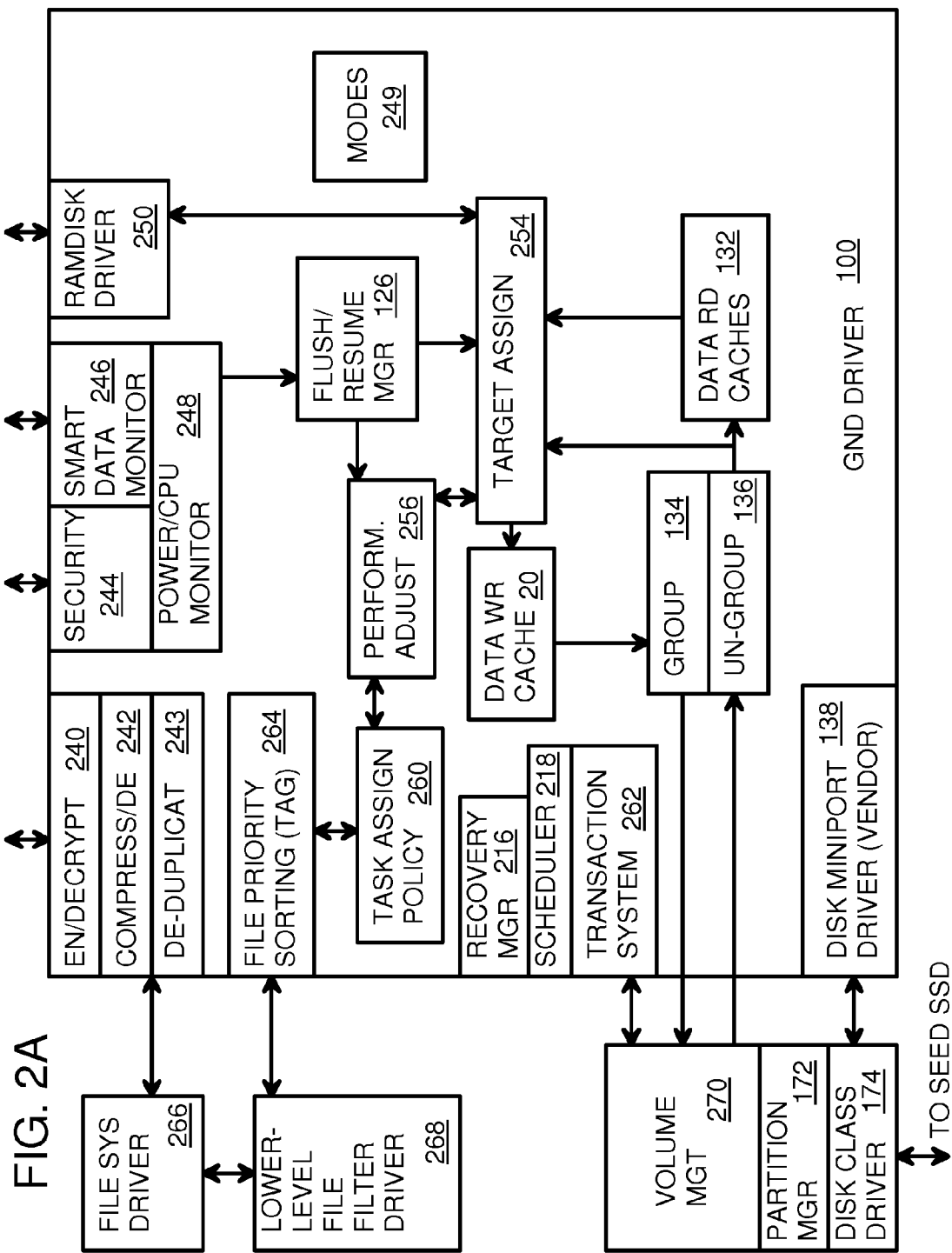

FIGS. 2A-B show a more detailed diagram highlighting the GND driver on the host. In FIG. 2A, host data written by the OS kernel and intercepted by upper-level file filter driver 190 (FIG. 1) is passed to GND driver 100 for compression by compression engine 242 and/or encryption by encryption engine 240 before being sent to file system driver 266. De-Duplication engine 243 finds and deletes duplicate copies of data files to reduce the write load. Then low-level file filter driver 268 again intercepts the data for more processing by GND driver 100.

File priority sorting 264 sorts the data based on the data type assigned by low-level file filter driver 268, or indicated by the LBA, such as for meta-data (FAT, FDB), temp files, paging files, or user data. Temp files include windows temporary files, internet browser temporary files, etc. Alternately, this function can be optionally disabled for certain uses such as a server. Operations are given a priority by task priority assignor 260 so that higher priority tasks may be performed ahead of lower-priority tasks. Performance adjustor 256 may periodically adjust these priorities to improve performance. Target assignor 254 then sends the data to ramdisk driver 250 for storage in ramdisk 188 (FIG. 1), or to data write cache 20, depending on the data type.

Data that is written to SSD may be grouped by grouper 134 before being sent to volume manager 270 and on to SEED SSD 200. Partition manager 172 and disk class driver 174 may route the data to a selected partition or disk. Disk miniport driver 138 manages vendor-specific functions of the attached SSD's. Ungrouper 136 ungroups data that was retrieved from SEED SSD 200 before being transferred to data read caches 132.

Transaction system 262 ensures that data is written completely to SEED SSD 200. Recovery manager 216 determines which write transactions were not completed due to abnormal power off, and helps applications to do the necessary redo or undo to make the data correct. Scheduler 218 manages transaction system 262 to manage and record write to SSD transactions such as start, abort, and commit.

When power monitor 248 detects a power down, it activates ramdisk flush/resume manager 126 to transfer data from data write cache 20 and ramdisk 188 to SEED SSD 200 for storage in flash memory. When the flush is done, flush/resume manager 126 will issue a vendor command to SEED SSD 200 and backup power supply 176 or power management 305 (all in FIG. 1). The backup power supply, if present, turns off power to the system and only provides power to SEED SSD 200. In case power management 305 is used, it will continue to provide power to the DRAM, SEED SSD 303, switch 311, and memory controller 309. Flush/resume manager 126 may periodically flush the contents of data write cache 20 and ramdisk 188 to SEED SSD 200 before power is lost.

Security 244 may perform a password verification process before allowing access to SEED SSD 200 or data cached by GND driver 100. Smart data monitor 246 sends S.M.A.R.T. monitoring information from SEED SSD 200 to SSD application 180. Smart data monitor 246, power/cpu monitor 248, security 244, and ramdisk driver 250 are optional.

Various power-saving modes 249 may be supported as shown in FIG. 2B. PRST mode 251 supports a persistent mode where data and processor states are retained when main power is lost or the user selects shut down. Power down mode 253 powers down the system in a controlled manner when the user selects shut down and GND driver persistent mode is disabled by the user. It will close all the loose ends and shut down the computer completely. Switch user mode 261 logs off the current user and displays a screen to let the new user to log in with his user name and password. Log-off mode 259 logs users off the system so other users can be logged in later. Lock mode 263 locks the screen and prompts for password. Restart mode 265 shuts down all applications except the critical system services such as the GND driver and then turns them back on again. Sleep mode 257 puts the system in a low-power sleep mode that allows for a faster wake-up time. Hibernation mode 255 places the system in a power off status with a wake-up image store in non-volatile memory.

Figure 3A:
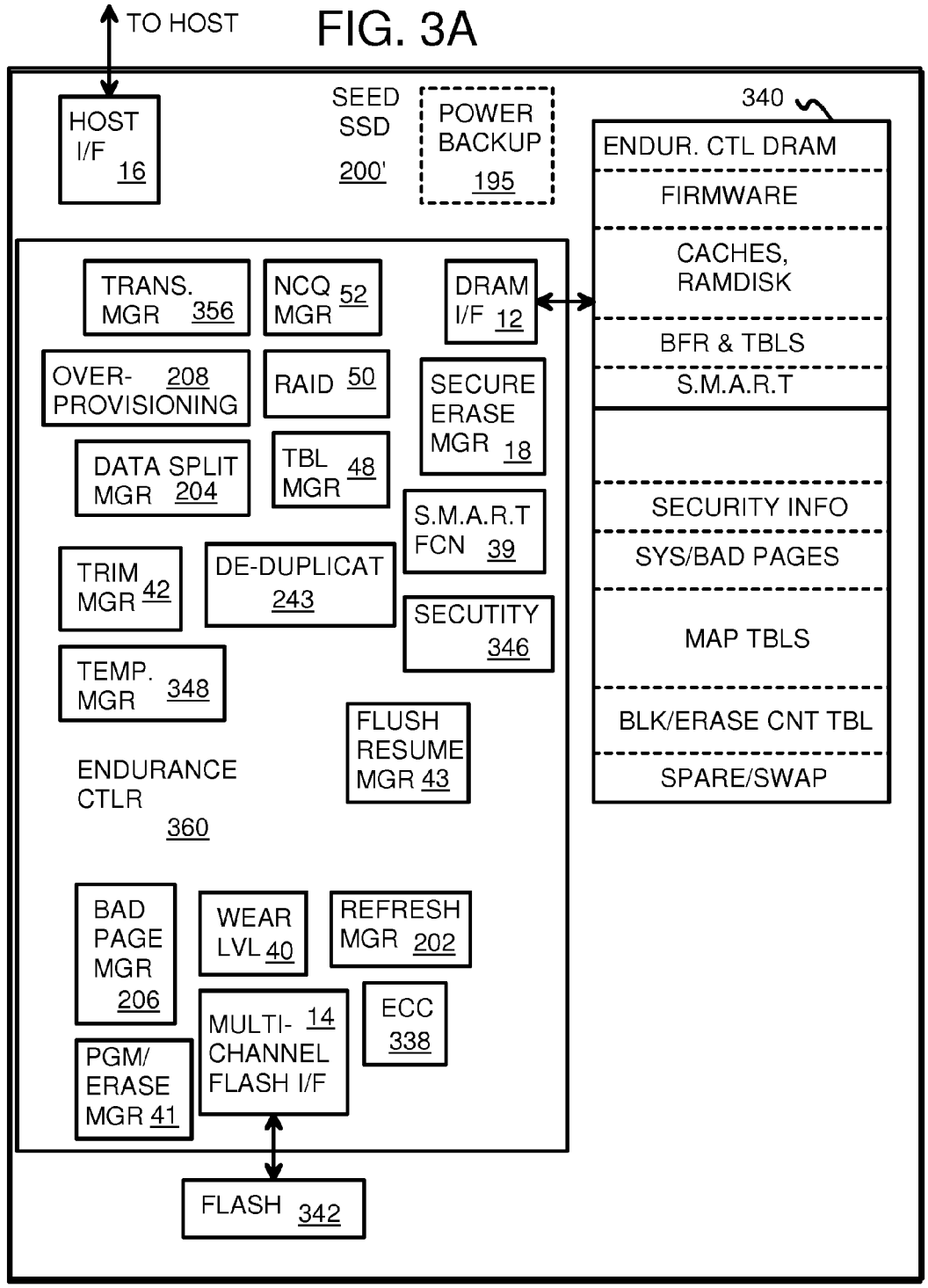
FIG. 3A is a block diagram of a Super Enhanced Endurance Device (SEED) with an endurance controller.

FIG. 3A is a block diagram of a Super Enhanced Endurance Device (SEED) with an endurance controller. In this alternative, SEED SSD 200' interfaces directly to NAND flash memory 342. SEED SSD 200' may work alone without the host GND driver. Some functions residing in the host GND driver may be implemented.

SEED SSD 200' has host interface 16, which communicates with host 300 (FIG. 1) using a bus such as a PCIe, SATA, or Universal-Serial-Bus (USB), NVMe, Thunderbolt, eMMC, iSSD, etc. Host data from host interface 16 is sent to endurance controller 360.

DRAM interface 12 reads and writes data in endurance controller DRAM 340. Endurance controller DRAM 340 may store one or more ramdisks, caches, S.M.A.R.T. information, firmware, and other buffers and tables. DRAM 340 may also store security information, tables for bad page management, mapping tables, erase count tables, spare and swap blocks, and other buffers and tables.

Refresh manager 202 may periodically refresh data in lower-level SSD flash memory 342. Flush resume manager 43 manages resume operations using flushed data. Temp manager 348 controls temp data. Security 346 manages security functions. Program/erase manager 41 may slow down page writing and block erasing time to help prolong the life of the oxide layer of cells of the flash. The slower page write/block erase time can be applied to TLC Flash to increase the endurance at the expense of decreased retention time.

Multi-channel flash interface 14 programs data pages and erases blocks in flash memory 342, which may be organized into several channels. ECC manager 338 generates low-level error-correction code (ECC) to attach to write data, and compares stored ECC to re-generated ECC to detect and correct errors on reads. It also manages pages of flash that need extra ECC protection, generating ECC for those pages, and managing storage and retrieval of the ECC data when needed. Bad page manager 206 keeps track of locations of bad pages in flash memory 342. This can extend the lifetime of individual blocks, since only one page may be bad in the block, and other pages may continue to be used. More complex bad-block management may reduce the overall wear of the flash drive.

Wear-leveler 40 may provide two methods of wear leveling methods. One method is to dynamically choose the lowest wear leveling count block from the available empty blocks to write data to. The other method is based on a wear leveling count threshold. Once this threshold is reached, blocks of flash data are moved from one physical block (with a low wear leveling count) to another empty physical block (with a high wear leveling count) in flash memory 342.

Native Command Queue (NCQ) manager 52 may re-order host commands from host 300 and manage a queue of host commands received through host interface 16. The manager loads host commands into a command queue where writes are re-ordered and combined to reduce flash writes.

RAID controller 50 writes new data across several channels of NAND flash memory 342 and may replicate data to provide redundancy and data recovery.

Updates are made to the logical-to-physical mapping in mapping tables that are managed by table manager 48. Table manager 48 also tracks the type of data that is stored in each logical block or page so that temp files, paging files, FAT, FDB, and user data files are tracked once identified and categorized by data split manager 204. Alternatively, host 300 can pass the data type information through vendor commands to SEED SSD 200 so data split manager 204 doesn't duplicate the work done by GND driver 100. Alternately, this function can be optionally disabled for certain situations.

TRIM manager 42 processes a TRIM command from the file system or OS on host 300. The TRIM command indicates that a sector is no longer needed by the host and can be wiped or erased. The trimmed page is marked in the page status table as a garbage page as '100b' or '101b'. When doing background garbage collection, if that block is identified as an erase candidate, this page is not be copied to a new block. At that time the TRIM command is completed. TRIM manager 42 performs overhead such as keeping track of which sectors and pages in a block are no longer needed. A garbage collector may also be used to track blocks that are ready for erasing. Once an entire block is no longer needed, TRIM manager 42 activates the garbage collector or other erase mechanism to erase the block so that the block may be re-used. De-Duplication engine 243 finds and deletes duplicate copies of data files to reduce the write load.

S.M.A.R.T. function 39 processes S.M.A.R.T. commands or vendor commands from host 300, such as to monitor and control error correction, wear, bad block, and other flash memory management. S.M.A.R.T. stands for Self-Monitoring, Analysis and Reporting Technology. The host can use the S.M.A.R.T. command sets to monitor some important data from the SSD device such as power on time, wear-leveling count, etc. The Host can use this data to diagnoses and identify the life expectancy of the SSD. It can also use the information to determine the warranty coverage based on the usage. The host can replace the SSD drive before it experiences a real casualty. In RAID, the host can use S.M.A.R.T. commands to avoid a more expensive RAID 5 configuration.

Transaction manager 356 ensures that data is completely written or transferred to the NAND flash. Over-provisioning 208 sets aside and manages spare blocks in NAND flash memory 342. Secure erase manager 18 performs a higher-security erase operation such as writing all zeros or all ones to a block to remove data when required.

Power backup 195 provides backup power so that SEED SSD 200' may write data from Endurance controller DRAM 340 to NAND flash memory 342 when power fails.

Figure 3B:
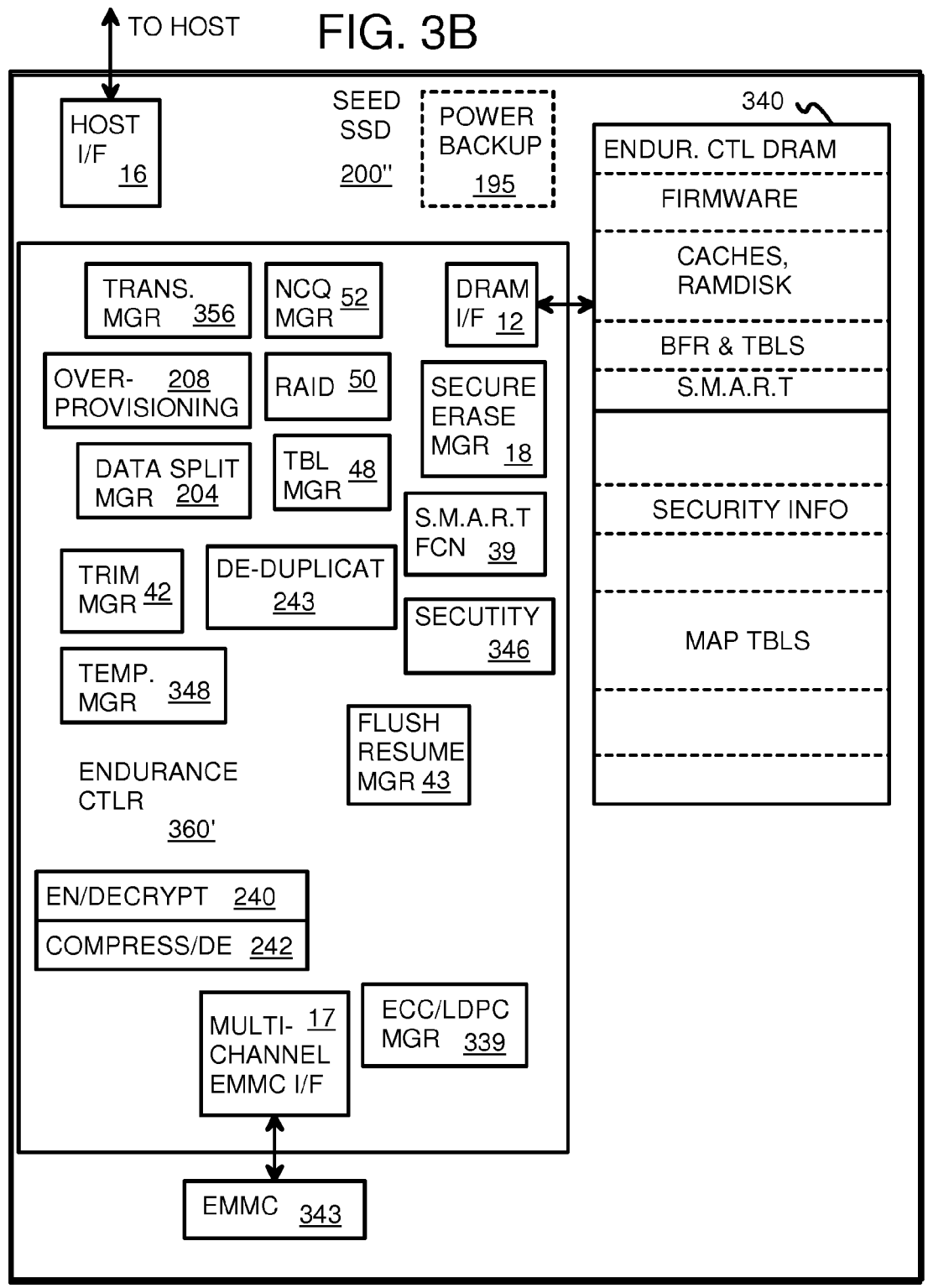
FIG. 3B is a block diagram of a Super Enhanced Endurance Device (SEED) with an endurance controller that stores data in an eMMC.

FIG. 3B is a block diagram of a Super Enhanced Endurance Device (SEED) with an endurance controller that stores data in an eMMC. In this alternative, SEED SSD 200' interfaces to enhanced Multi-Media Card (eMMC) 343 that contains flash memory.

SEED SSD 200' has host interface 16, which communicates with host 300 (FIG. 1) using a bus such as a PCIe, SATA, or Universal-Serial-Bus (USB), NVMe, Thunderbolt, eMMC, iSSD, etc. Host data from host interface 16 is sent to endurance controller 360'.

DRAM interface 12 reads and writes data in endurance controller DRAM 340. Endurance controller DRAM 340 may store one or more ramdisks, caches, S.M.A.R.T. information, firmware, and other buffers and tables. DRAM 340 may also store security information and other buffers and tables.

Flush resume manager 43 manages resume operations using flushed data. Temp manager 348 controls temp data. Security 346 manages security functions. Data may be operated upon by compression/decompression engine 242 and encryption/decryption engine 240. ECC/LDPC manager 339 manages pages of flash that need extra ECC protection, generating ECC for those pages, and managing storage and retrieval of the ECC data when needed. Low-Density Parity Check (LDPC) may be used rather than ECC.

Multi-channel eMMC interface 17 programs data in eMMC 343, which may be organized into several channels. Native Command Queue (NCQ) manager 52 may re-order host commands from host 300 and manage a queue of host commands received through host interface 16. The manager loads host commands into a command queue where writes are re-ordered and combined to reduce flash writes. RAID controller 50 writes new data across several channels of eMMC 343 and may replicate data to provide redundancy and data recovery.

Table manager 48 tracks the type of data that is stored in each logical block or page so that temp files, paging files, FAT, FDB, and user data files are tracked once identified and categorized by data split manager 204. Alternatively, the host can pass the data type information through vendor commands to the SEED SSD so data split manager 204 doesn't duplicate the work done by GND driver 100. Alternately, this function can be optionally disabled for certain situations.

TRIM manager 42 processes a TRIM command from the file system or OS on host 300. The TRIM command indicates that a sector is no longer needed by the host and can be wiped or erased. TRIM manager 42 will send the TRIM information to eMMC 343. De-Duplication engine 243 finds and deletes duplicate copies of data files to reduce the write load.

S.M.A.R.T. function 39 processes S.M.A.R.T. commands or vendor commands from host 300, such as to monitor and control error correction, wear, bad block, and other flash memory management. S.M.A.R.T. function 39 will correct S.M.A.R.T. information from eMMC 343. The host can use the S.M.A.R.T. command sets to monitor some important data from the SSD device such as power on time, wear-leveling count, etc. The Host can use this data to diagnoses and identify the life expectancy of the SSD. It can also use the information to determine the warranty coverage based on the usage. The host can replace the SSD drive before it experiences a real casualty. In RAID, the host can use S.M.A.R.T. commands to avoid a more expensive RAID 5 configuration.

Transaction manager 356 ensures that data is completely written or transferred to the eMMC 343. Over-provisioning 208 sets aside and manages spare blocks in eMMC 343. Secure erase manager 18 performs a higher-security erase operation such as writing all zeros or all ones to a block to remove data when required.

Power backup 195 provides backup power so that SEED SSD 200' may write data from Endurance controller DRAM 340 to eMMC 343 when power fails.

Figure 3C:
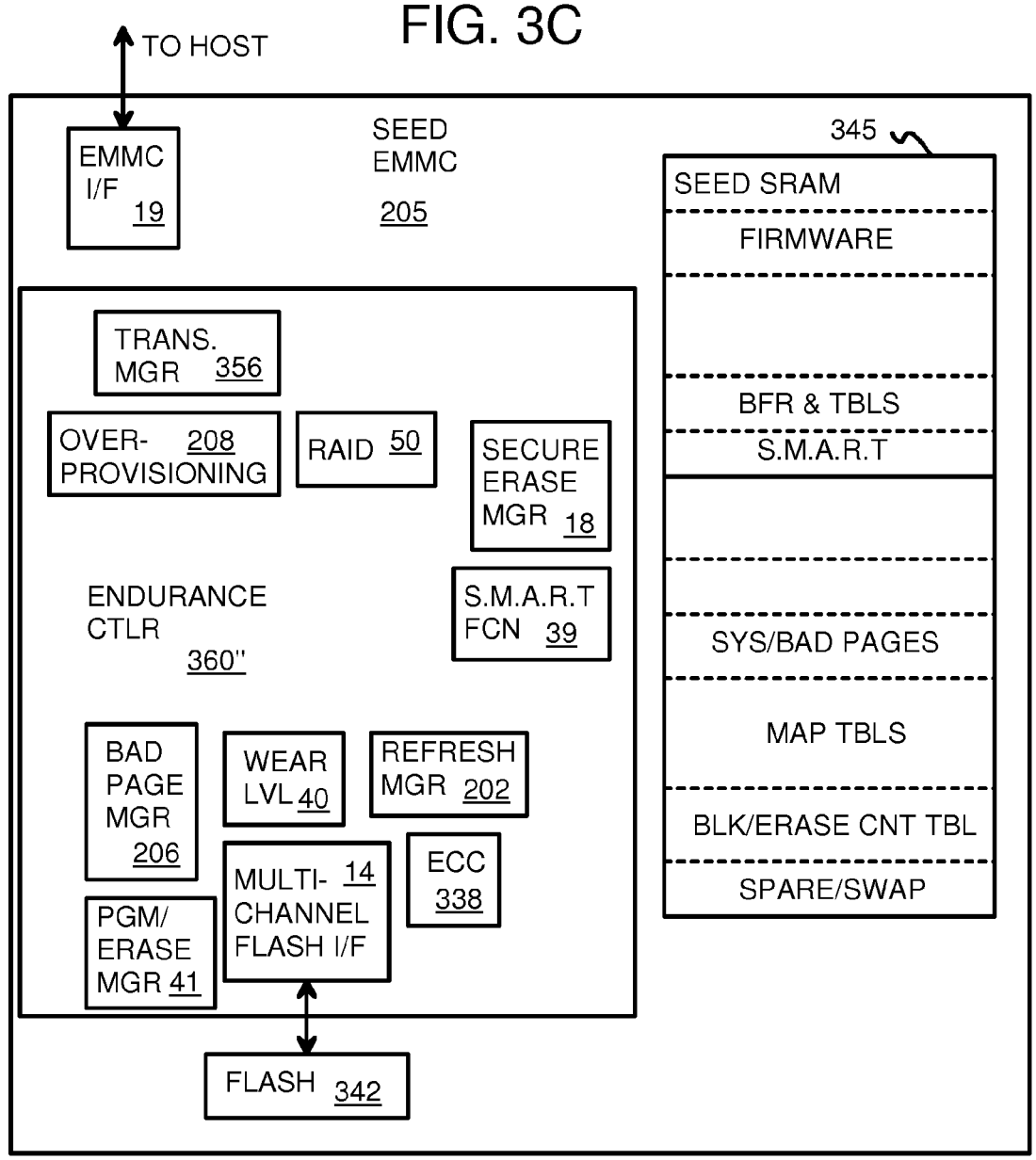
FIG. 3C is a block diagram of a Super Enhanced Endurance Device (SEED) eMMC with an endurance controller.

FIG. 3C is a block diagram of a Super Enhanced Endurance Device (SEED) eMMC with an endurance controller. In this alternative, SEED eMMC 205 interfaces directly to NAND flash memory 342.

The eMMC protocol is used by eMMC host interface 19 to communicate with host 300 (FIG. 1). Host data from eMMC host interface 19 is sent to endurance controller 360".

SEED SRAM 345 may store S.M.A.R.T. information, firmware, tables for bad page management, mapping tables, erase count tables, spare and swap blocks, and other buffers and tables.

Refresh manager 202 may periodically refresh data in lower-level SSD flash memory 342. Multi-channel flash interface 14 programs data pages and erases blocks in flash memory 342, which may be organized into several channels.

ECC manager 338 generates low-level error-correction code (ECC) to attach to write data, and compares stored ECC to re-generated ECC to detect and correct errors on reads. It also manages pages of flash that need extra ECC protection, generating ECC for those pages, and managing storage and retrieval of the ECC data when needed. Bad page manager 206 keeps track of locations of bad pages in flash memory 342. This can extend the lifetime of individual blocks, since only one page may be bad in the block, and other pages may continue to be used. More complex bad-block management may reduce the overall wear of the flash drive.

Wear-leveler 40 may provide two methods of wear leveling methods. One method is to dynamically choose the lowest wear leveling count block from the available empty blocks to write data to. The other method is based on a wear leveling count threshold. Once this threshold is reached, blocks of flash data are moved from one physical block (with a low wear leveling count) to another empty physical block (with a high wear leveling count) in flash memory 342.

Program/erase manager 41 may slow down page writing and block erasing time to help prolong the life of the oxide layer of cells of the flash. The slower page write/block erase time can be applied to TLC Flash to increase the endurance at the expense of decreased retention time.

S.M.A.R.T. function 39 processes S.M.A.R.T. commands or vendor commands from host 300, such as to monitor and control error correction, wear, bad block, and other flash memory management. S.M.A.R.T. stands for Self-Monitoring, Analysis and Reporting Technology. The host can use the S.M.A.R.T. command sets to monitor some important data from the SSD device such as power on time, wear-leveling count, etc. The Host can use this data to diagnoses and identify the life expectancy of the SSD. It can also use the information to determine the warranty coverage based on the usage. The host can replace the SSD drive before it experiences a real casualty. In RAID, the host can use S.M.A.R.T. commands to avoid a more expensive RAID 5 configuration.

Transaction manager 356 ensures that data is completely written or transferred to the NAND flash. Over-provisioning 208 sets aside and manages spare blocks in NAND flash memory 342. Secure erase manager 18 performs a higher-security erase operation such as writing all zeros or all ones to a block to remove data when required. RAID controller 50 writes new data across several channels of NAND flash memory 342 and may replicate data to provide redundancy and data recovery.

FIGS. 4A-C are flow diagrams showing data splitting and grouping for writes through GND driver 100. The host sends a write command to data split manager 108, which also receives host write data after compression or encryption by compression/encryption engine 106 if enabled. A compression table entry for the encrypted or compressed files or meta-page grouping tables may be modified in meta-data cache 120.

Data split manager 108 inside GND driver 100 (FIG. 2) sorts the host write data by data type, such as by examining the file extension or by parsing the FAT and FDB. Temp files are stored in Temp file zone 124 in ramdisk_01, with a table entry being modified in meta-data cache 120. When power turns off or fails, Temp file zone 124 is stored in persistent mode DRAM image 203 of SEED SSD 200. Alternately, Temp files are not stored in persistent mode DRAM image 203 in response to the user's selection.

Paging files are stored in paging zone 38 in the cache and are grouped with other pages containing the same paging file data type into meta-pages by paging file grouping process 116. The grouped pages will be sent to SEED SSD 200 and stored in SSD drive volume 201 if paging file zone 38 in the cache does not have enough space during normal operation. A table entry for the grouped files may be modified in meta-data cache 120. When power turns off or fails, the un-stored data in paging file zone 38 in cache and meta-page grouping 116 are stored in persistent mode DRAM image 203 not in SSD drive volume 201 of SEED SSD 200. Alternately, paging files are not stored in persistent mode DRAM image 203 by the user's selection.

Meta-data files such as FAT and FDB entries are stored in meta-data cache 120. The FDB may be grouped into meta-pages by FDB meta-page grouping process 114. The grouped pages will be sent to SEED SSD 200 and stored in SSD drive volume 201 if meta-data 120 in the cache does not have enough space during normal operation. A table entry for the grouped files may be modified in meta-data cache 120. When power turns off or fails, the un-stored data in meta-data 120 in the cache and meta-page grouping 114 are stored in persistent mode DRAM image 203, not in SSD drive volume 201 of SEED SSD 200.

User files are stored in data write cache 20 and are grouped with other pages containing the same user or non-temporary file data type into meta-pages by meta-page user file grouping process 113. The grouped pages will be sent to SEED SSD 200 and stored in SSD drive volume 201 if data write 20 in the cache does not have enough space during normal operation. A table entry for the grouped files may be modified in meta-data cache 120. When power turns off or fails, the un-stored data in data write 20 in the cache and meta-page grouping 113 are stored in persistent mode DRAM image 203, not in SSD drive volume 201 of SEED SSD 200.

FIG. 4B shows additional writes during persistent mode when power turns off or fails. Ramdisks 205 are copied to persistent mode DRAM image 203 but not to SSD drive volume 201. Inter-processor (IP) information is stored in IPDRAM 213 and copied to persistent mode DRAM image 203 but not to SSD drive volume 201. When power turns off or fails, and persistent mode is enabled, SSD driver 100 will flush and prepare information such as processor context 207, CPU caches 209, and resume context 213 to host 300 DRAM and update IPDRAM 213 before storing the DRAM data to persistent mode DRAM image 203. Battery or other backup power is needed to finish writing data to persistent mode DRAM image 203 to keep alive for a period of time. Then this data may be retrieved from persistent mode DRAM image 203 when main power is restored. Note that the write data handled by the GND driver may be processed with compression, encryption, or grouping.

Figure 29A:
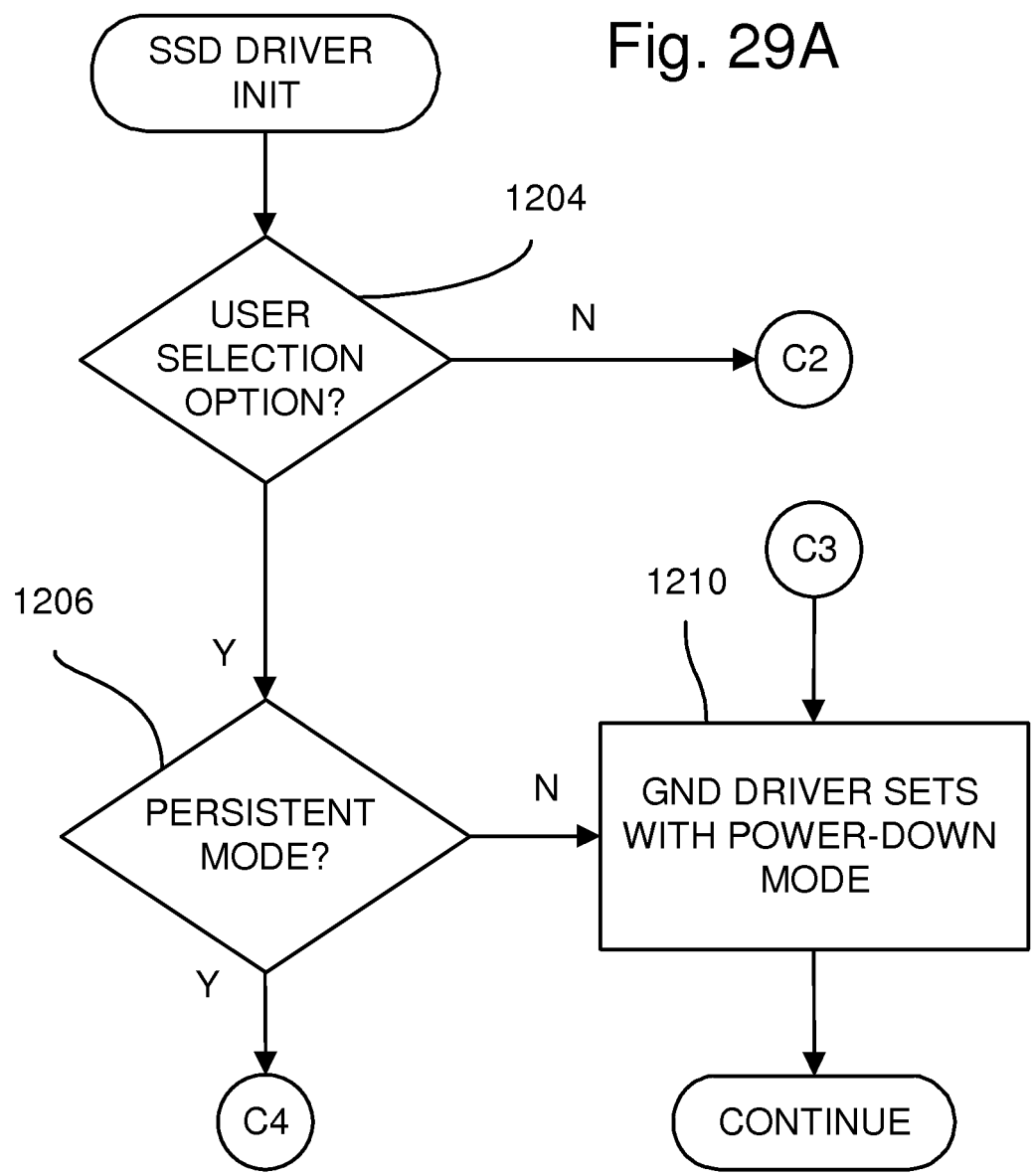

FIG. 4C shows that with a power-down mode, either host 300 has no backup power 176 or user selection option 1204 selects power down mode 1210 (FIGS. 29A,B).

A green or low-power flash device may use NAND flash memory. A GND driver will not using DRAM caches 20, 38, and 120 to avoid the loss of critical data when power fails. SSD drive volume 201 receives user or non-temporary file data type in meta-pages grouped by meta-page user file grouping process 113. SSD drive volume 201 also receives paging file data type grouped into meta-pages by paging file grouping process 116, and FDB grouped into meta-pages by FDB meta-page grouping process 114. All these three meta-page groupings are sent to SSD drive volume 201 from host 300 once the meta-page is full during normal operation. The unfinished meta-page grouping may be lost when power fails. Alternately, if the SEED SSD has a DRAM area for the mirror image of these three meta-page groupings, the loss of data when power fails can be minimized. Temp files stored in Temp file zone 124 in ramdisk_01 are lost when power turns off and fails.

Figure 5A:
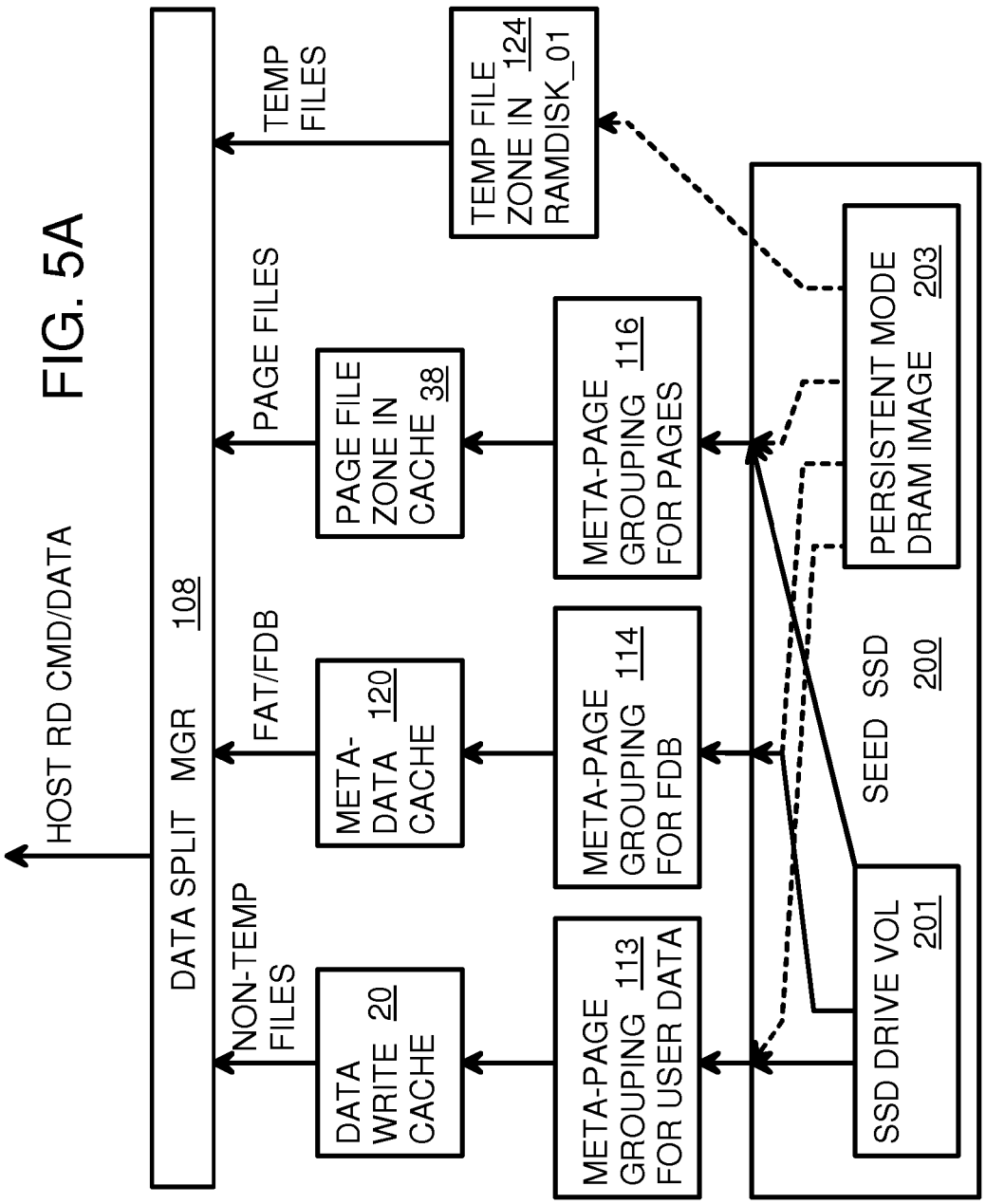
Figure 5C:
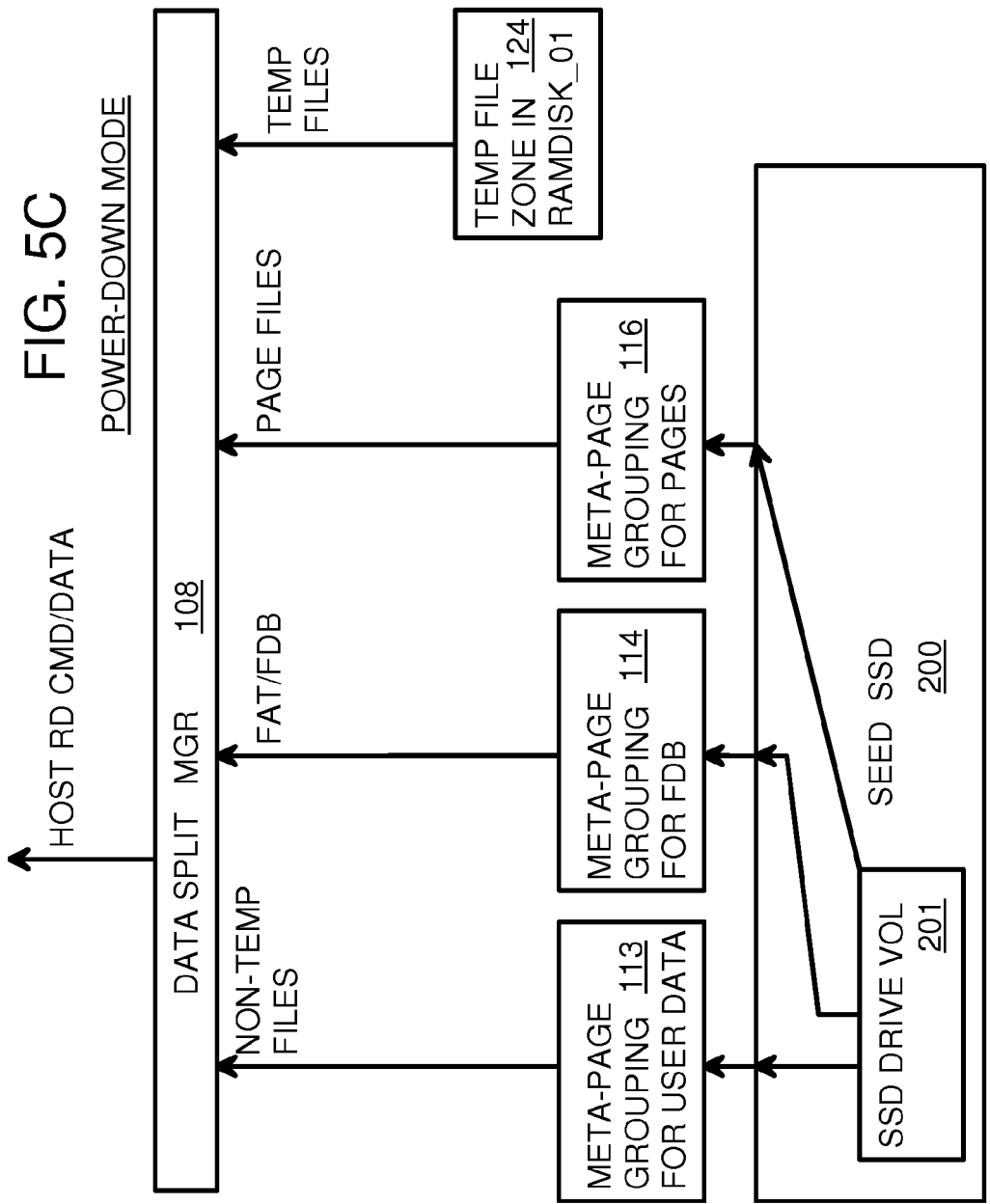

FIGS. 5A-C are flow diagrams showing data sorting and un-grouping for reads through the GND driver for power down and persistent modes. The host sends a read command to data split manager 108, which also delivers host read data after decompression or decryption by the compression/encryption engine. Data split manager 108 inside GND driver 100 (FIG. 2) sorts the host read data by data type and selects the data based on the data type.

In FIG. 5A, the user data may have recently been written and is still available from data write cache 20. The data may be stored in SSD drive volume 201 of SEED SSD 200 and must first be ungrouped by user data meta-page ungrouping process 113 and loaded into data write cache 20. FAT/FDB data stored in SSD drive volume 201 is first ungrouped by FAT/FDB meta-page ungrouping process 114 before being placed in meta-data cache 120.

Paging files stored in SSD drive volume 201 of SEED SSD 200 are first be ungrouped by paging-files meta-page ungrouping process 116 and loaded into paging zone 38 in the cache.

Temp files are not stored in flash memory and read from Temp file zone 124 in ramdisk_01 by data split manager 108. Using persistent mode during power reboot, those caches 20, 38, 120 and meta-page groupings 113, 114, 116 which are stored in persistent mode DRAM image 203 when power turns off or fails are loaded back to their same locations in DRAM.

FIG. 5B shows additional types of reads during persistent mode and power reboot. Ramdisks 205 may be copied from persistent mode DRAM image 203. Inter-processor (IP) information may be copied to IPDRAM 213 from persistent mode DRAM image 203. Flush information such as processor context 207, CPU caches 209, and resume context 213 are copied from persistent mode DRAM image 203.

FIG. 5C shows that a power-down mode, SSD drive volume 201 provides user or non-temporary file data type in meta-pages grouped by meta-page user file grouping process 113. SSD drive volume 201 also provides paging file data type grouped into meta-pages by paging file grouping process 116, and FDB grouped into meta-pages by FDB meta-page grouping process 114. Temp files are stored in Temp file zone 124 in ramdisk_01 are lost once power to the ramdisk memory is depleted.

Figure 6:
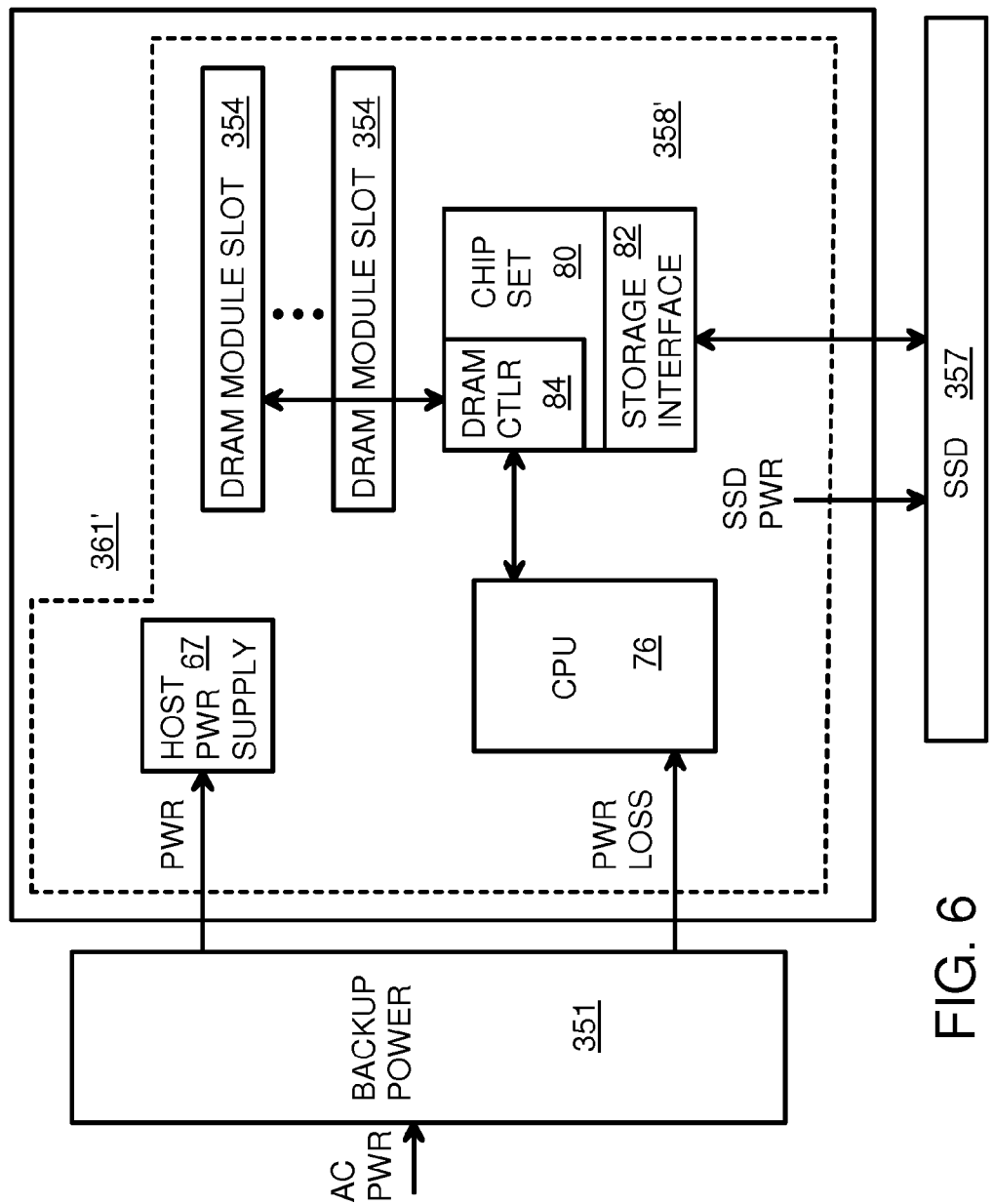
FIG. 6 is a diagram of a motherboard with a backup power supply.

FIG. 6 is a diagram of a motherboard with a backup power supply. Motherboard 361' has power domain 358' with host power supply input 67 receiving power PWR from backup power 351. Backup power 351 receives an A.C. power input and has an internal battery to provide power PWR for a period of time when the A.C. power is lost. When A.C. power is lost, a power loss signal is sent from backup power 351 to CPU 76. CPU 76 may then begin a power down routine. DRAM controller 84 in chip set 80 may be activated to read data from DRAM installed in DRAM slots 354 and write this data to flash memory in SSD 357 using storage interface 82. SSD power is provided by motherboard 361' from host power supply input 67. Alternately, DRAM CTLR 84 may reside in CPU 76 instead of in chip set 80. Backup power 351 may have DC PWR instead of AC PWR.

Figure 7:
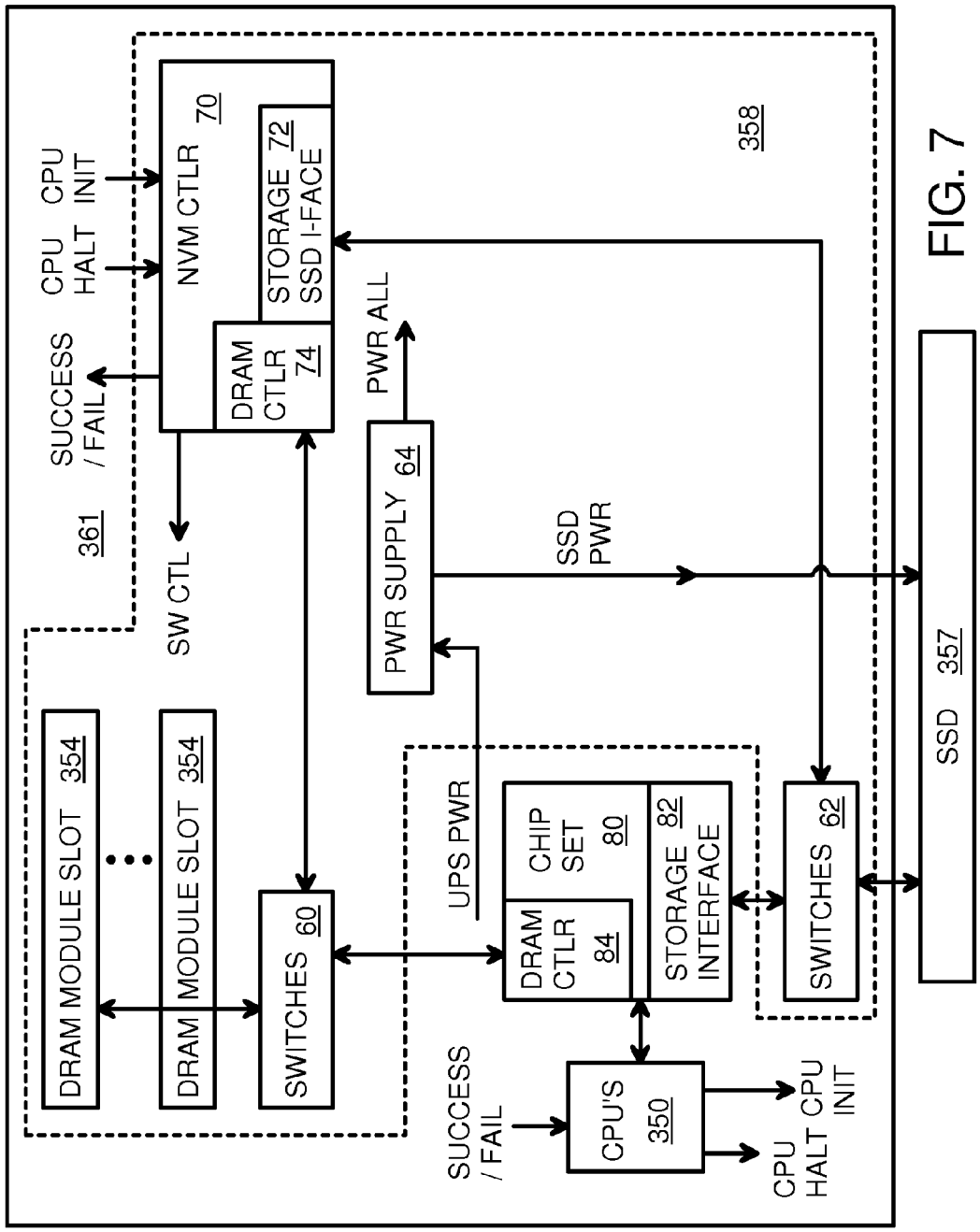
FIG. 7 is a diagram of a power-isolating motherboard with a NVM controller.

FIG. 7 is a diagram of a power-isolating motherboard with a NVM controller. Motherboard 361 has isolated power domain 358 that may be isolated from other components by switches 60, 62.

A main power source such as an Uninterruptible-Power-Supply (UPS) provides UPS power to isolated power domain 358. Power supply 64 supplies power to all components. When power turns off or fails, CPU 350 detects the power loss. SSD driver 100 will use a very short time flush and prepare information such as processor context 207, CPU caches 209, and resume context 213, and then update IPDRAM 213 to host 300 DRAM. After that, it will send the CPU HALT signal to NVM controller 70 to start the storage process of DRAM 354 contents to SSD 357. CPU 350 will be halt and power will be lost to host 300 except those in power domain 358. After CPU HALT signal is received, NVM controller 70 activates switch controls to cause switches 60 to disconnect from DRAM controller 84 in chip set 80, and causes switches 62 to disconnect from storage interface 82 in chip set 80. Alternately, chip set 80 may be integrated into CPU 350.

NVM controller 70 then reads data from DRAM in DRAM slots 354 using its DRAM controller 74, and uses its storage SSD interface 72 to write this data to SSD 357. If an IPDRAM scheme is used, only partial DRAM contents 354 pointed to by IPDRAM 213 are backed up to SSD 357 instead of the whole DRAM contents being backed up.

Since CPU 350 and chip set 80 are isolated by switches 60, 62 they may be powered down, conserving power so that NVM controller 70 may copy DRAM data to SSD 357. The remaining UPS power may be used only by NVM controller 70 and other components within isolated power domain 358.

At power reboot, CPU 350 will send a CPU INIT signal to NVM controller 70 and CPU 350 will not access DRAM 354 or SSD 357 but will wait for the NVM controller to finish loading data to DRAM 354. The NVM controller will then take over the DRAM and SSD bus signals by controlling switches 60 and 62. After that it will load the persistent mode DRAM image to DRAM 354. Once the loading has completed, it will signal a SUCCESS/FAIL signal to CPU 350 to indicate the task is done and release the DRAM and SSD bus signals back to the control of the CPU/chip set. CPU 350 will proceed with the boot up process.

Figure 8:
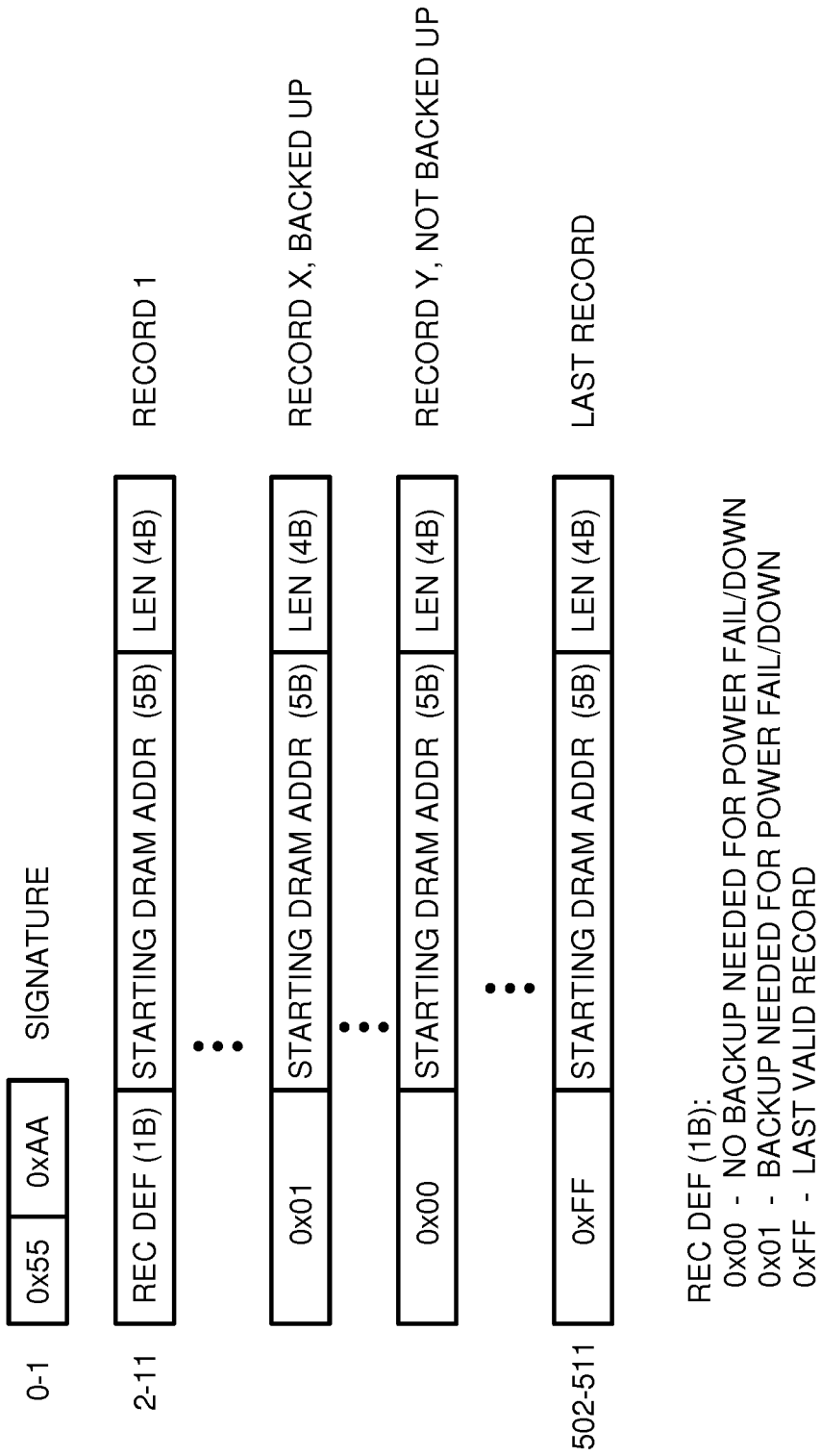
FIG. 8 shows entries in an Inter-Processor Memory.

FIG. 8 shows entries in an Inter-Processor Memory (IPDRAM 213) for the case when only selected DRAM contents are stored in persistent mode DRAM image 203. The first bytes may be a signature such as 0x55AA. Each record has a definition DEF filed that is 0x00 to indicate that the data pointed to by the record does not need to be backed up when power fails, 0x01 to indicate the need to back up the data pointed to, or 0xFF for the last valid record in the IPDRAM. Further detail can be implemented using the remaining numbers, 0x02 to 0xFE, to identify the different types of data such as 0x02 for processor context 207, 0x03 for Data Write Cache 20, etc. Each record also contains a pointer to indicate the starting address in the host DRAM, and a length field to indicate the total length of the related data. Each record will have 10 bytes in total. For a 512 byte sector, it can hold 51 records. The 0xFF record is not necessary located at the last record.

When power fails, NVM controller 70 (FIG. 7) or a power-fail routine executed by CPU 76 (FIG. 6) may read each record of IPDRAM (in case of a partial store of DRAM) and decide whether to copy the data from DRAM to SSD when the DEF field is not 0x00 or 0xFF. The IPDRAM will be located at a fixed known address of DRAM so either CPU 76 (FIG. 6) or CPU 350 and NVM controller 70 (FIG. 7) will access the same location without confusion.

Figure 9:
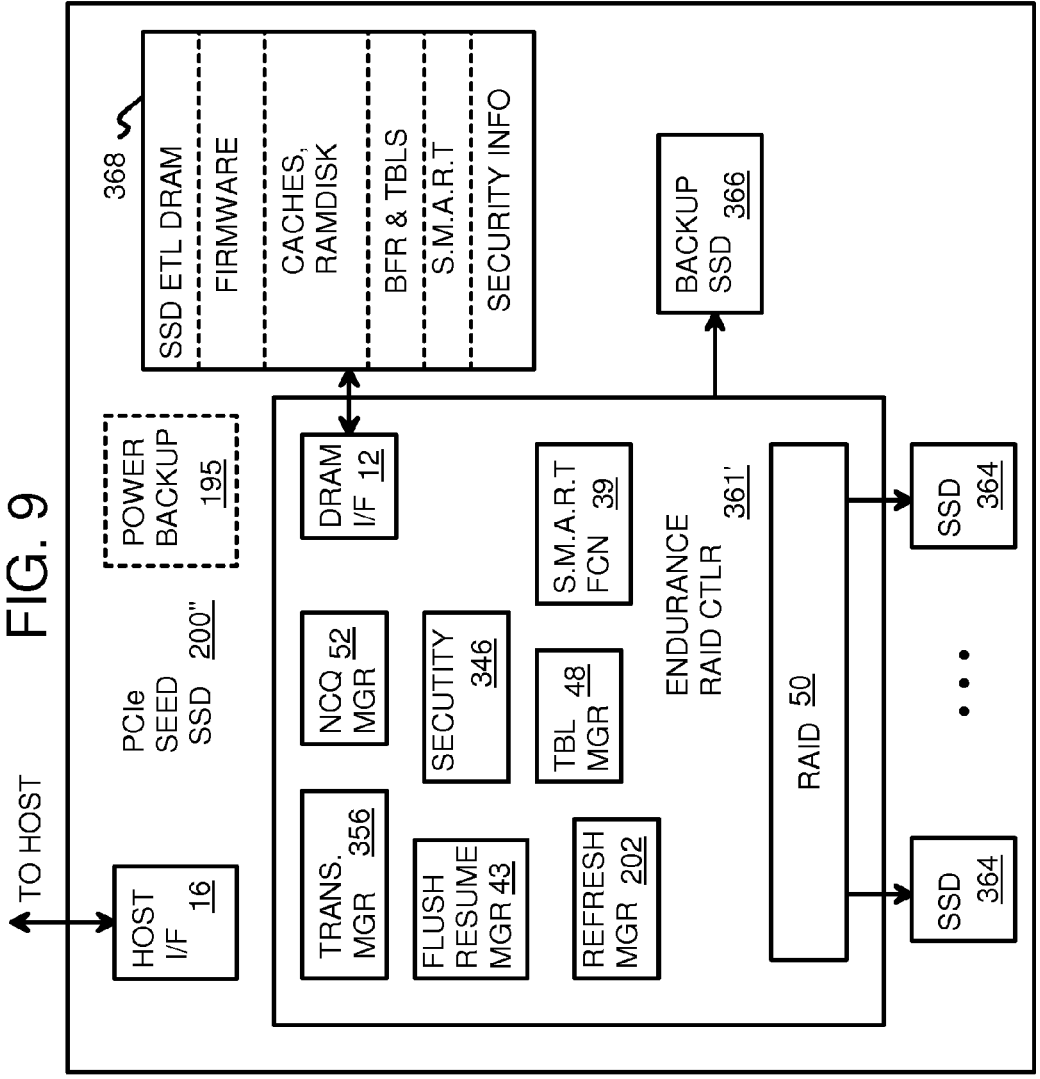
FIG. 9 is a block diagram of a PCIe SEED SSD with a RAID endurance controller.

FIG. 9 is a block diagram of a PCIe SEED SSD with a RAID endurance controller. The PCIe SEED SSD controller will have persistent mode implemented when power turns off or fails. In this alternative, PCIe SEED SSD 200"

interfaces directly to SSD 364 accessed by RAID controller 50, which stores data redundantly.

PCIe SEED SSD 200" has host interface 16, which communicates with host 300 (FIG. 1) using a Peripheral Component Interconnect express (PCIe) bus. Host data from host interface 16 is sent to endurance controller 360.

DRAM interface 12 reads and writes data in SSD Endurance Translation Layer (ETL) DRAM 368. DRAM 368 may store one or more ramdisks, caches, S.M.A.R.T. information, firmware, security information, and other buffers and tables.

Refresh manager 202 may periodically refresh data in SSD 364. Flush resume manager 43 manages resume operations using flushed data. Security 346 manages security functions.

Native Command Queue (NCQ) manager 52 may re-order host commands from host 300 and manage a queue of host commands received through host interface 16. The manager loads host commands into a command queue where writes are re-ordered and combined to reduce flash writes.

RAID controller 50 writes new data across several channels of SSD 364 and may replicate data to provide redundancy and data recovery.

Table manager 48 tracks the type of data that is stored in each logical block or page so that temp files, paging files, FAT, FDB, and user data files are tracked once identified and categorized by the data split manager.

[Para 161]S.M.A.R.T. function 39 processes S.M.A.R.T. commands or vendor commands from host 300, such as to monitor and control error correction, wear, bad block, and other flash memory management. S.M.A.R.T. stands for Self-Monitoring, Analysis and Reporting Technology. The host can use the S.M.A.R.T. command sets to monitor some important data from the SSD device such as power on time, wear-leveling count, etc. The Host can use this data to diagnoses and identify the life expectancy of the SSD. It can also use the information to determine the warranty coverage based on the usage. The host can replace the SSD drive before it experiences a real casualty. In RAID, the host can use S.M.A.R.T. commands to avoid a more expensive RAID 5 configuration.

Transaction manager 356 ensures that data is completely written or transferred to SSD 364. Power backup 195 provides backup power so that PCIe SEED SSD 200" may write persistent mode data from SSD ETL DRAM 368 to backup SSD 366 or to SSD 364 when power fails.

Figure 10:
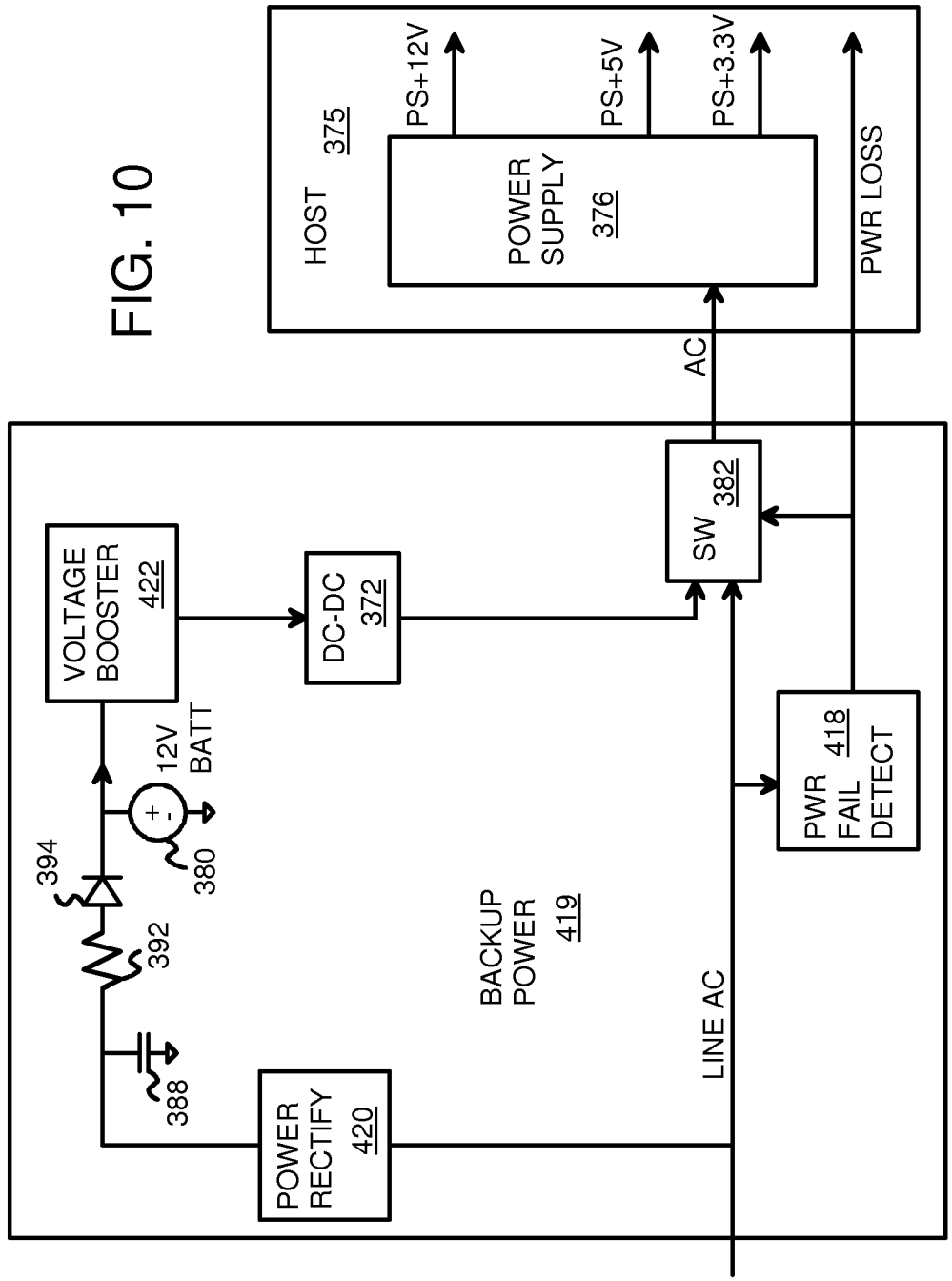
FIG. 10 is a diagram of a front-end backup power supply.

FIG. 10 is a diagram of a front-end backup power supply. A.C. line power from a power line is rectified by power rectifier 420 and filtered by capacitor 388 and resistor 392 to charge battery 380 through diode 394. Voltage booster 422 provides a boosted voltage to DC-DC converter 372, which provides backup power to power switch 382 when power fail detector 418 detects that A.C. power line is failing. Otherwise, power switch 382 connects A.C. line power to power supply 376 on host 375. Power supply 376 may provide a variety of voltages, such as 12v, 5v, and 3.3v. The power loss signal from power fail detector 418 in backup power 419 may also be routed through to host 375.

Figure 11:
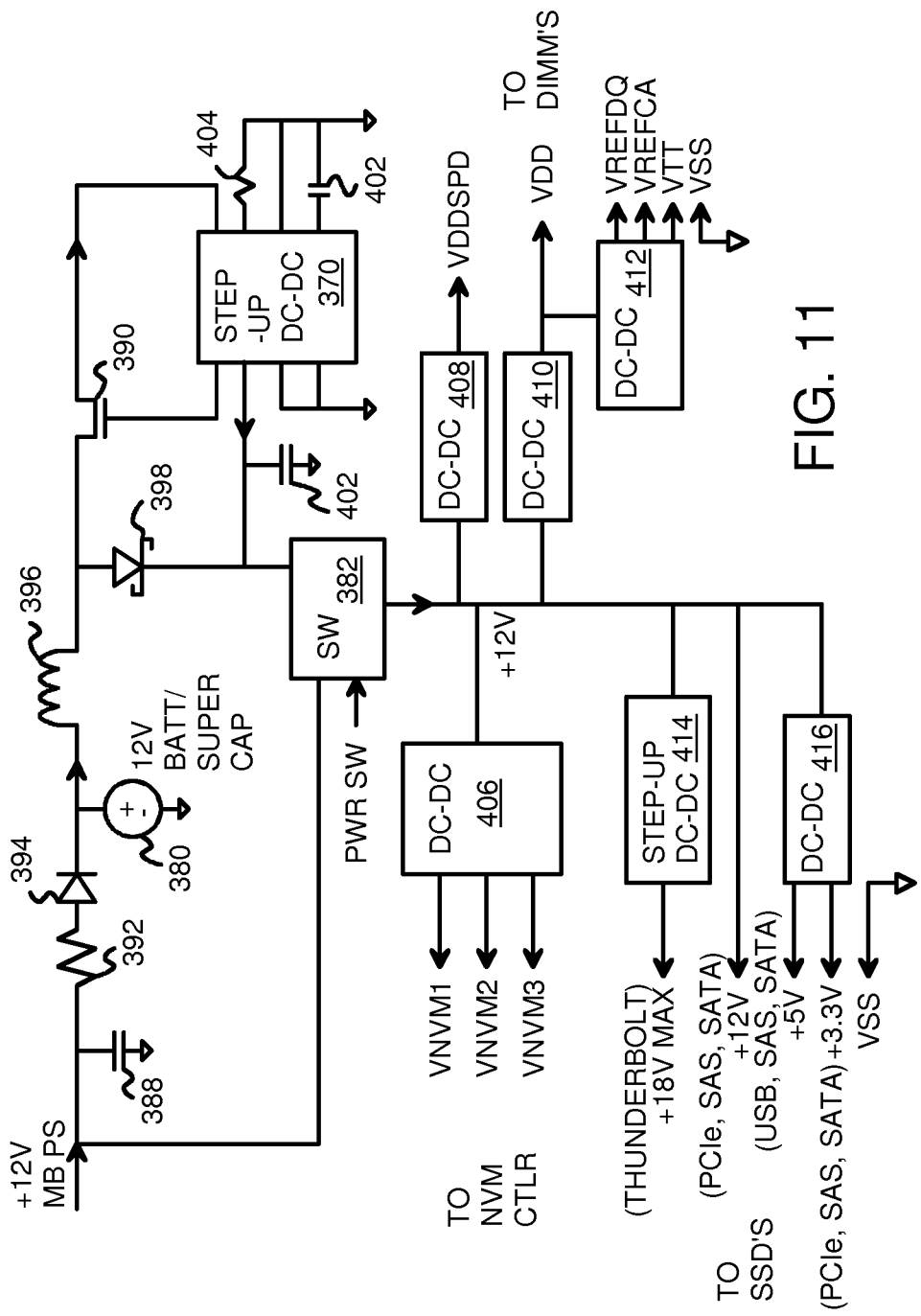
FIG. 11 shows an internal power supply tree on a motherboard for the NVM controller.

FIG. 11 shows an internal power supply tree on a motherboard. A 12-volt motherboard power supply is filtered by capacitor 388 and resistor 392 to charge battery 380 through diode 394. Battery 380 may be a battery or super capacitor that provides local backup power through inductor 396 and zener diode 398 when power fails. Step-up DC-DC converter 370, which converts a smaller than 12V voltage from battery 380 to a constant 12V output, receives the backup power through transistor 390 and charges capacitor 402 to regulate backup power to power switch 382. Filter capacitor 402 filters the output of step-up DC-DC converter 370.

Power switch 382 selects the 12-volt motherboard power supply when a power switch signal PWR_SW is active, but selects the backup power when power fails. The 12-volt power selected by power switch 382 is further modified by other DC-DC converters 406, 408, 410, 412, 414, 416 to provide needed power on the motherboard related to the DRAM backup to SSD scheme.

FIGS. 12A-C highlight isolating power switches for the NVM controller. FIG. 12A shows NVM controller 430 receiving power VNVMX and ground, and various control signals to and from the CPU. DC-DC converter 406 provides different power voltage levels to NVM controller 70, switches 60, 62, etc. DC-DC converters 408, 410, 412 provide different power voltage levels for DRAM related power. DC-DC converters 414, 416 depend on what type of SSD interface was chosen, and provide different power voltage levels.

NVM controller 430 generates switch control SW_CTL to switches 432, 434 in FIGS. 12B, 12C. Switches 432, 434 select between CPU and NVM input signals to connect to the DRAM or SSD. For one channel of memory module, 12 14-bit switches 434 are needed in this embodiment, or a single integrated 160-bit switch 432 (FIG. 12B) is needed.

FIG. 13 shows a NVM controller with integrated switches. NVM controller 428, which functions as NVM controller 70 in FIG. 7, has integrated switches 426, which function as switches 60, 62 of FIG. 7. Internal NVM DRAM and SSD buses connect directly to integrated switches 426 and do not require external pins. Alternately, NVM controller 428 can be integrated into the CPU or chip set. In that case, it will simplify the PCB design and if other portions of the CPU can be cut off from the power during power turn off or fail persistent mode, the backup power requirement is reduced.

Figure 14A:
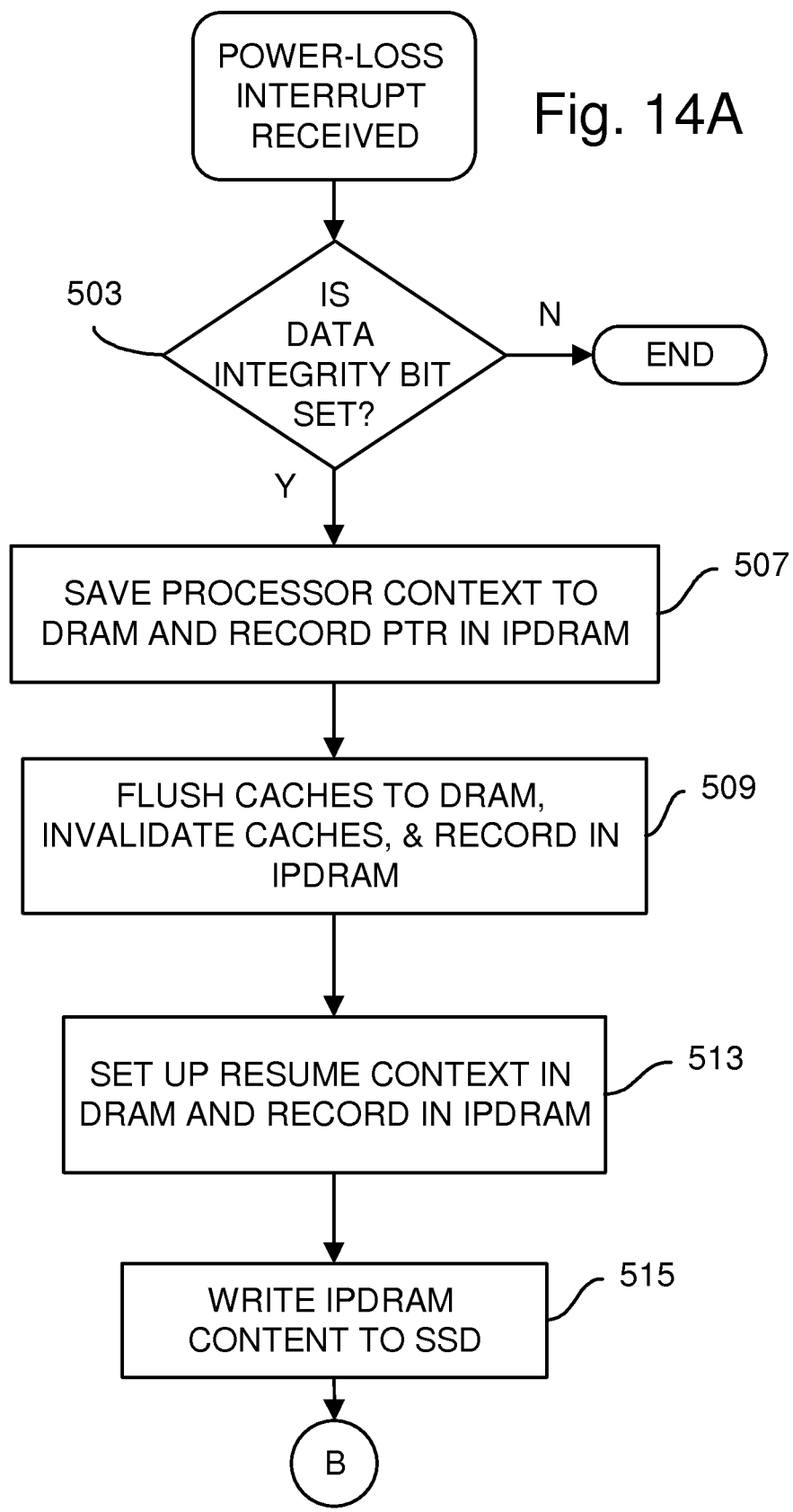
FIGS. 14A-B show a power failure routine on the host for DRAM persistent mode.
Figure 14B:
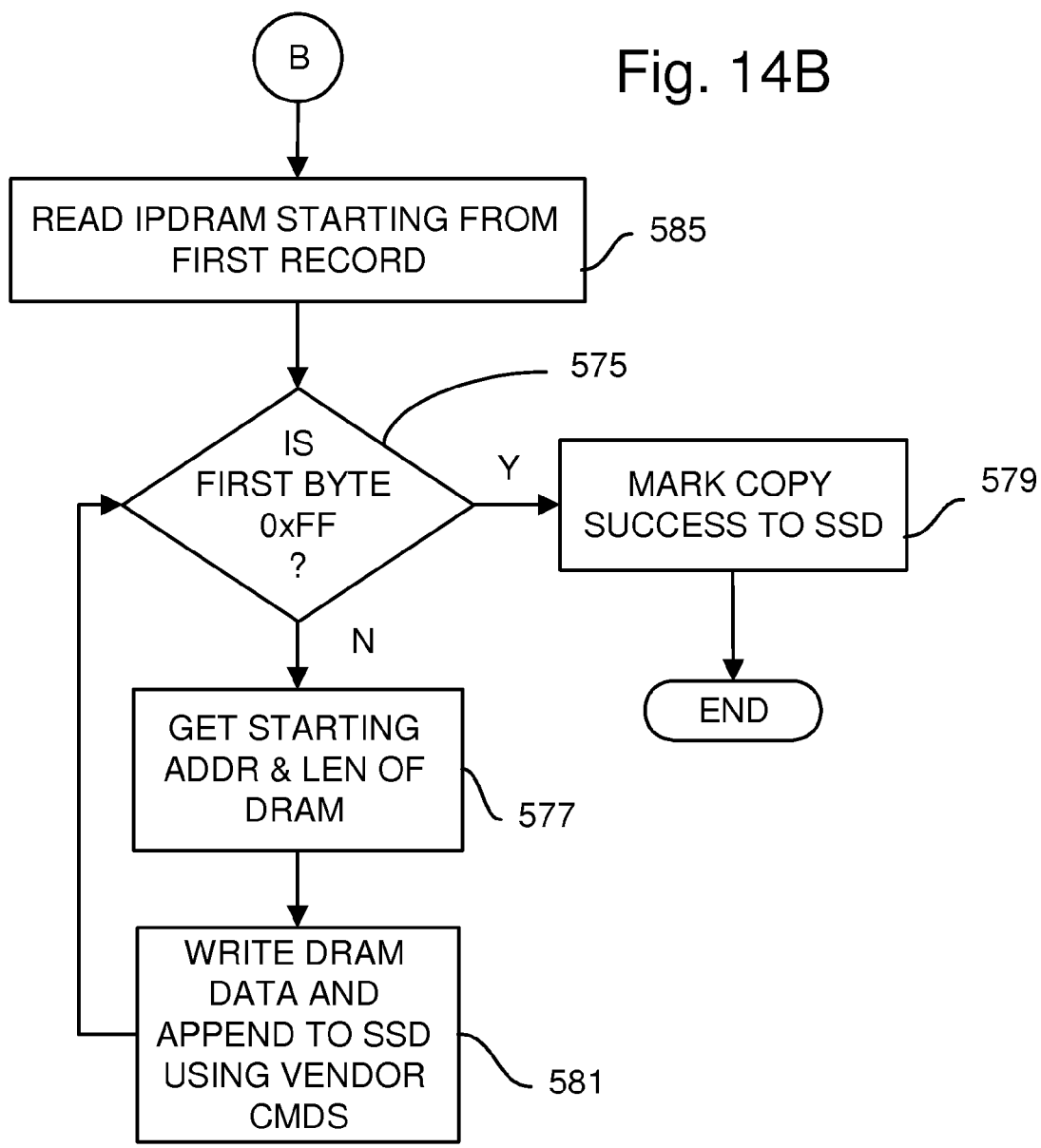

FIGS. 14A-B show a power failure routine on the host for DRAM persistent mode. Refer to FIG. 3A. When a power loss interrupt is received, and the data integrity bit is set, step 503, the processor context is saved to DRAM, step 507, and a pointer and length to the saved data is stored in IPDRAM 213. CPU caches are flushed to DRAM, step 509, and caches invalidated. An entry for the saved data is created in the IPDRAM.

A resume context is created in DRAM, step 513, and an IPDRAM entry for the resume context created. The IPDRAM contents are then written to persistent mode DRAM image 203 of SEED SSD 200, step 515.

In FIG. 14B, the IPDRAM contents are read, starting from the first record, step 585. When the first byte is FF, step 575, then the end of the IPDRAM records has been reached. A copy success flag is set in persistent mode DRAM image 203, step 579. The copied DRAM image can be stored as an image file or a partition of the SSD matching at least the size of the DRAM.

For other records, step 575, the pointer to the starting address of the data pointed to, and its length, are read from the next entry, step 577. The data pointed to is read from DRAM and written to persistent Mode DRAM image 203 and stored in the SSD using vendor commands, step 581.

Figure 15A:
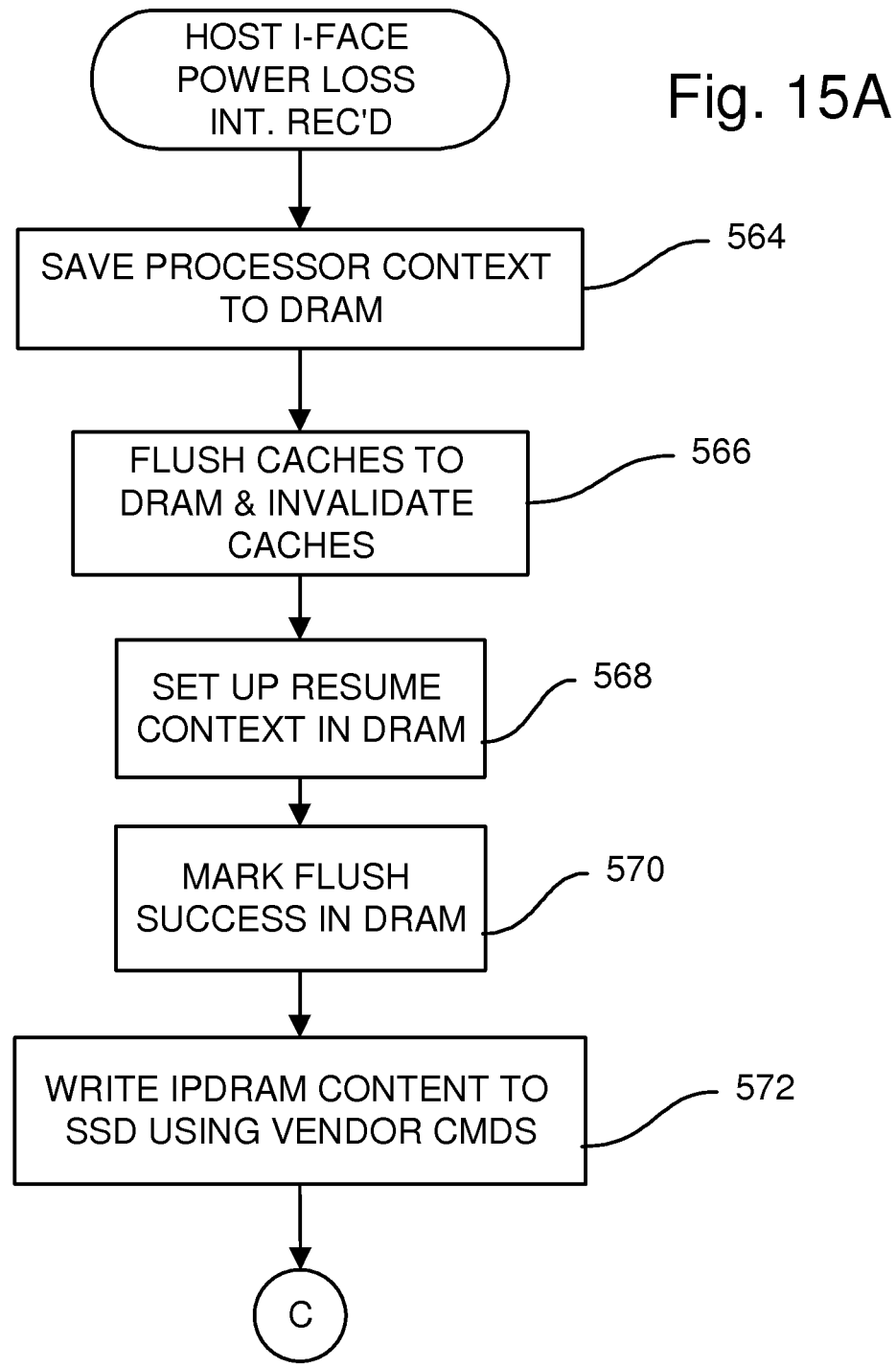
FIGS. 15A-B show a power failure routine for DRAM persistent mode for the PCIe RAID controller.
Figure 15B:
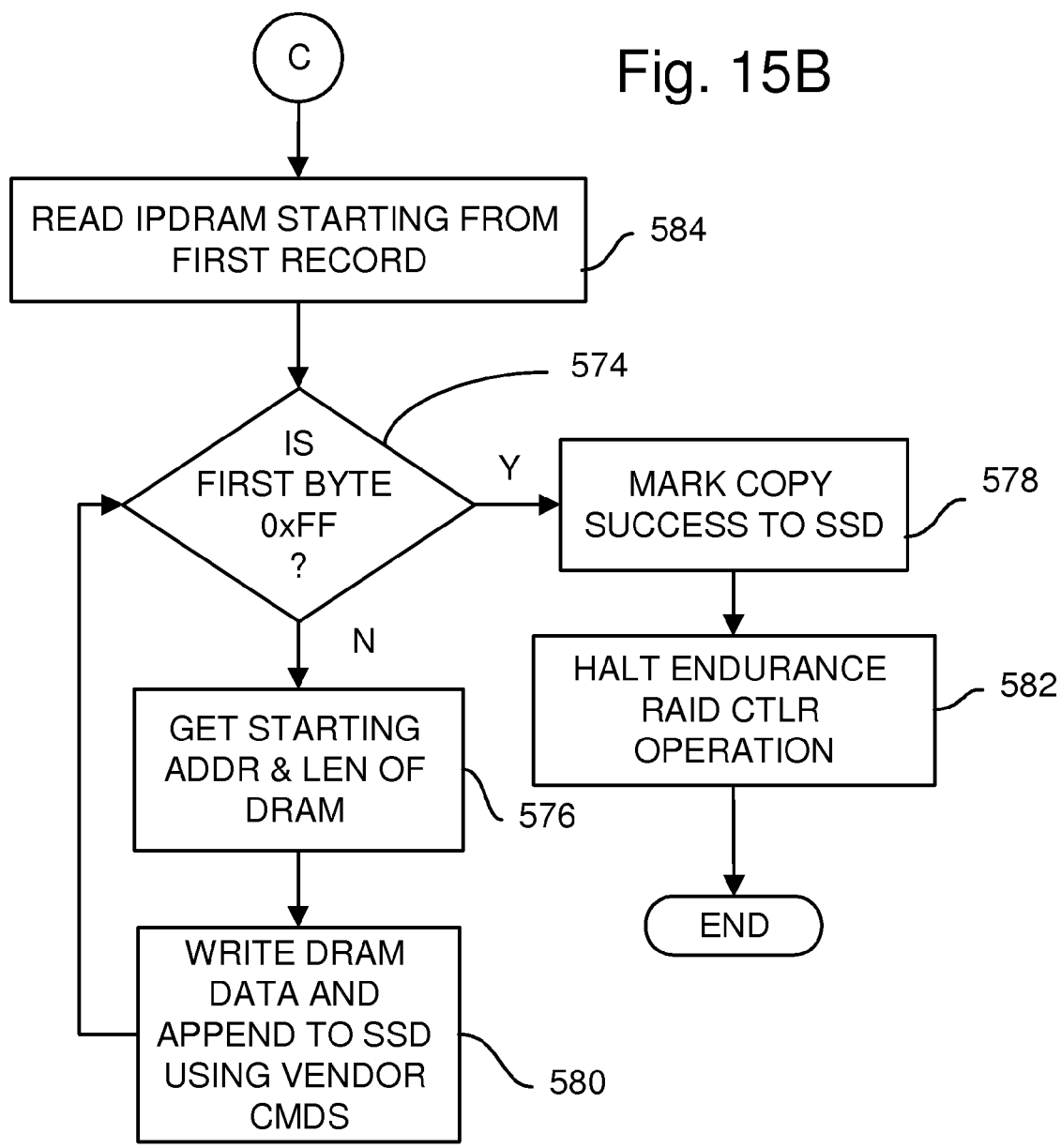

FIGS. 15A-B show a power failure routine for DRAM persistent mode for the PCIe RAID controller. When a power loss interrupt is received from the power monitor for a host power input, the processor context is saved to DRAM, step 564 Caches are flushed to DRAM, step 566, and invalidated.

A resume context is created in DRAM, step 568. A flush success flag is set in DRAM, step 570. The IPDRAM contents are then written to SSD, step 572 IPDRAM is maintained by the PCIe controller.

In FIG. 15B, the IPDRAM contents are read, starting from the first record, step 584. When the first byte is FF, step 574, then the end of the IPDRAM has been reached. A copy success flag is set in the DRAM, step 578. The operation of the endurance RAID controller is halted, step 582.

For other records, step 574, the pointer to the starting address of the data pointed to, and its length, are read from the next entry, step 576. The data pointed to is read from DRAM and stored in the SSD using vendor commands, step 580.

Figure 16B:
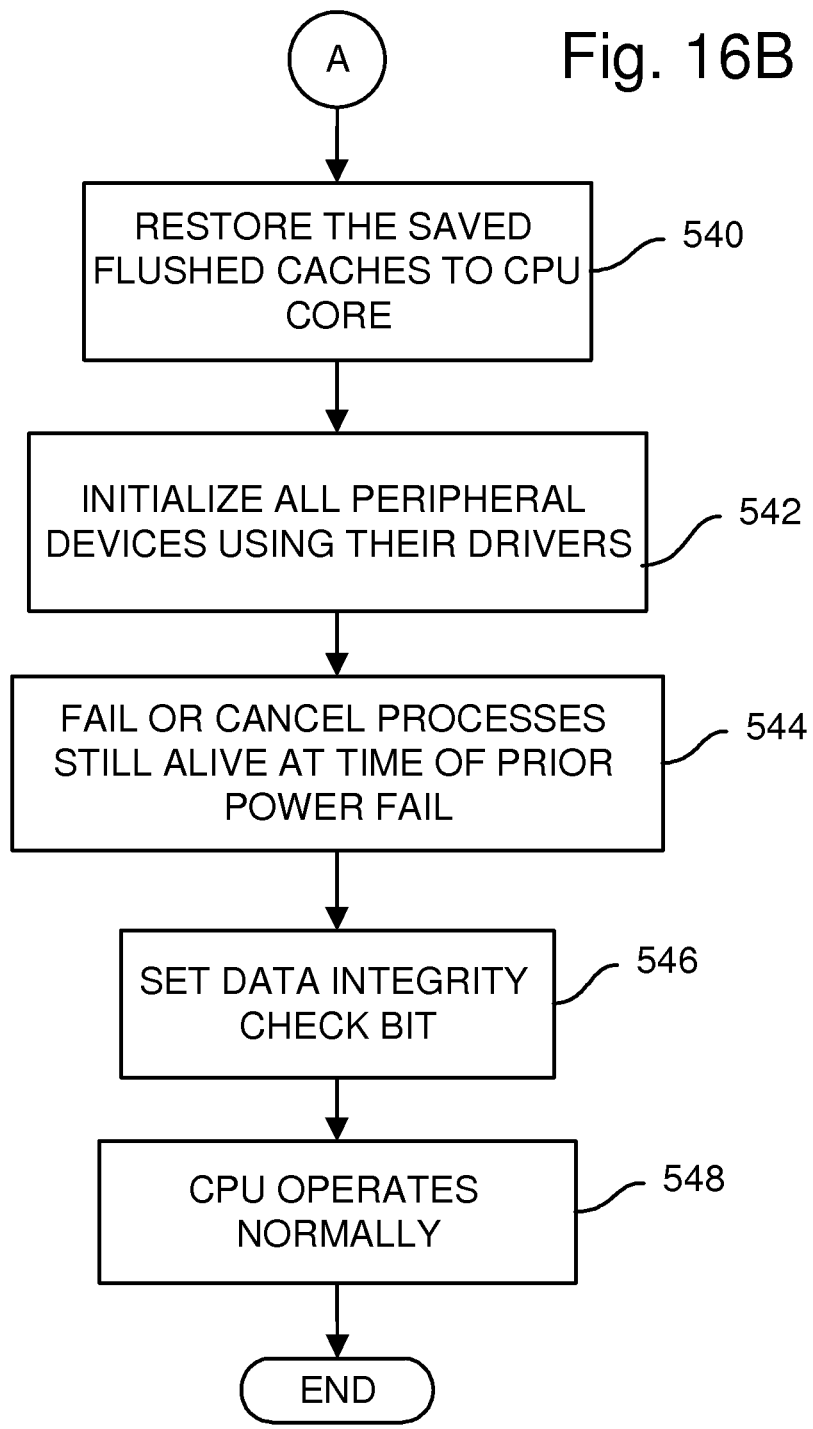

FIGS. 16A-B show a boot loader routine on the host for DRAM persistent mode. Refer to FIG. 3A. When a boot loader initialization signal is received, the previously stored image is read from SSD, step 550. This image is the persistent mode DRAM image 203.

The IPDRAM contents are read, starting from the first record, step 552. When the first byte is 0xFF, step 554, then the end of the IPDRAM has been reached. All of the previously saved DRAM contents are loaded back to where they were in DRAM. Control jumps to the resume context, step 558, which is executed by the CPU.

For other records, step 556, the pointer to the starting address of the data pointed to, and its length, are read from the next entry, step 556. The data pointed to is read from the SSD using vendor commands, and then written to DRAM at the location of the pointer from the IPDRAM entry, step 560.

In FIG. 16B, the flushed caches that were saved are restored to the CPU core, step 540, and all peripheral devices are initialized using their drivers, step 542. Any processes that were still alive at the time of power fail are failed or cancelled, step 544. The data integrity flag is set, step 546, and the CPU resumes normal operation, step 548. The data integrity flag is used to avoid unnecessary writes to the persistent mode DRAM image if power fails again before going to step 546.

Figure 17B:
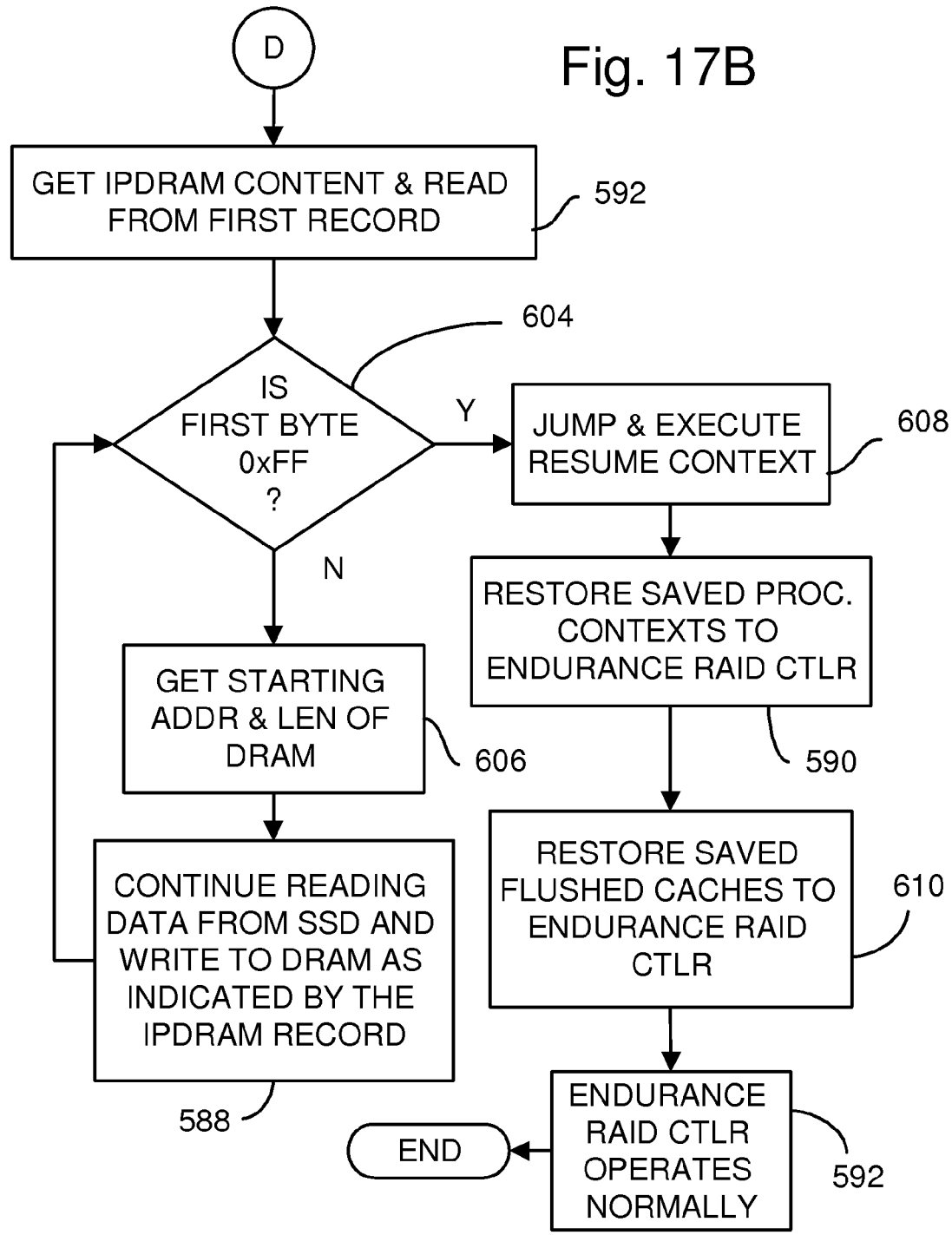

FIGS. 17A-B show a power reboot routine for DRAM persistent mode for the PCIe RAID controller. Refer to FIG. 9. When a power up interrupt signal is received by the PCIe RAID controller, all downstream SSD's are initialized, step 586. The persistent mode DRAM image is read and the previous "copy success flag" is checked for success. When not successful, step 594, then a normal boot up without persistent mode is performed, step 596. When successful, step 594, then the previously stored persistent mode DRAM image is read from SSD, step 598 either from backup SSD 366 or SSD 364. This image is persistent mode DRAM image 203.

In FIG. 17B, the IPDRAM contents are read, starting from the first record, step 592. When the first byte is 0xFF, step 604, then the end of the IPDRAM has been reached. Control jumps to the resume context, step 608, which is executed by the RAID controller. Any saved processor contexts for the endurance RAID controller are restored, step 590, and the flushed caches that were saved are restored to the endurance RAID controller are restored, step 610. The endurance RAID controller resumes normal operation, step 592.

For other records, step 604, the pointer to the starting address of the data pointed to, and its length, are read from the next entry, step 606. The data pointed to is read from the SSD using vendor commands, and then written to DRAM at the location of the pointer from the IPDRAM entry, step 588.

Figure 18A:
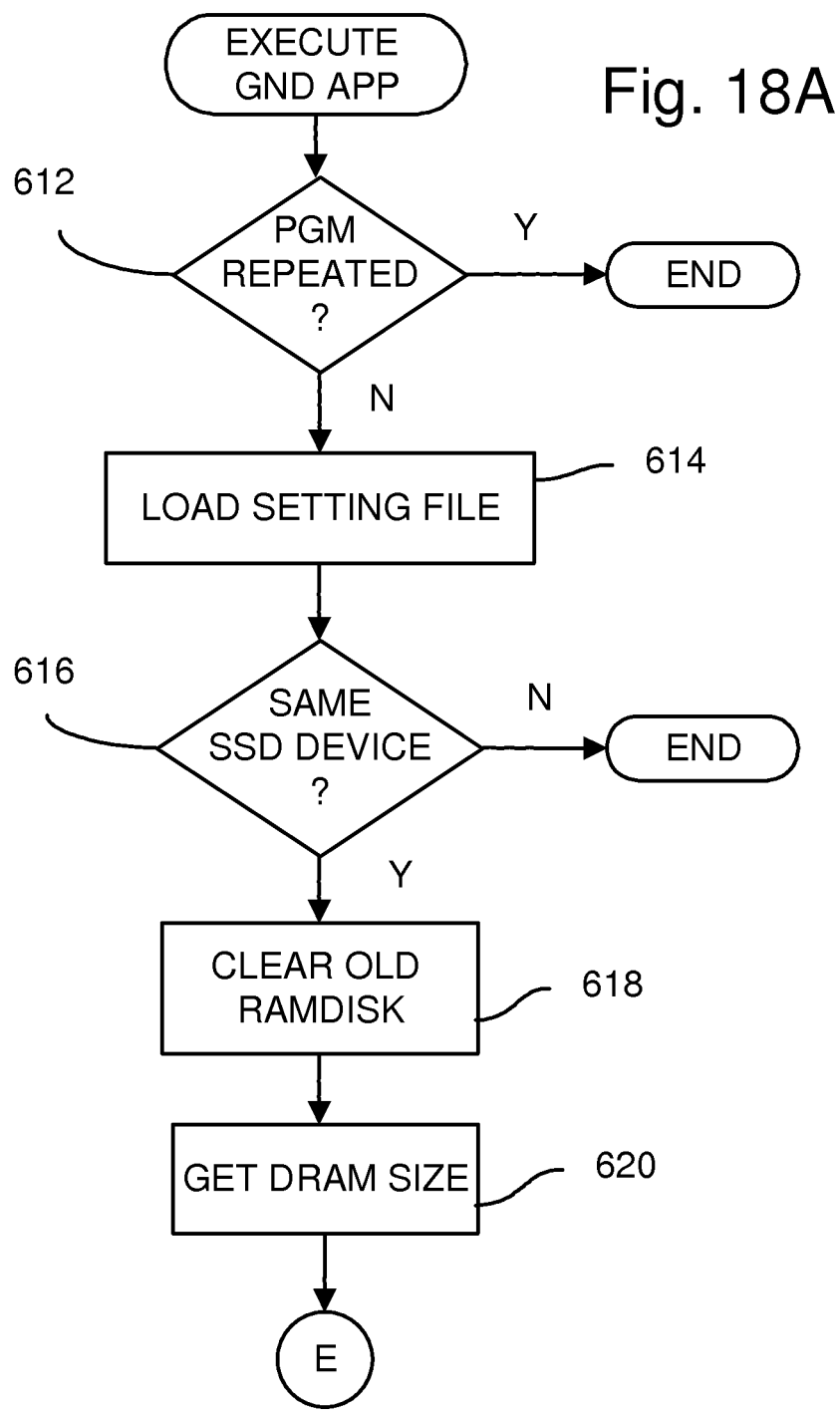
FIGS. 18A-B show a GND Application routine executed by a local SSD.
Figure 18B:
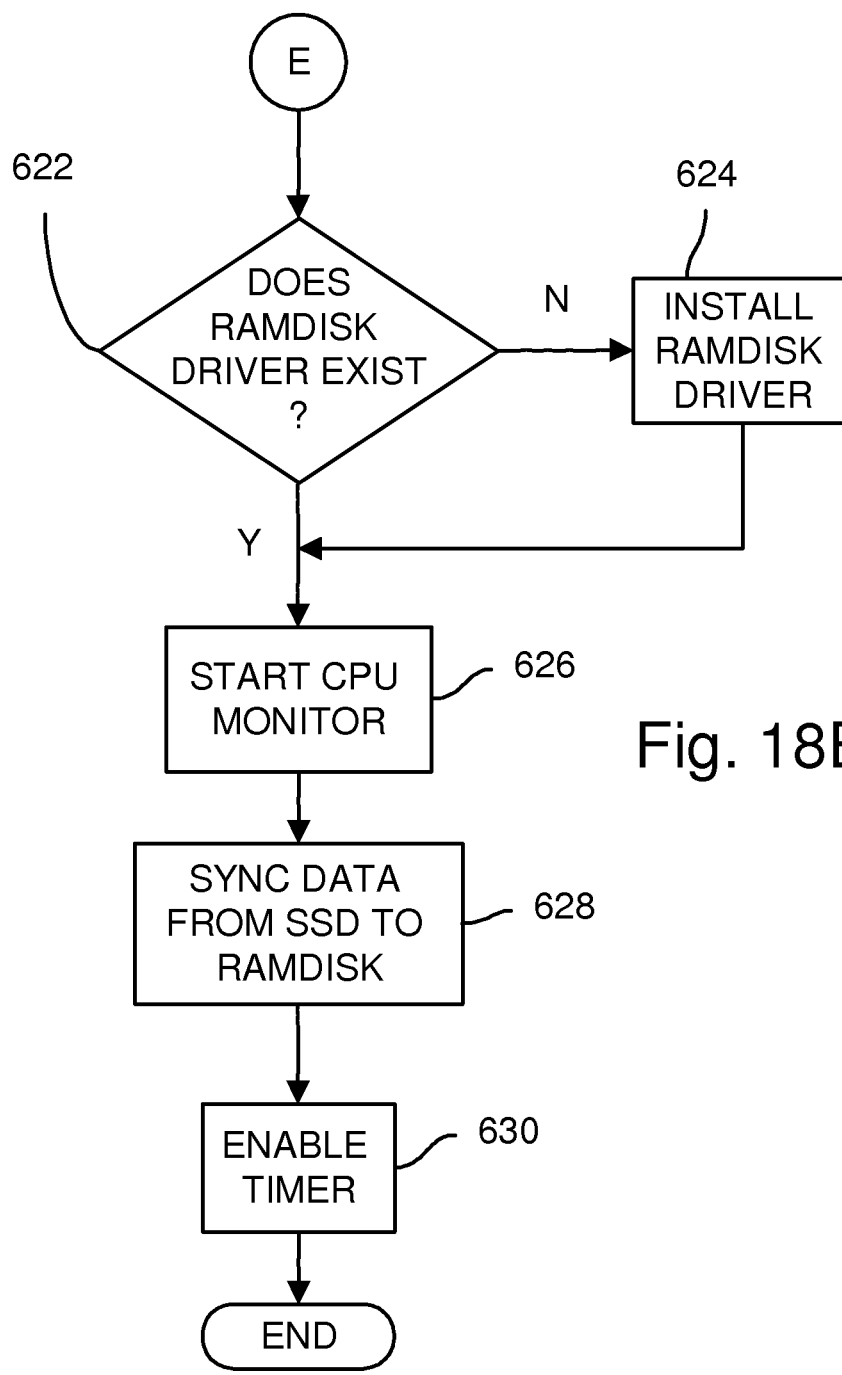

FIGS. 18A-B show a GND application and GND Driver launched and executed from a local SSD. When the GND application is executed by the user, and the program has not been repeated, step 612, then the setting file is loaded, step 614. When the same SSD device is installed as before power down, step 616, the old ramdisk is cleared, step 618. The size of the DRAM is obtained, step 620.

In FIG. 18B, when the ramdisk driver does not yet exist in execution memory, step 622, then the ramdisk driver is installed, step 624.

The CPU monitor is started, step 626, and data is synced from the SSD to the ramdisk, step 628. A timer is enabled, step 630. The initial set up is done.

Figure 19:
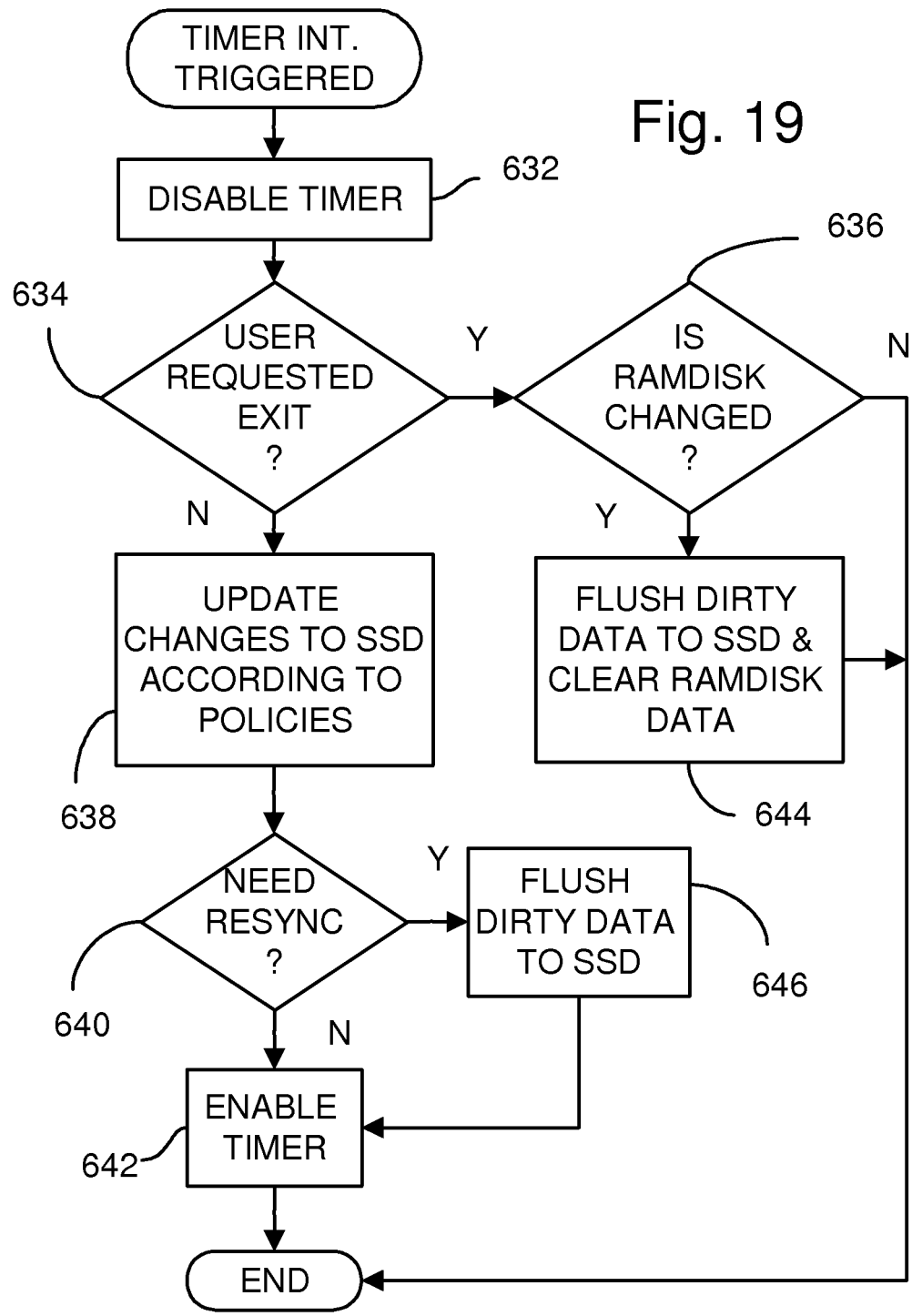
FIG. 19 is a periodic routine for an SSD launched driver.

FIG. 19 is a periodic routine for a GND driver to maintain its status. When the timer interrupt is triggered for the timer in step 630 of the prior figure, this routine executes on the host. The timer is disabled to avoid the routine being called again, step 632. When the user requested the program exit, step 634, and the ramdisk has not changed, step 636, then the GND driver exits. If the ramdisk changed since the last timeout, step 636, then the dirty data in the ramdisk is flushed to the SSD and the ramdisk data cleared, step 644, before the GND driver exits.

When the user did not request that the program exit, step 634, changes to the ramdisk data are updated to the SSD according to the policy criteria met, step 638, such as the dirty data being larger than a threshold amount such as 80% of the cache, or the data are not synchronized to the SSD for a sufficiently long period of time such as 1 hour, or a predetermined category data, or until power down of the host, etc. A decision is made if re-syncing is needed. When the ramdisk needs re-syncing, step 640, then the dirty data is flushed to SSD, step 646. The timer is enabled for next status check, step 642. The re-syncing and its policy can be user selectable.

Figure 20B:
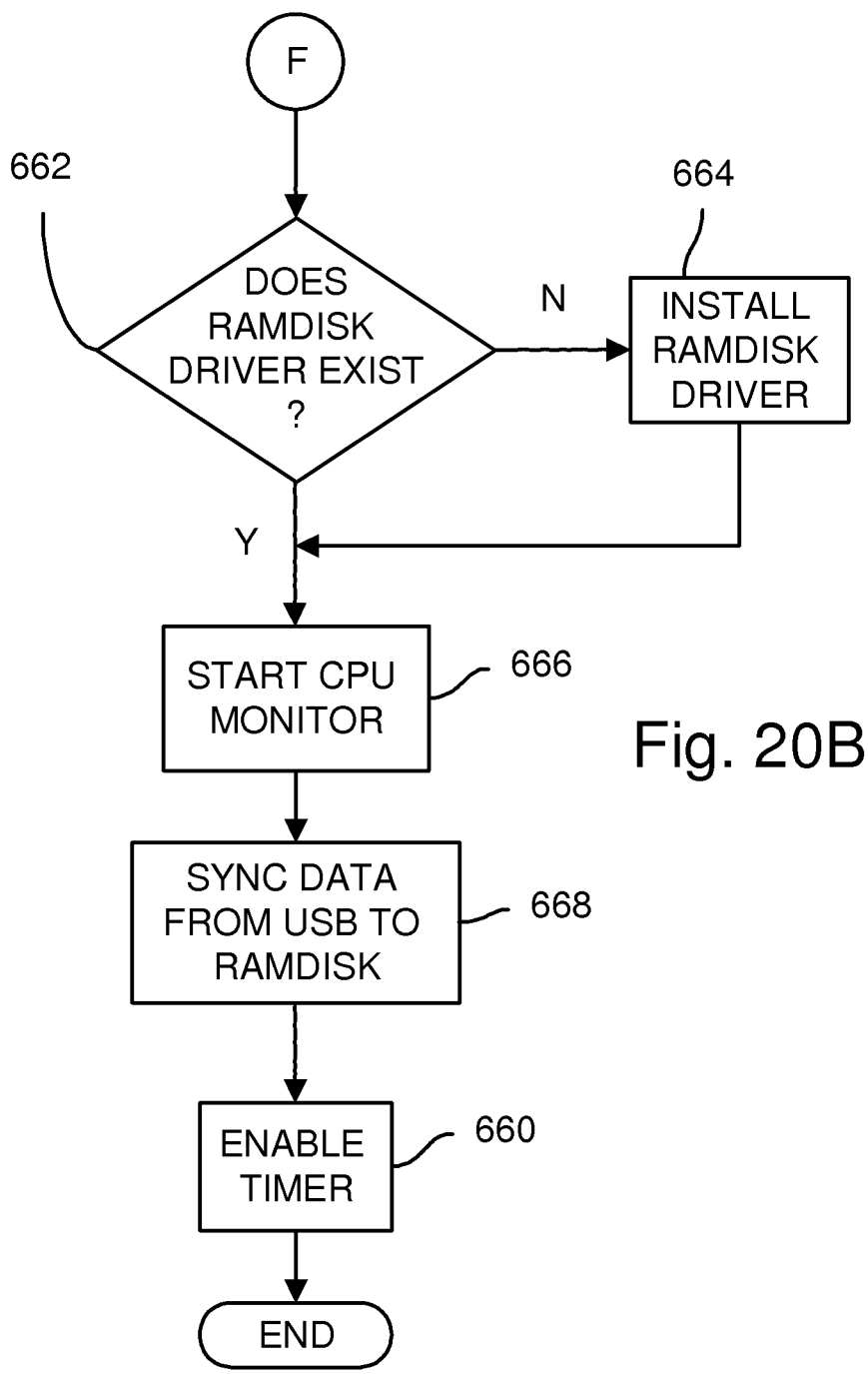

FIGS. 20A-B show a GND application and GND Driver launched and executed from a USB device. When a USB device is inserted and autorun executes, and the program has not been repeated due to re-insertion, step 652, then the setting file is loaded, step 654. When the same USB device is installed as before being unplugged, step 656, the old ramdisk is cleared, step 658. The size of the DRAM is obtained, step 660.

In FIG. 20B, when the ramdisk driver does not yet exist in execution memory, step 662, then the ramdisk driver is installed, step 664.

The CPU monitor is started, step 666, and data is synced from the USB device to the ramdisk, step 668. A timer is enabled, step 660.

Figure 21A:
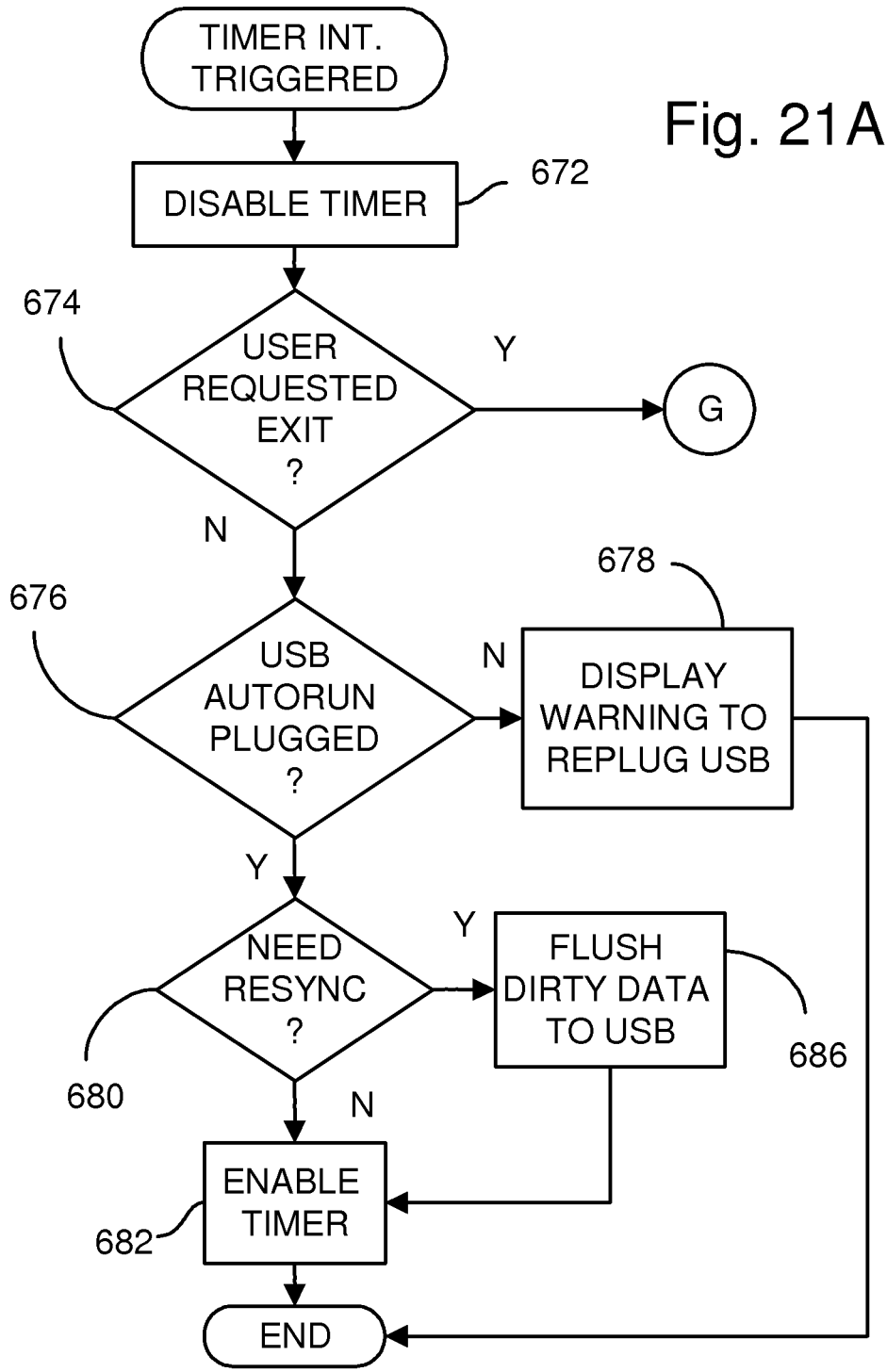
FIG. 21A-B is a periodic routine for a USB launched driver.
Figure 21B:
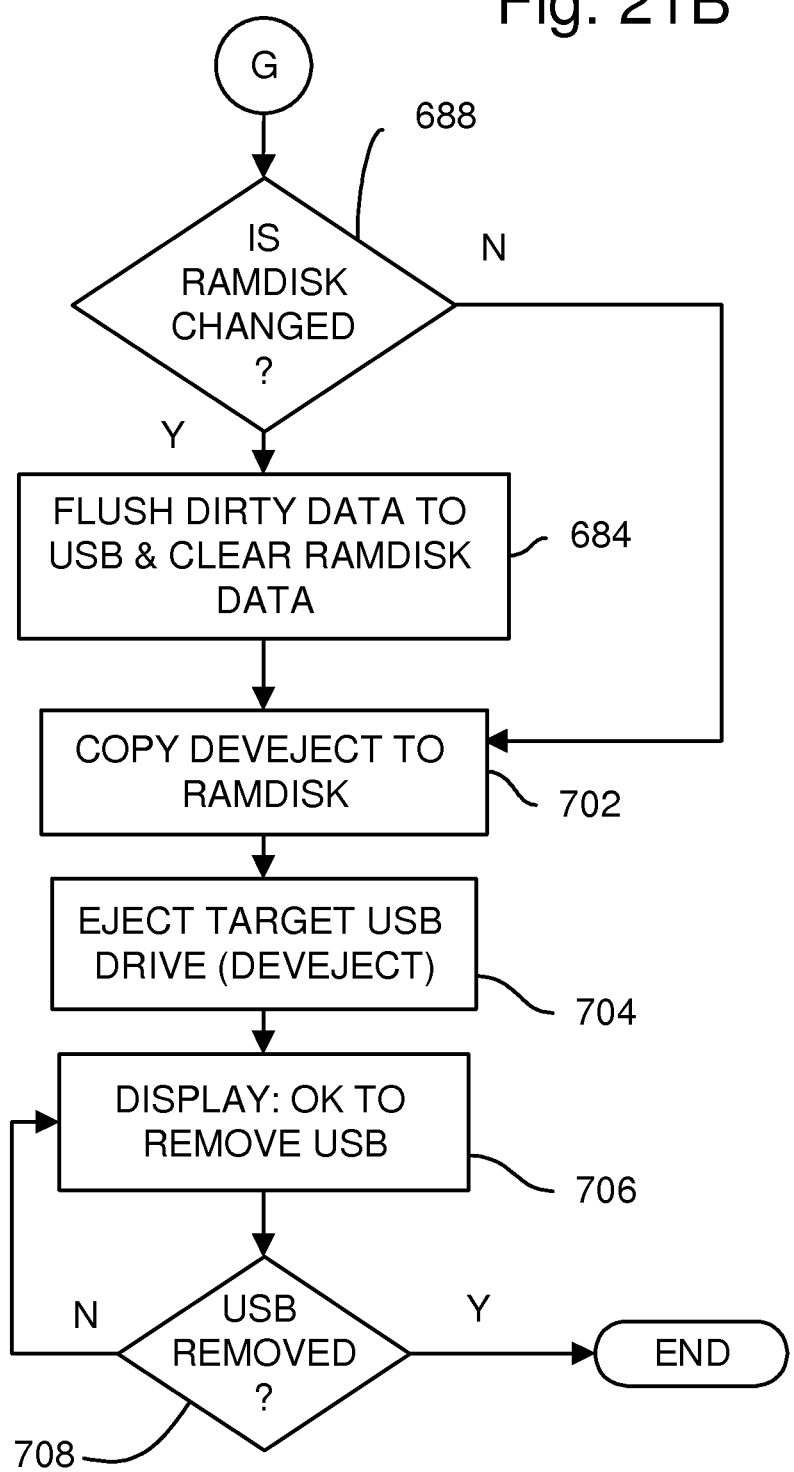

FIG. 21A-B is a periodic routine for a USB device driver. When the timer interrupt is triggered for the timer in step 660 of the prior figure, this routine executes on the host. The timer is disabled to avoid the routine being called again, step 672.

When the user did not request that the program exit, step 674, and USB device was unplugged, step 676, then a warning is displayed to the user to plug the USB device back in, step 678. Otherwise when the ramdisk needs re-syncing as mentioned in the step 638, step 680, then the dirty data is flushed to the USB, step 686. The timer is enabled for the next status check, step 682.

In FIG. 21B, when the user requested the program exit, step 674, and the ramdisk has not changed, step 688, then the DevEject routine is copied to the ramdisk, step 702, then the target USB device is ejected using the DevEject command, step 704. A display to the user indicates that it is OK to remove the USB device, step 706. This message continues to be displayed until the user removes the USB device, step 708.

When the ramdisk has changed, step 688, the dirty data in the ramdisk is flushed to the USB and the ramdisk data cleared, step 684. The DevEject routine is copied to the ramdisk, step 702, before being executed, step 704.

Figure 22A:
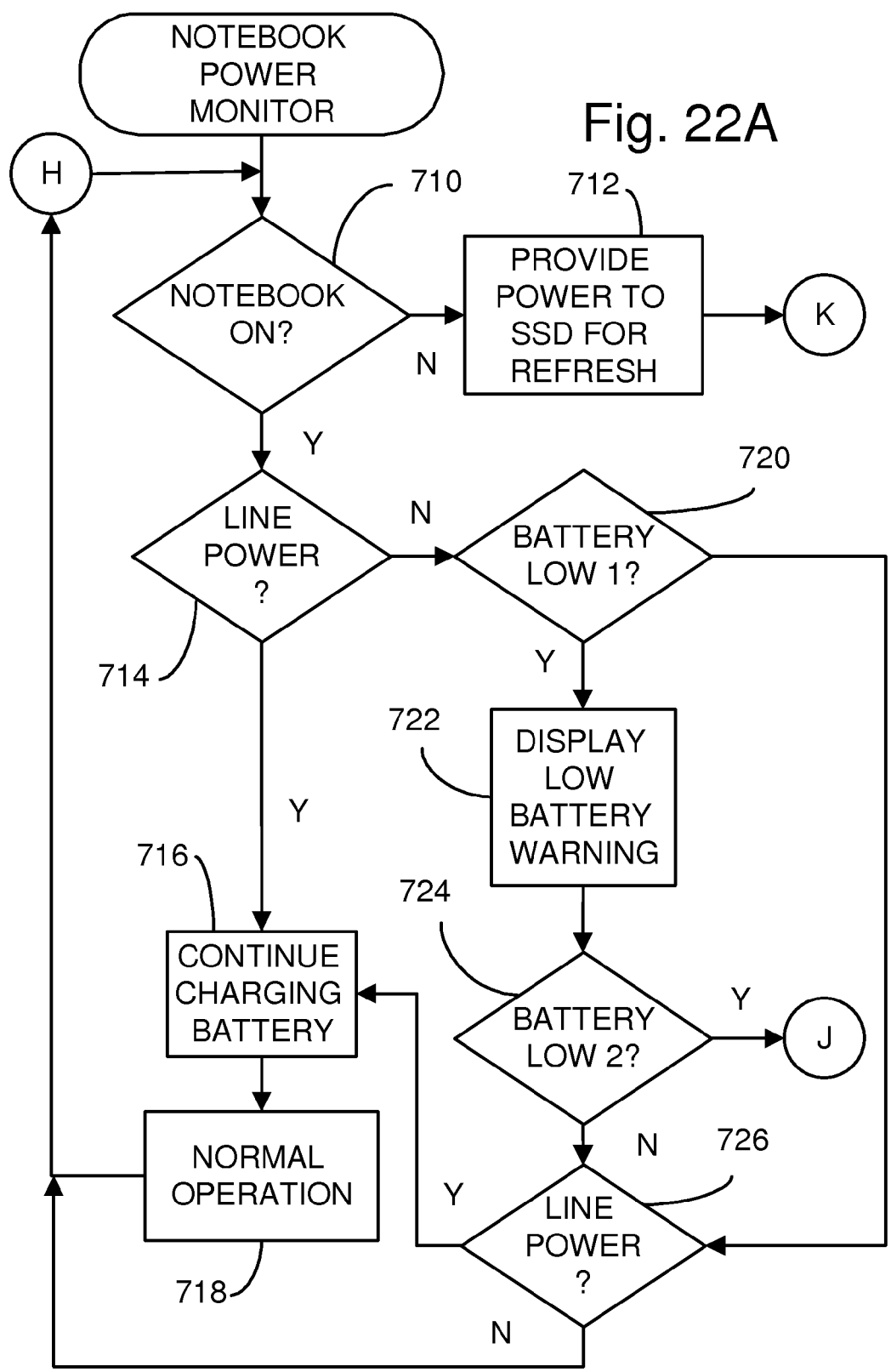
FIGS. 22A-B show operation of a notebook power monitor with battery, persistent, and normal power-down modes.
Figure 22B:
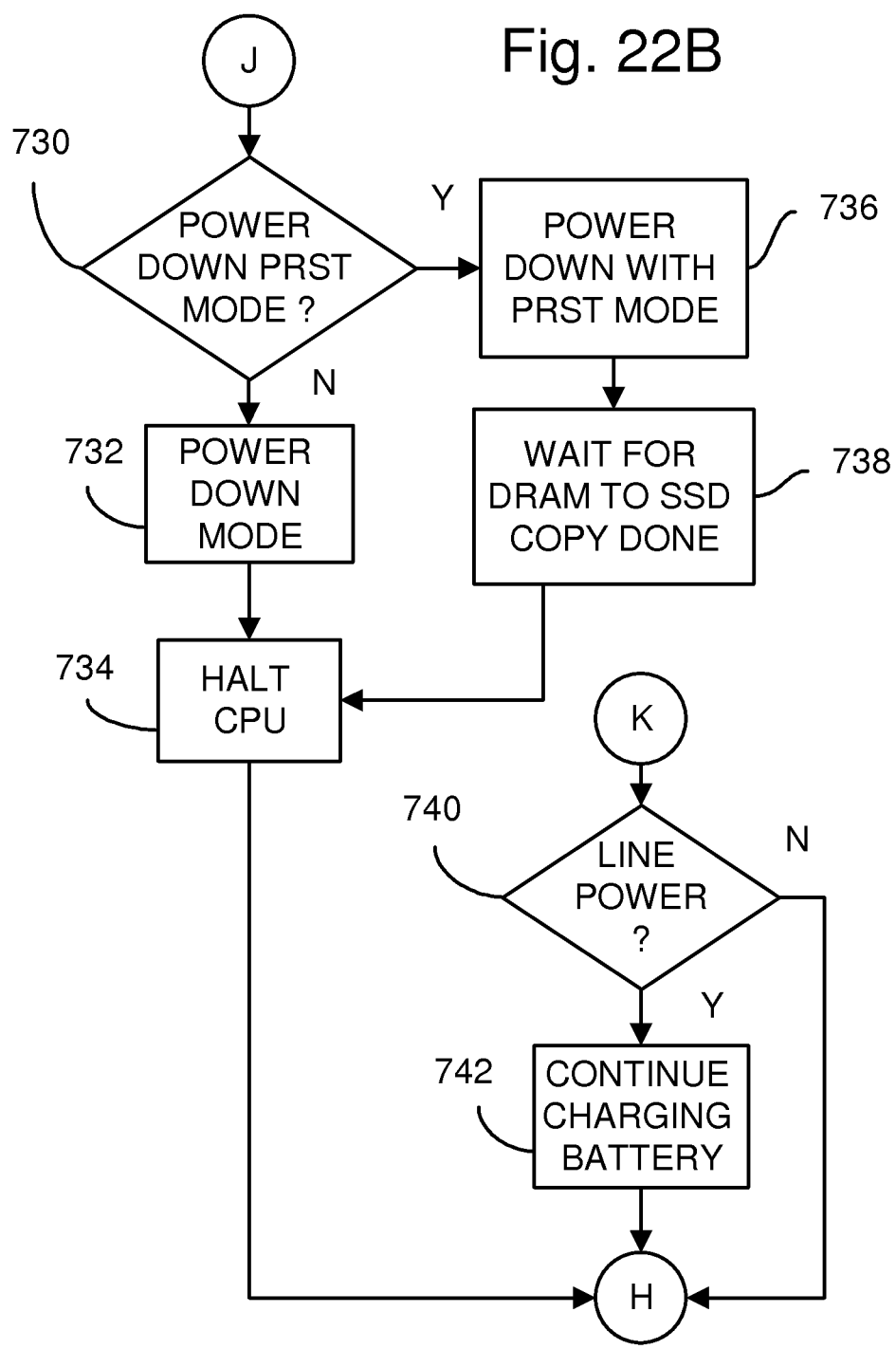

FIGS. 22A-B show operation of a notebook power monitor with battery, persistent, and normal power-down modes. When the notebook is on, step 710 and line power is on, step 714, then the power monitor continues to charge the notebook battery, step 716, and the notebook operates normally, step 718.

When the notebook is on, step 710 but the line power is off, step 714, and the battery power level has not fallen below a first threshold, low 1, step 720, then when line power is on, step 726, the power monitor continues to charge the notebook battery, step 716, and the notebook operates normally, step 718. When line power is off, step 726, the notebook power monitor loops back to the initial step.

When the notebook is on, step 710 but the line power is off, step 714, and the battery power level is below low1, step 720, then a warning message is displayed, step 722. When the battery power level falls below low2, step 724, then in FIG. 22B when power down persistent mode is enabled, step 730, persistent mode is used to power down, step 736. The routine waits for the DRAM to be copied to SSD, step 738, before the CPU is halted, step 734.

When power down persistent mode is not enabled, step 730, a normal power down with power down mode occurs, step 732, and the CPU is halted, step 734.

In FIG. 22A, when the notebook is off, step 710, power is provided to the SSD, which is in sleep mode except a small portion of the monitor and timer circuits, and wakes up when the timer is up to refresh its flash memory periodically, such as weekly, step 712. In FIG.22B, when line power is on, step 740, then the power monitor continues to charge the notebook battery, step 742, and the notebook power monitor loops back to the initial step.

Figure 23B:
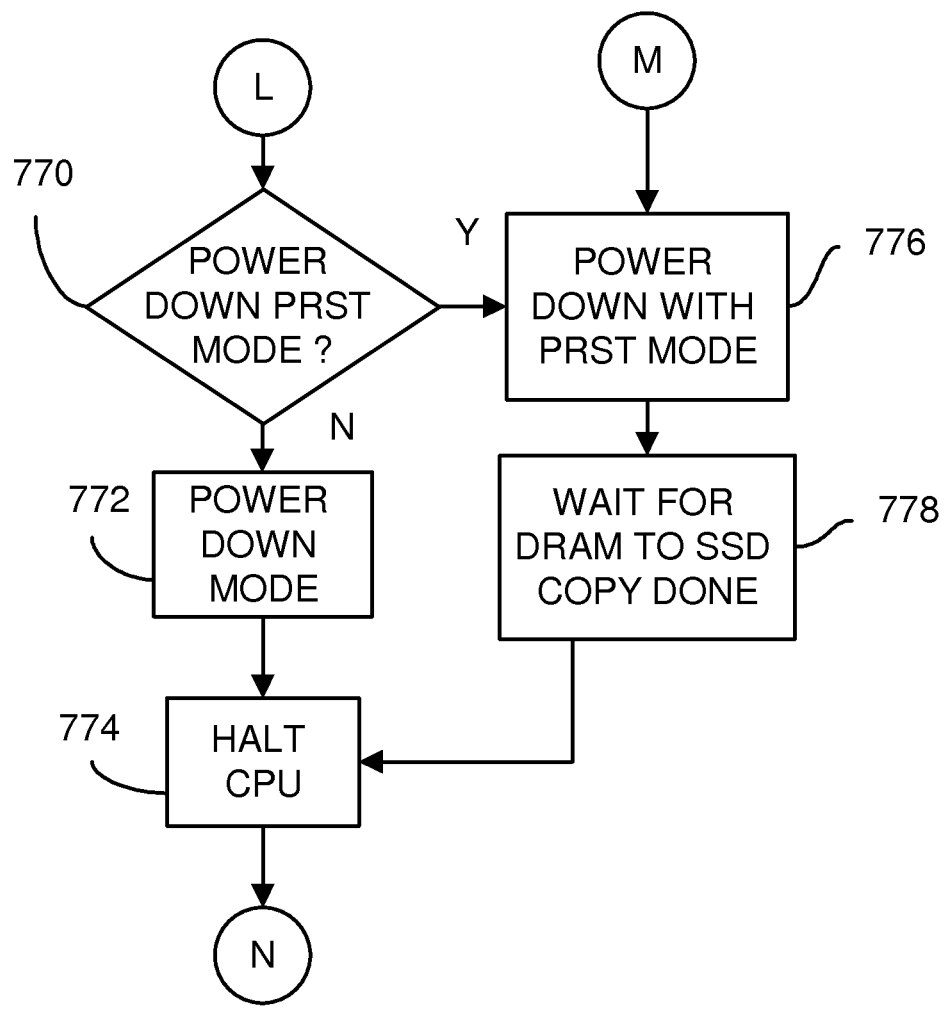

FIGS. 23A-B show operation of a desktop power monitor with battery backup, persistent, and normal power-down modes. When the desktop is rebooted, step 750 and line power is on, step 758, then the power monitor continues to charge the desktop battery, step 760, and the desktop operates normally, step 762, until the desktop powers down, step 764.

When the desktop is not rebooted, step 750 but the line power is lost, step 754, the desktop power monitor loops back to the initial step. When line power is not lost, step 754, power is provided to the SSD to refresh its flash memory, step 752. The power continues to charge the desktop battery, step 756, and the desktop power monitor loops back to the initial step.

When the desktop is rebooted, step 750 but the line power is lost, step 758, then in FIG. 23B, persistent mode is used to power down, step 776. The routine waits for the DRAM to be copied to SSD, step 778, before the CPU is halted, step 774.

When the desktop powers down, step 764, and power down persistent mode is enabled, step 770, persistent mode is used to power down, step 776. The routine waits for the DRAM to be copied to SSD, step 778, before the CPU is halted, step 774.

When power down persistent mode is not enabled, step 770, a normal power down occurs, step 772, and the CPU is halted, step 774.

Figure 24A:
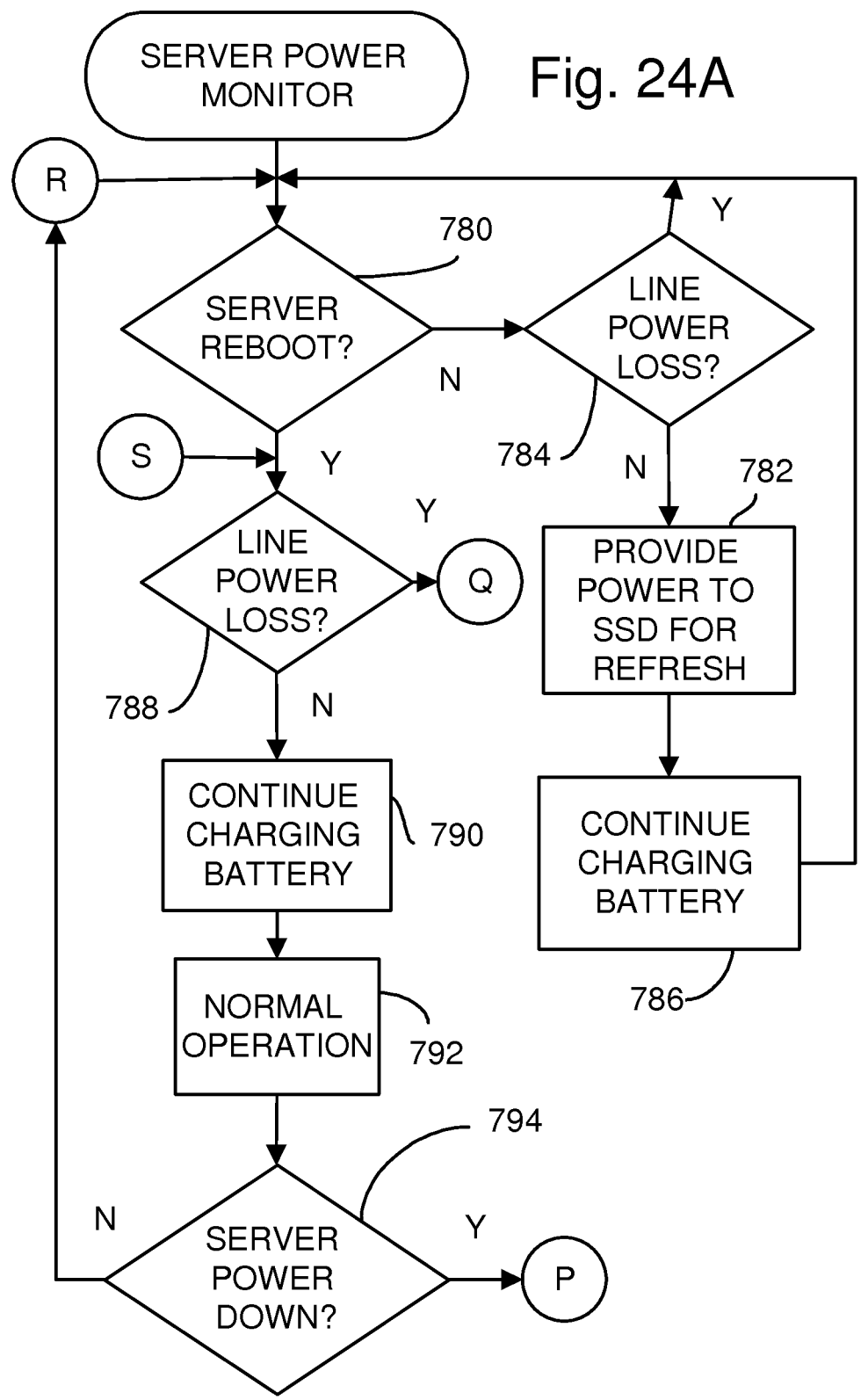
FIGS. 24A-B show operation of a server power monitor with UPS backup, persistent, and normal power-down modes.
Figure 24B:
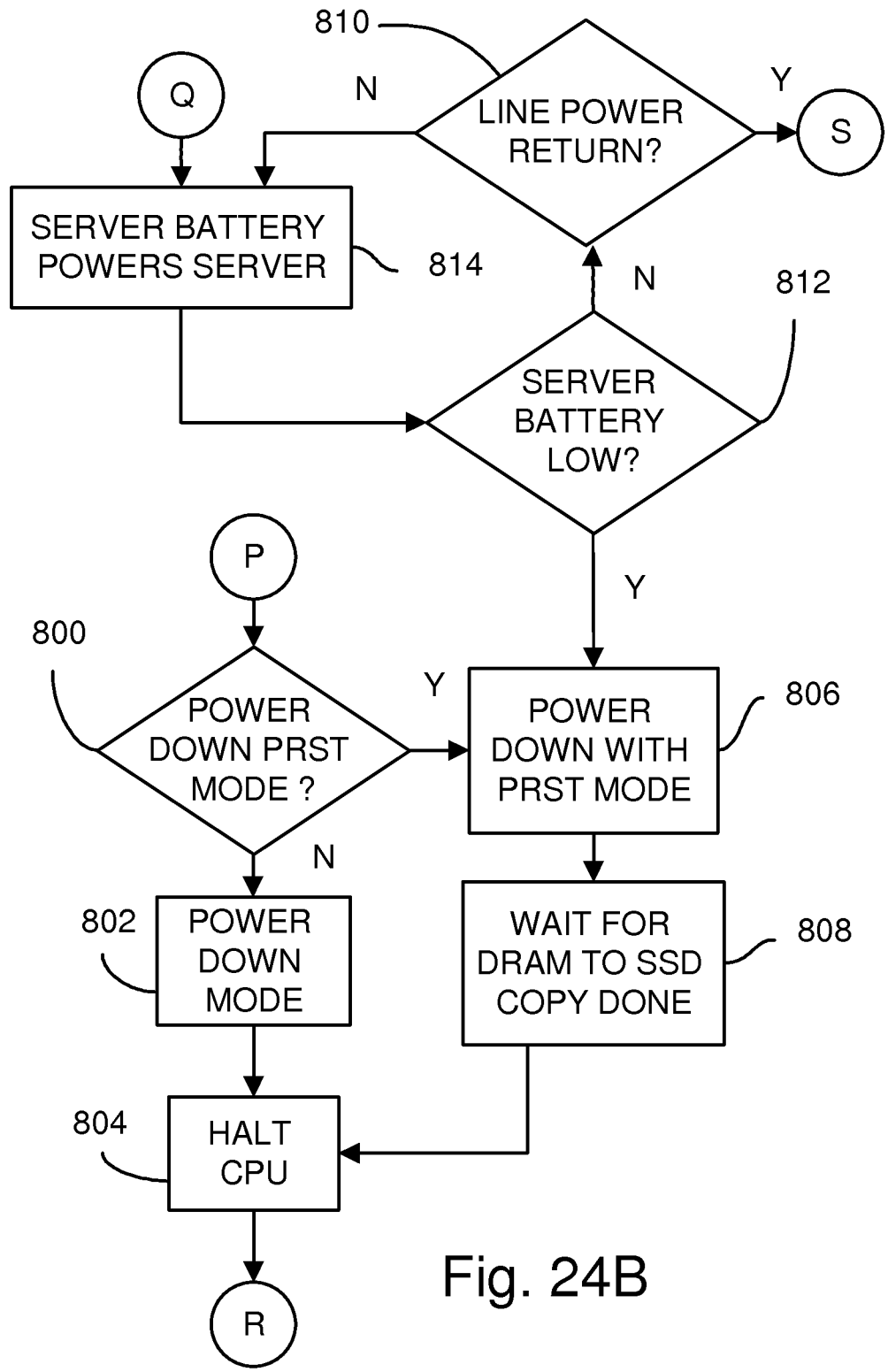

FIGS. 24A-B show operation of a server power monitor with UPS backup, persistent, and normal power-down modes. When the server is rebooted, step 780 and line power is on, step 788, then the power monitor continues to charge the server UPS battery, step 790, and the server operates normally, step 792, until the server powers down, step 794.

When the server is not rebooted, step 780 but the line power is lost, step 784, the server power monitor loops back to the initial step. When line power is not lost, step 784, power is provided to the SSD to refresh its flash memory, step 782. The power continues to charge the server battery, step 786, and the server power monitor loops back to the initial step.

When the server is rebooted, step 780 but the line power is lost, step 788, then in FIG. 24B, the server battery powers the server, step 814. If the server battery is not low, step 812, but line power returns, step 810, then the routine loops back to step 788 in FIG. 24A.

When the server battery is low, step 812, then persistent mode is used to power down, step 806. The routine waits for the DRAM to be copied to SSD, step 808, before the CPU is halted, step 804.

When the server powers down, step 794, and power down persistent mode is enabled, step 800, persistent mode is used to power down, step 806. The routine waits for the DRAM to be copied to SSD, step 808, before the CPU is halted, step 804.

When power down persistent mode is not enabled, step 800, a normal power down with power down mode occurs, step 802, and the CPU is halted, step 804.

Figure 25A:
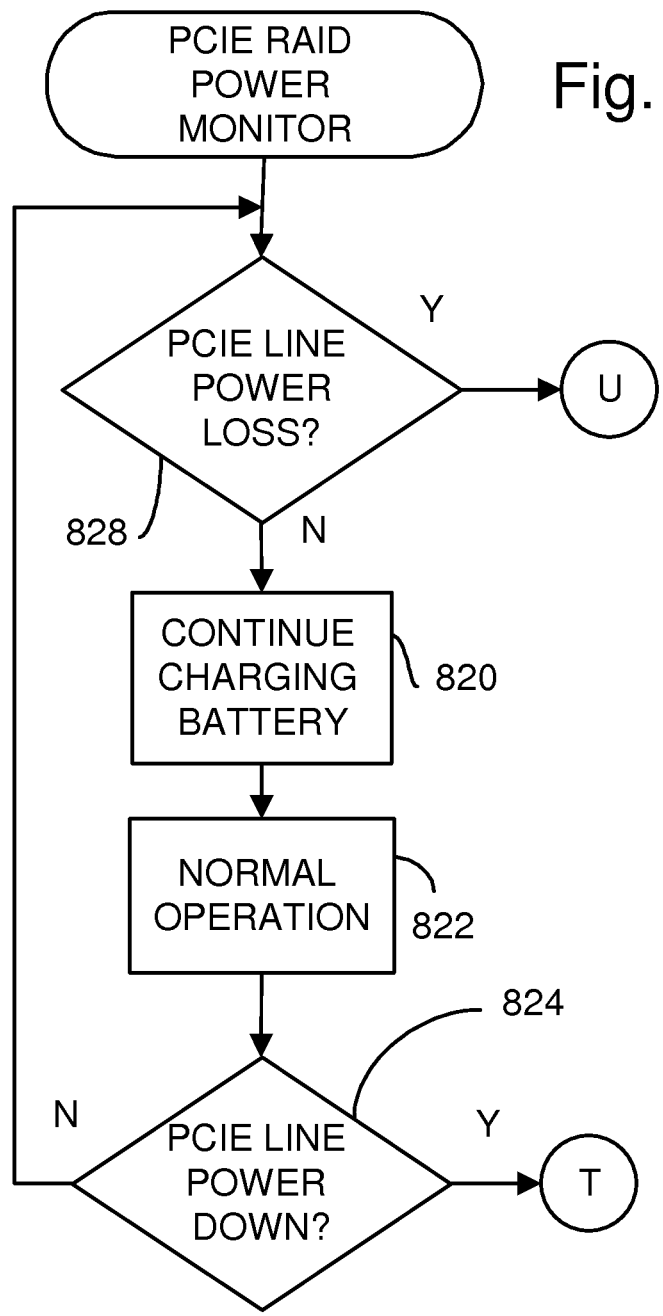
FIGS. 25A-C show a power monitor routine for a PCIe RAID controller with battery, persistent, and normal power-down modes.
Figure 25B:
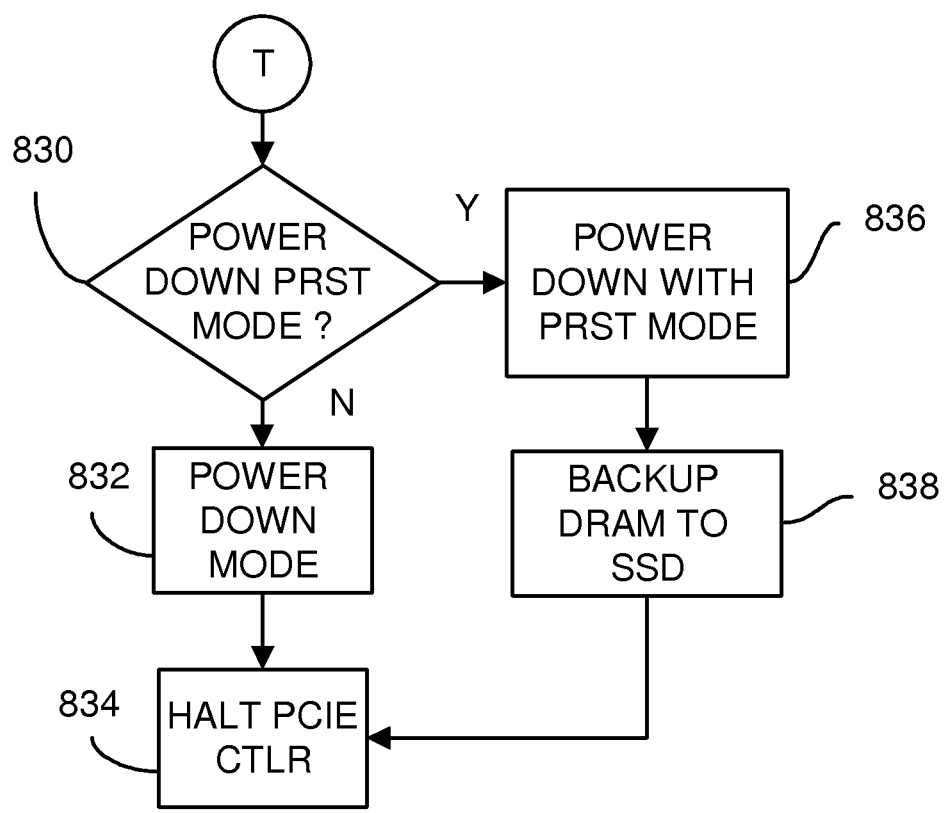
Figure 25C:
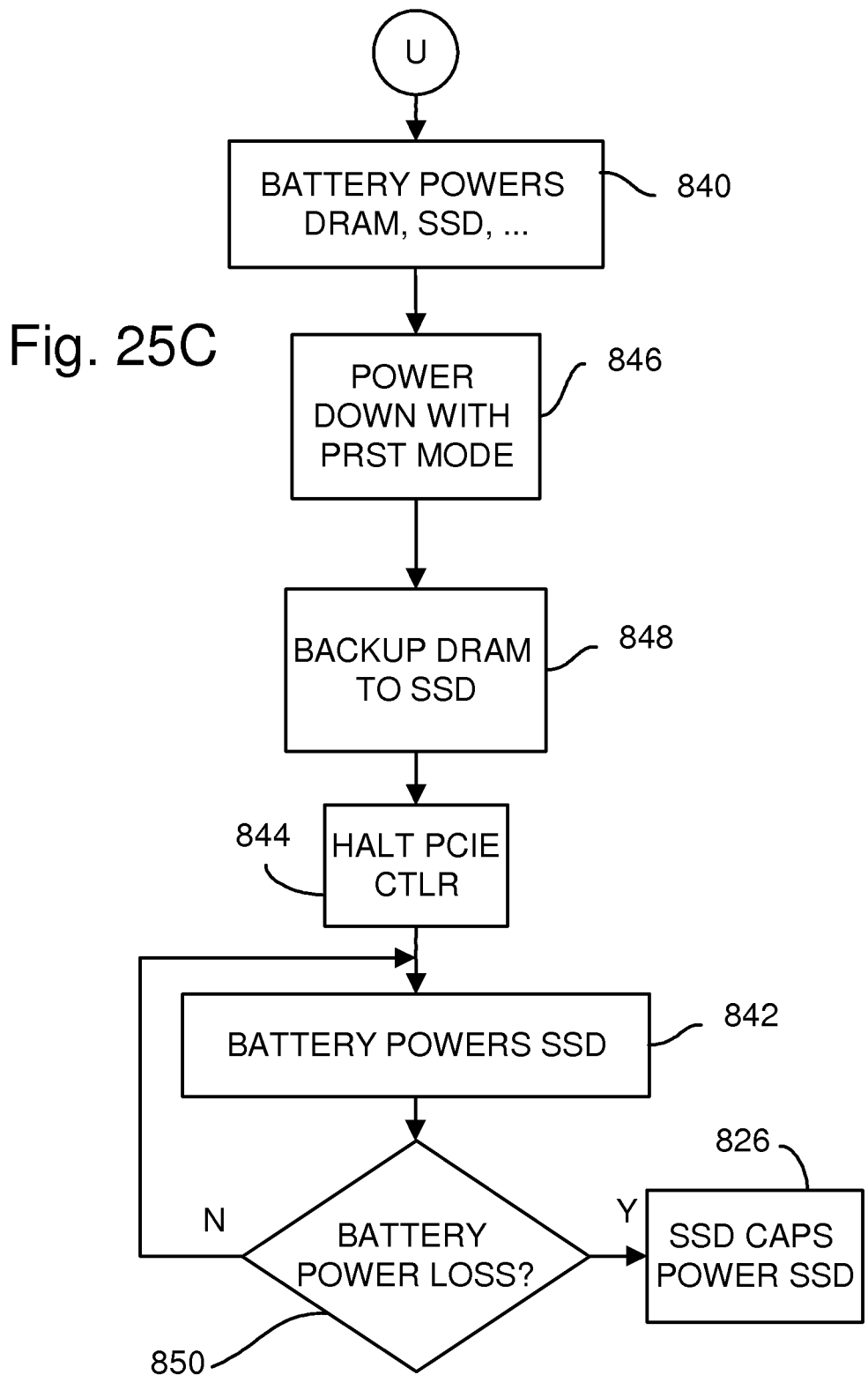

FIGS. 25A-C show a power monitor routine for a PCIe RAID controller with battery, persistent, and normal power-down modes. When the PCIe RAID controller has line power from host 300 PCIe interface, step 828, then the power monitor continues to charge the local battery, step 820, and the PCIe RAID controller operates normally, step 822.

When the power line to the PCIe RAID controller loses power, step 824, then in FIG. 25B, when power down persistent mode is enabled, step 830, persistent mode is used to power down, step 836. The routine waits for the DRAM to be copied to SSD, step 838, before the PCIe RAID controller is halted, step 834.

When power down persistent mode is not enabled, step 830, a normal power down with power down mode occurs, step 832, and the PCIe RAID controller is halted, step 834.

In FIG. 25C, when line power is lost, step 828, the local battery powers the DRAM, SSD, and other components related to persistent mode, step 840. Persistent mode is used to power down, step 846. DRAM data is copied to SSD, step 848, and the PCIe RAID controller is halted, step 844. The local battery powers the SSD, step 842. Once the local battery loses power, step 850, SSD capacitors power the SSD, step 826. Once these SSD capacitors lose power, data in the SSD DRAM is lost.

Figure 26A:
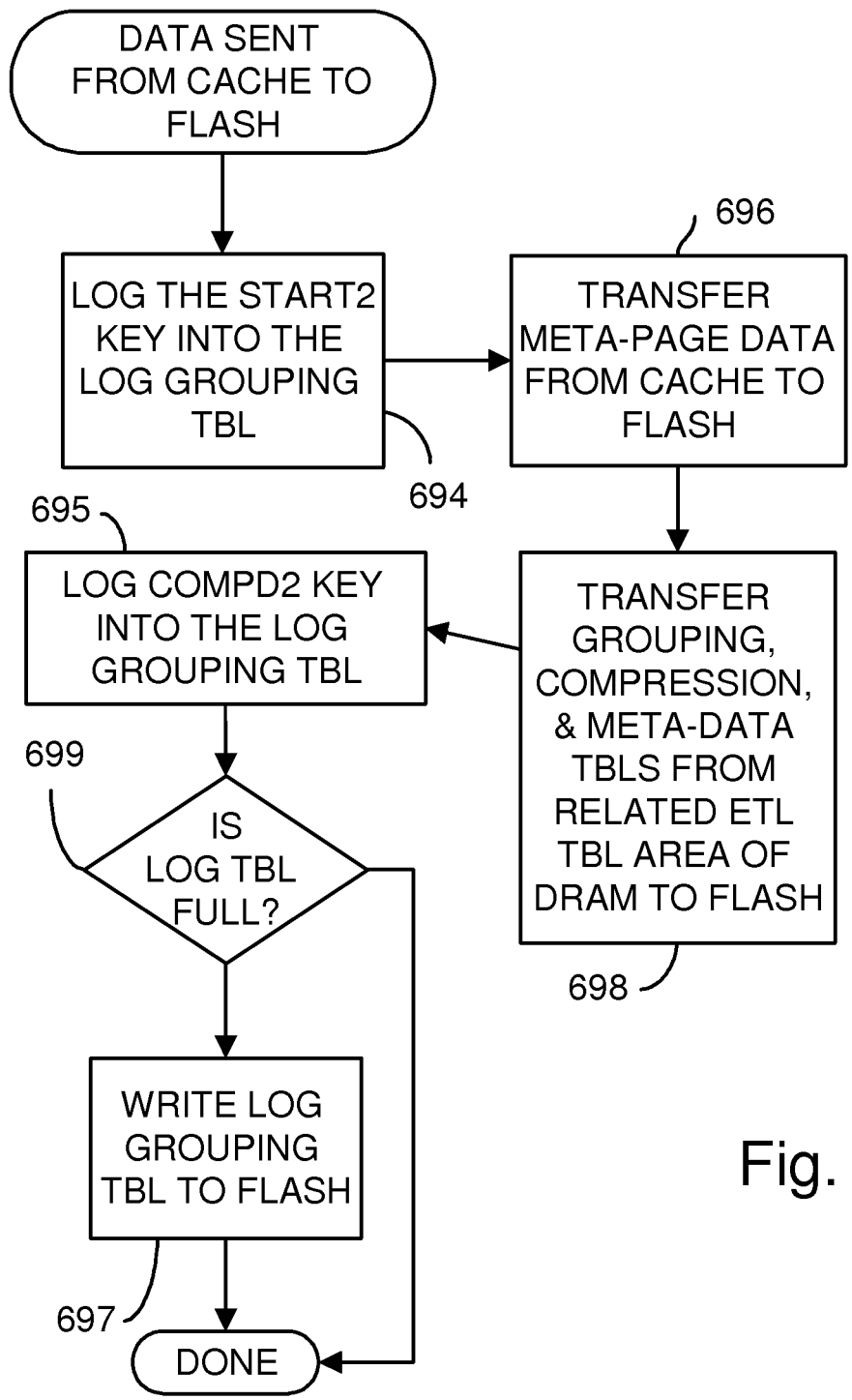

FIGS. 26A-D show routines related to logging. FIG. 26A is a flowchart of logging a write to flash memory from the DRAM cache in the SEED SSD. When the SEED SSD transfers data from SSD DRAM buffer to NAND flash memory, the start2 key or flag is written to the log grouping table, step 694. The write to flash data is in a meta-page form, step 696. Various meta-data tables, such as for grouping, compression, and other meta-data are transferred from the related ETL table areas of the SSD DRAM buffer to flash memory, step 698. The compd2 flag is logged into the log grouping table, step 695. When the log table is full, step 699, then the log grouping table is written to flash memory, step 697. The "start1" flag logs the start of data movement to DRAM while "start2" logs the start of write data to flash, "compd2" logs the completion of data moving to flash, 'abort1' logs that the data was overwrite by new data at the same LBA.

Figure 26B:
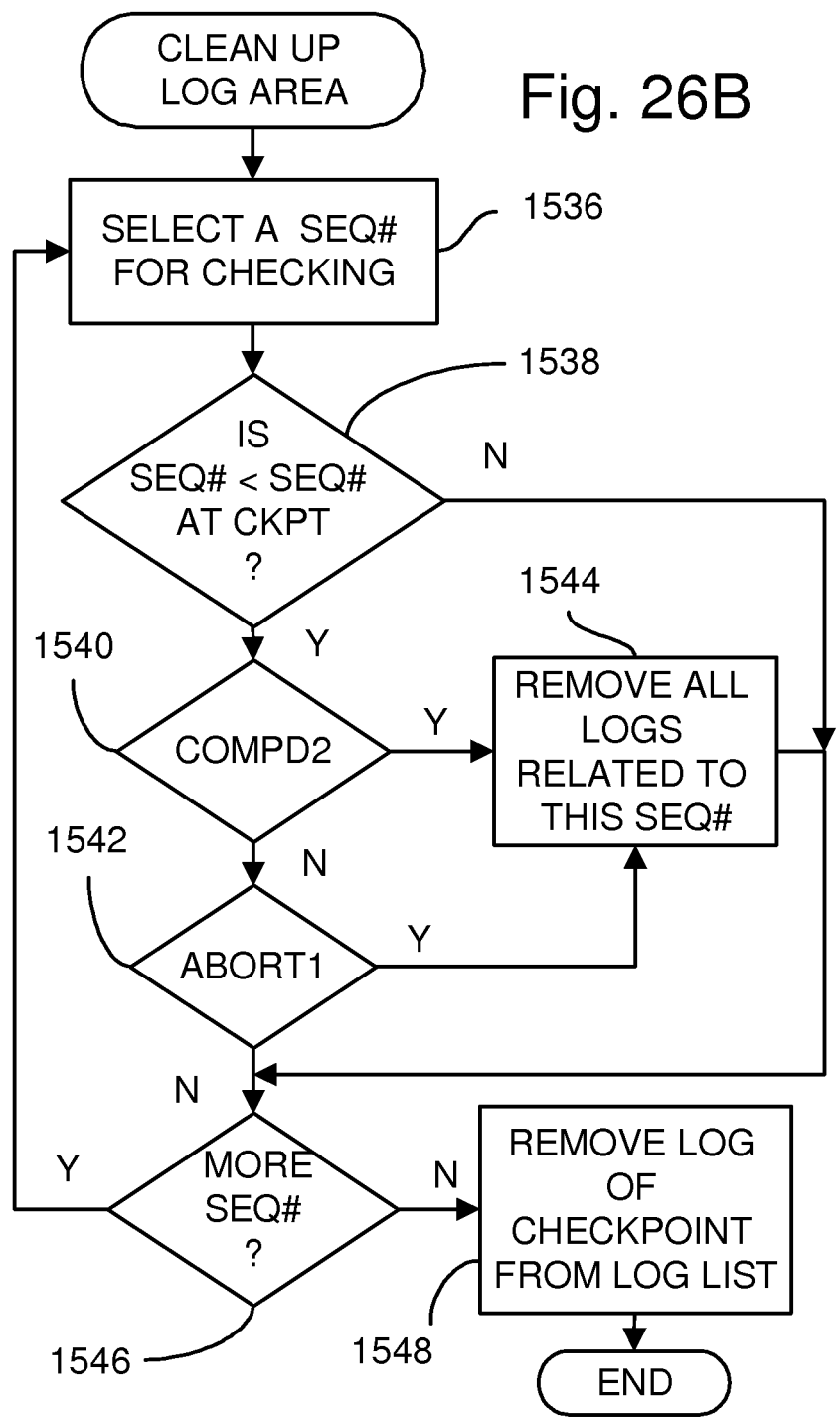

FIG. 26B is a flowchart of cleaning up a log area. It is executed after the checkpoint log insertion. A sequence number is selected for checking, step 1536, and compared to a sequence number of a checkpoint inserted for clean up purposes, step 1538. When the sequence number is before the checkpoint, step 1538, and the Compd2 flag was logged for this sequence, step 1540, then all logs related to this sequence number are removed, step 1544, since the sequence's data was successfully committed to flash memory. When the sequence has the aborti flag logged, step 1542, then all logs related to this sequence number are removed, since the original LBA data was overwritten by new data with a larger sequence number in DRAM, and no longer needs to move to flash memory, step 1544. When no more sequence numbers remain to be checked before the checkpoint, step 1546, then the log of the checkpoint is removed, step 1548.

Figure 26C:
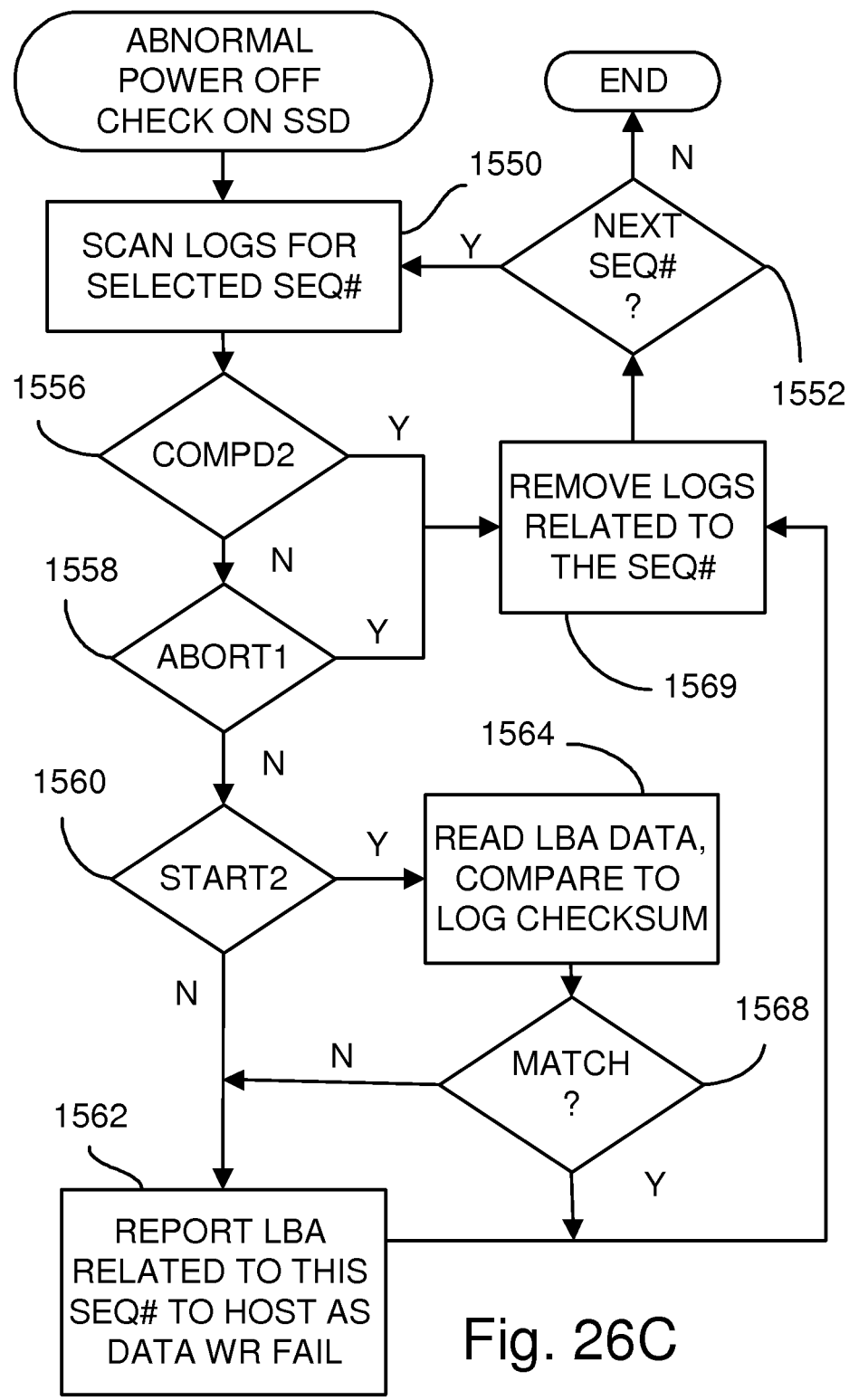

FIG. 26C shows an abnormal power off check performed on the SSD at the next power up. The logs are scanned for a selected sequence number, step 1550. When the compd2 flag, step 1556, or the aborti flag, step 1558, are found, the logs related to this sequence number are removed, step 1569, and if additional sequence numbers remain, then another sequence number is selected, step 1552, and the process repeated.

When neither the compd2 nor the abort1 flags are found, steps 1556, 1558, but the start2 flag is found, step 1560, then the LBA data is read, and a checksum generated and compared to the logged checksum, step 1564. When the checksums match, step 1568, the logs related to this sequence number are removed, step 1569, since the data was been written correctly despite the abnormal power off.

When no checksum match occurs, step 1568, or the start2 flag is not found, step 1560, then the LBA related to this sequence is reported to the host as a failed data write during abnormal power off, step 1562. The logs related to this sequence number are removed, step 1569, and if additional sequence numbers remain, then another sequence number is selected, step 1552, and the process repeated.

FIG. 26D shows an abnormal power off check performed on the host at the next power up. The list of failed data writes and their LBA locations is received from the SSD (step 1562) and read, step 1580, and a failed LBA on the list is selected, step 1582. The transaction numbers in the log table is compared to the LBA to see if they are related, step 1584. When the LBA is not related, step 1586, another LBA on the list may be selected, step 1582. When the LBA is related, step 1586, and the compd flag is found, step 1588, then the transaction is redone. Each LBA in the write transaction logs is checked and updated with the new value recorded in the logs, step 1592. When the compd flag is not found, step 1588, then the transaction is undone. Each LBA in the write transaction logs is checked and updated with the old value recorded in the logs, step 1590. When more failed LBA's remain on the list, step 1594, then another LBA on the list may be selected, step 1582.

Figure 27:
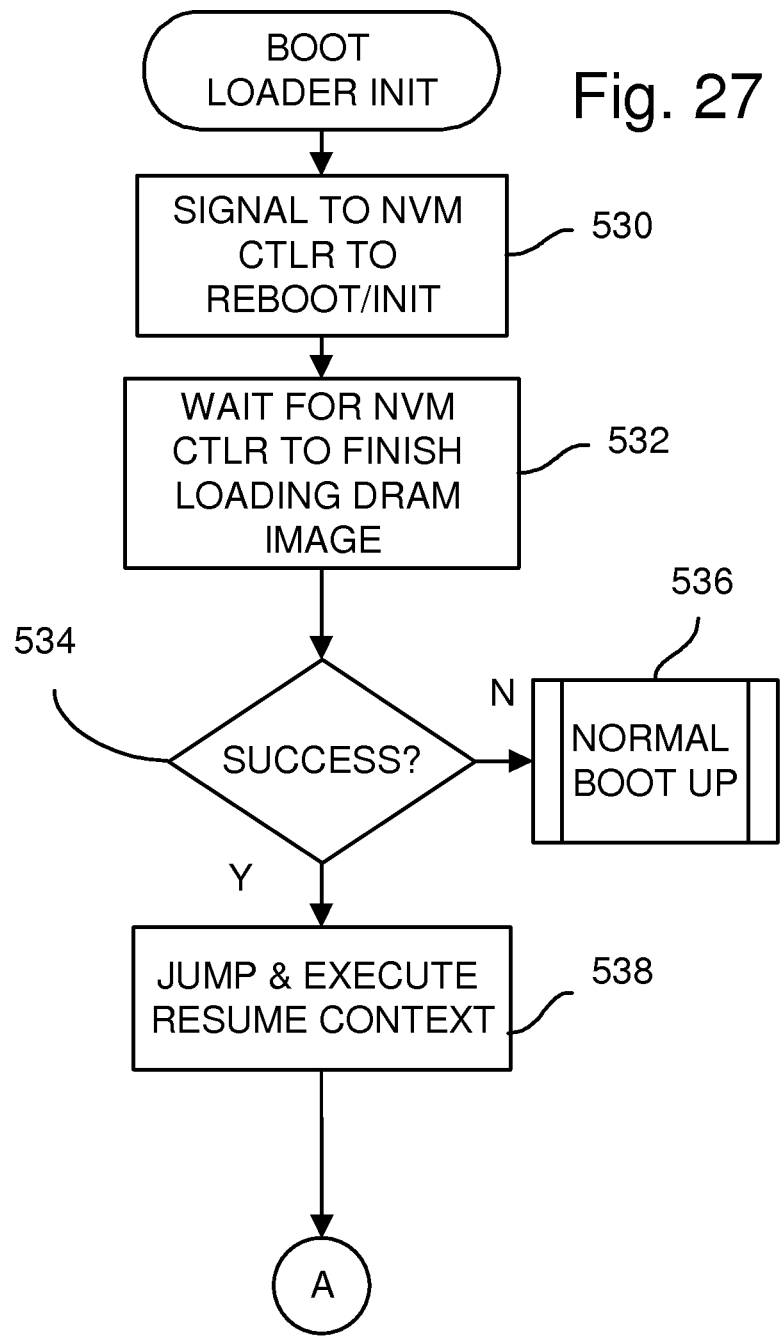
FIG. 27 is a diagram of a boot loader program executing on a host when a NVM controller stores an image in its DRAM.

FIG. 27 is a diagram of a boot loader program executing on a host when a NVM controller is responsible to store and retrieve a persistent mode DRAM image in its SSD. In step 530, host 300 at boot up sends a signal to the NVM controller, such as signal CPU_INIT of FIG. 7. The NVM controller loads the restore image from the SSD while the host controller is waiting, step 532. The host waits for the NVM controller to signal success or failure, such as by using signal SUCCESS/FAIL of FIG. 7. The NVM controller copies the restore image from its DRAM to the CPU's DRAM. Based on the SUCCESS/FAIL signal, the CPU may then read the restore image. When the restore image was successfully transferred, step 534, then the host CPU jumps to resume context 213 of the restored image and begins execution there, step 538. The process then continues as shown in FIG. 16B.

When the restore image failed to load, step 534, then a normal default non-persistent mode boot up routine is executed by the host, step 536.

Figure 28A:
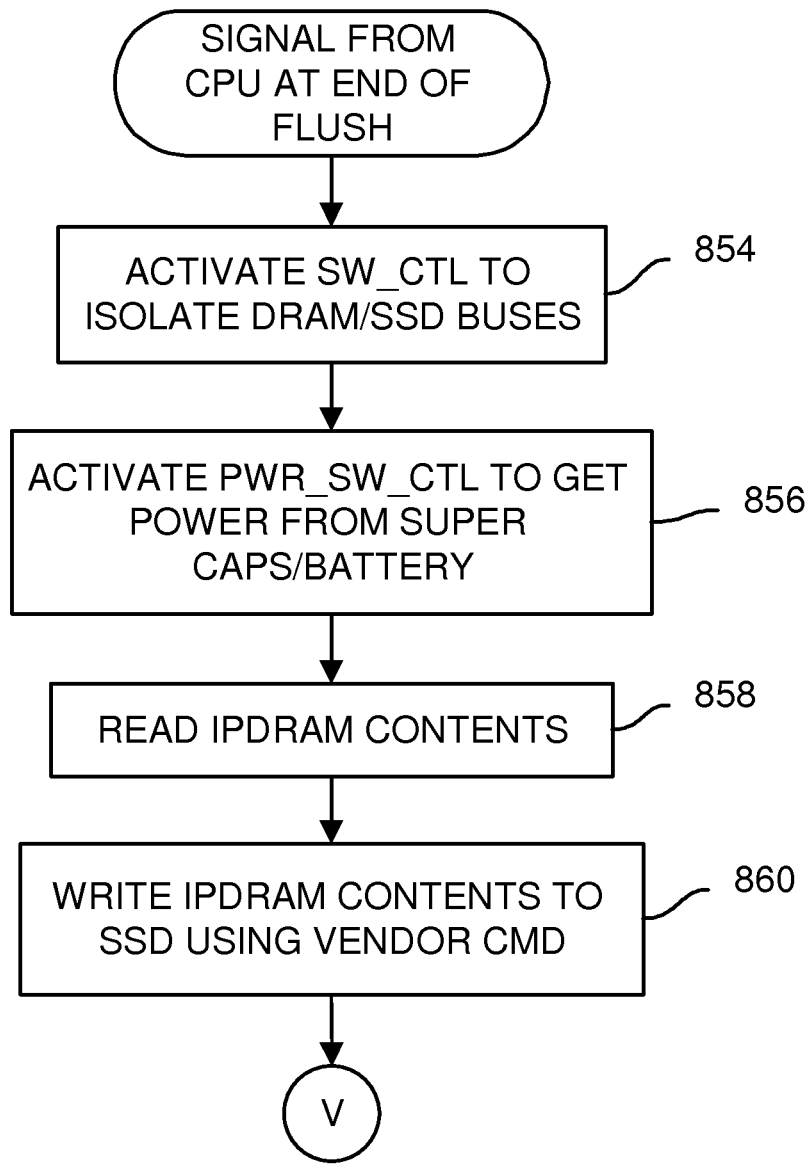
FIGS. 28A-B show a NVM controller taking control of a motherboard by activating isolating switches to backup data pointed to by the IPDRAM.
Figure 28B:
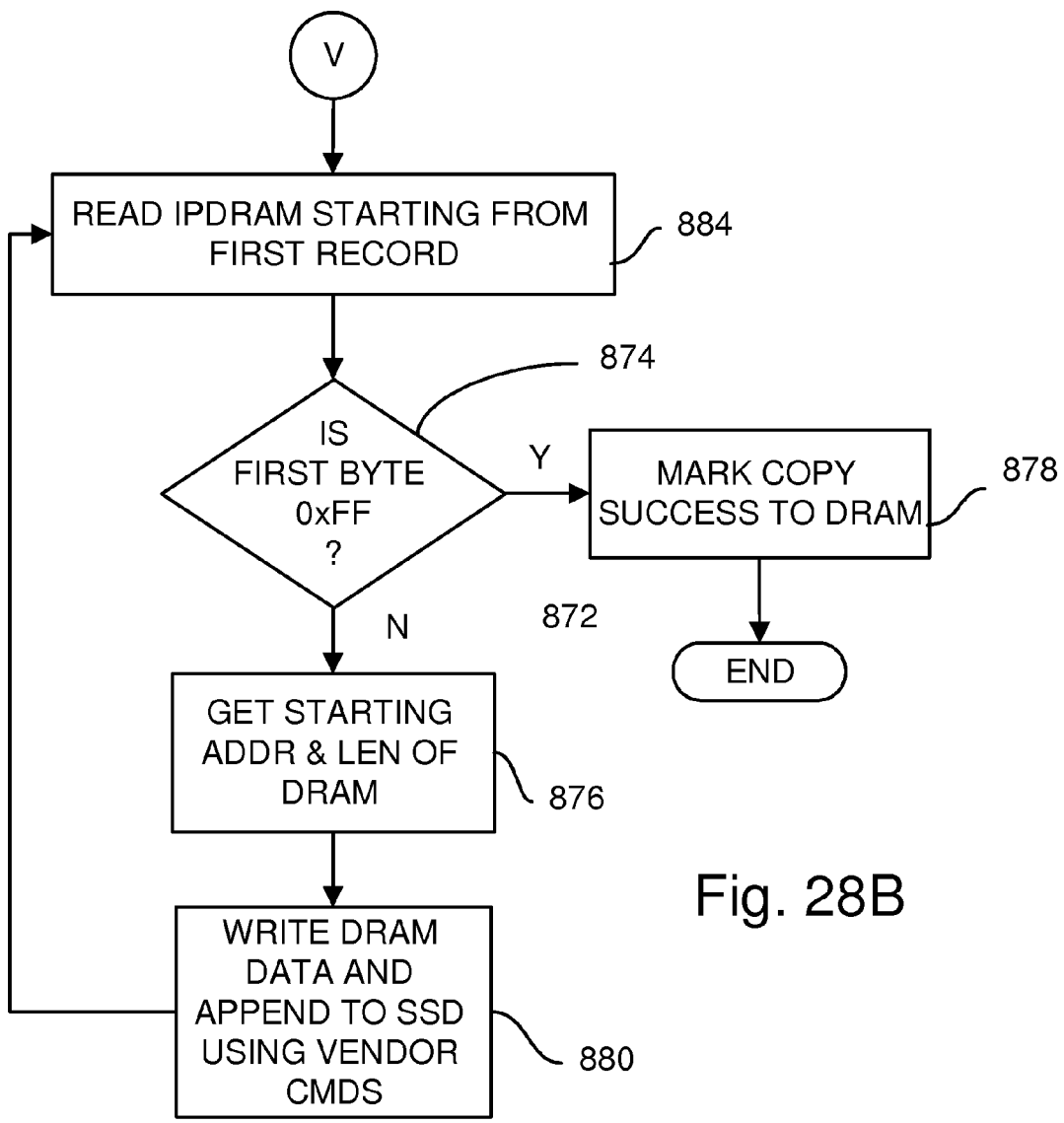

FIGS. 28A-B show a NVM controller taking control of DRAM and SSD on a motherboard by activating isolating switches to backup data pointed to by the IPDRAM. During power down with persistent mode the host flushes and prepares processor context 207, CPU caches 209, and resume context 213, and then signals to the NVM controller that the flush is done, such as by activating signal CPU_HALT of FIG. 7. The NVM controller then isolates the CPU and chip set from the DRAM and SSD by activating the switch control signal SW_CTL to the isolating switch 60 (FIG. 7). These switches isolate the DRAM and SSD busses for use by the NVM controller, step 854. The power to the CPU is lost, but the NVM controller activates the power switch control signal PWR_SW_CTL to get power from the super capacitor or local battery, step 856. The isolated power domain includes the NVM controller, DRAM, and SSD, so less power is drawn than if the CPU and chip set were drawing power.

The NVM controller reads the contents of the IPDRAM, step 858, and writes the IPDRAM contents to the SSD using vendor commands for power re-boot information, step 860.

In FIG. 28B, the NVM controller reads the IPDRAM contents, starting from the first record, step 884. When the first byte is 0xFF, step 874, then the end of the IPDRAM has been reached. A copy success flag is set in the SSD, step 878. The operation of the NVM controller may then be halted.

For other records, step 874, the pointer to the starting address of the data pointed to, and its length, are read from the next entry, step 876. The data pointed to is read from DRAM and stored in the SSD using vendor commands, step 880.

FIGS. 29A-B highlights mode selection during GND driver initialization. During booting of the host when the GND driver is initialized, the power mode used during the last power down is determined. When the user makes a selection, step 1204, but persistent mode is not used, step 1206, then the GND driver sets the mode as power down mode, step 1210. The restore image should be in SSD flash memory.

When persistent mode was used, step 1206, and backup power was available during the last power down, step 1202, then the GND driver sets the mode as persistent mode, step 1208. The restore image should be available in DRAM.

When persistent mode was used, step 1206, and backup power was not available during the last power down, step 1202, then the GND driver sets the mode as modified persistent mode, step 1211. Only a small amount of DRAM was used due to low available power. The restore image in DRAM might be lost due to backup power loss.

When the user makes no selection when prompted, step 1204, and backup power was available during the last power down, step 1205, then the GND driver sets the mode as persistent mode, step 1208. The restore image should be available in DRAM. When backup power was not available during the last power down, step 1205, then the GND driver sets the mode as power down mode, step 1210.

Figure 30A:
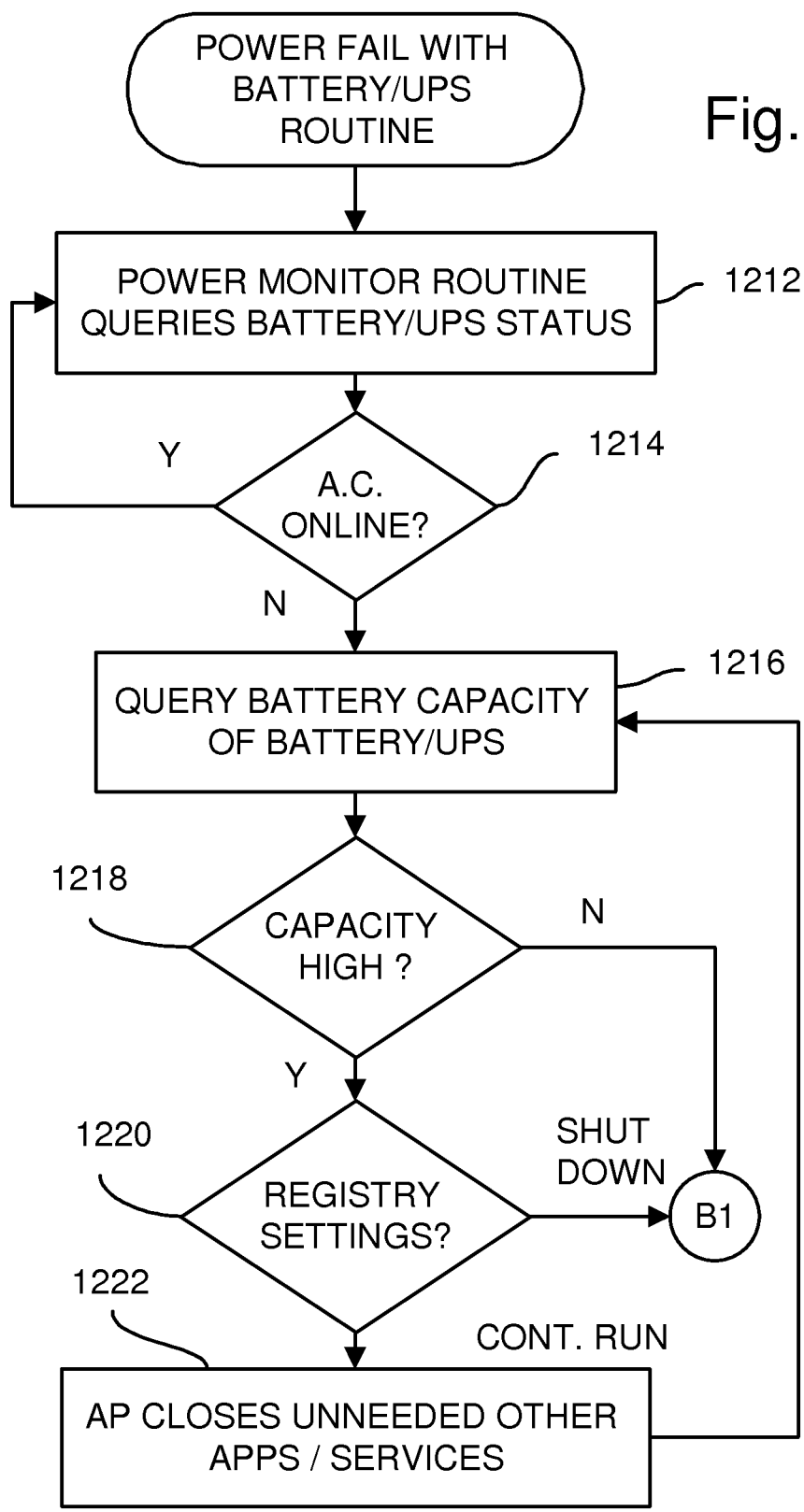
FIGS. 30A-C show a power-down routine for the GND driver when a UPS or battery backup is available.
Figure 30B:
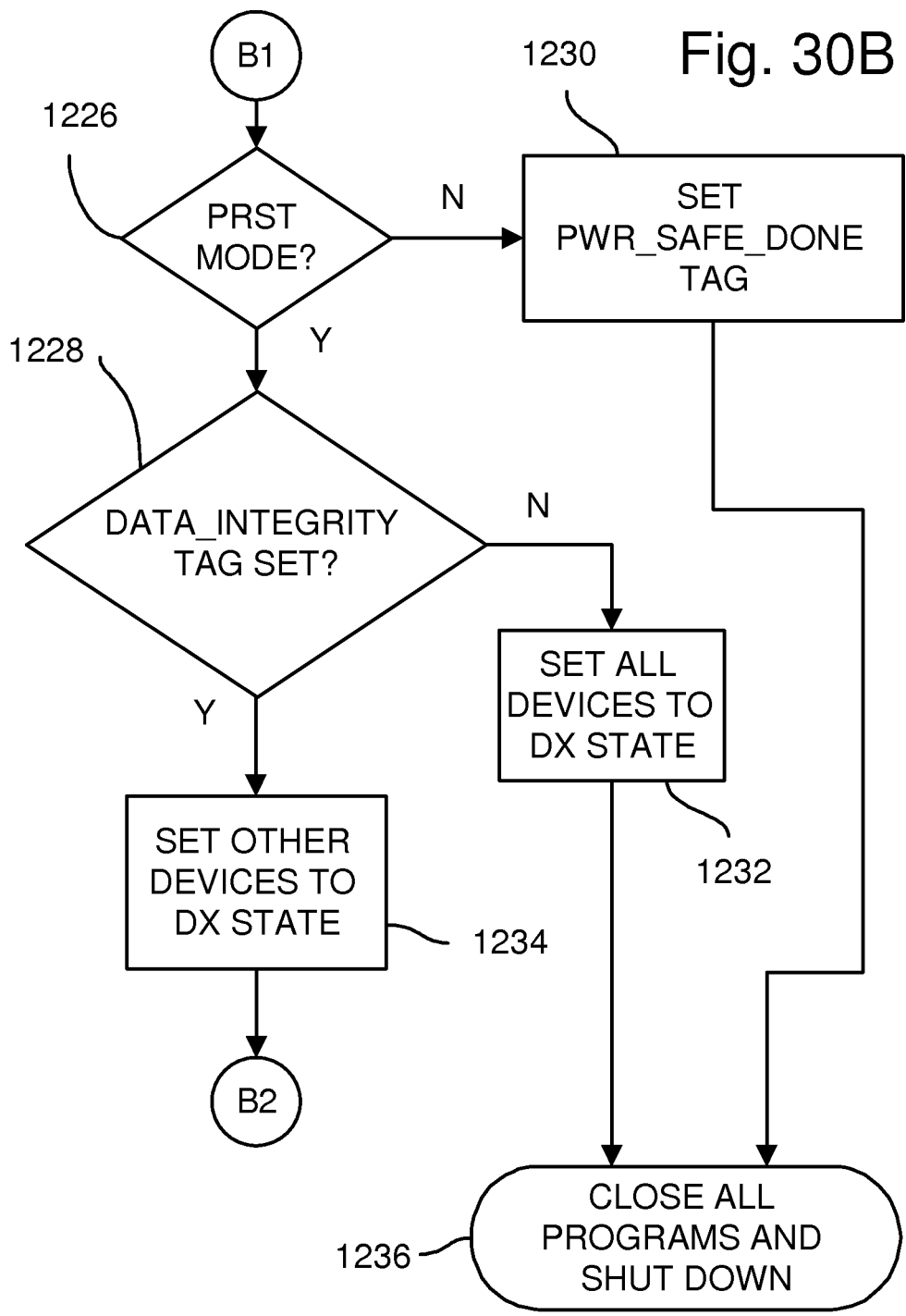
Figure 30C:
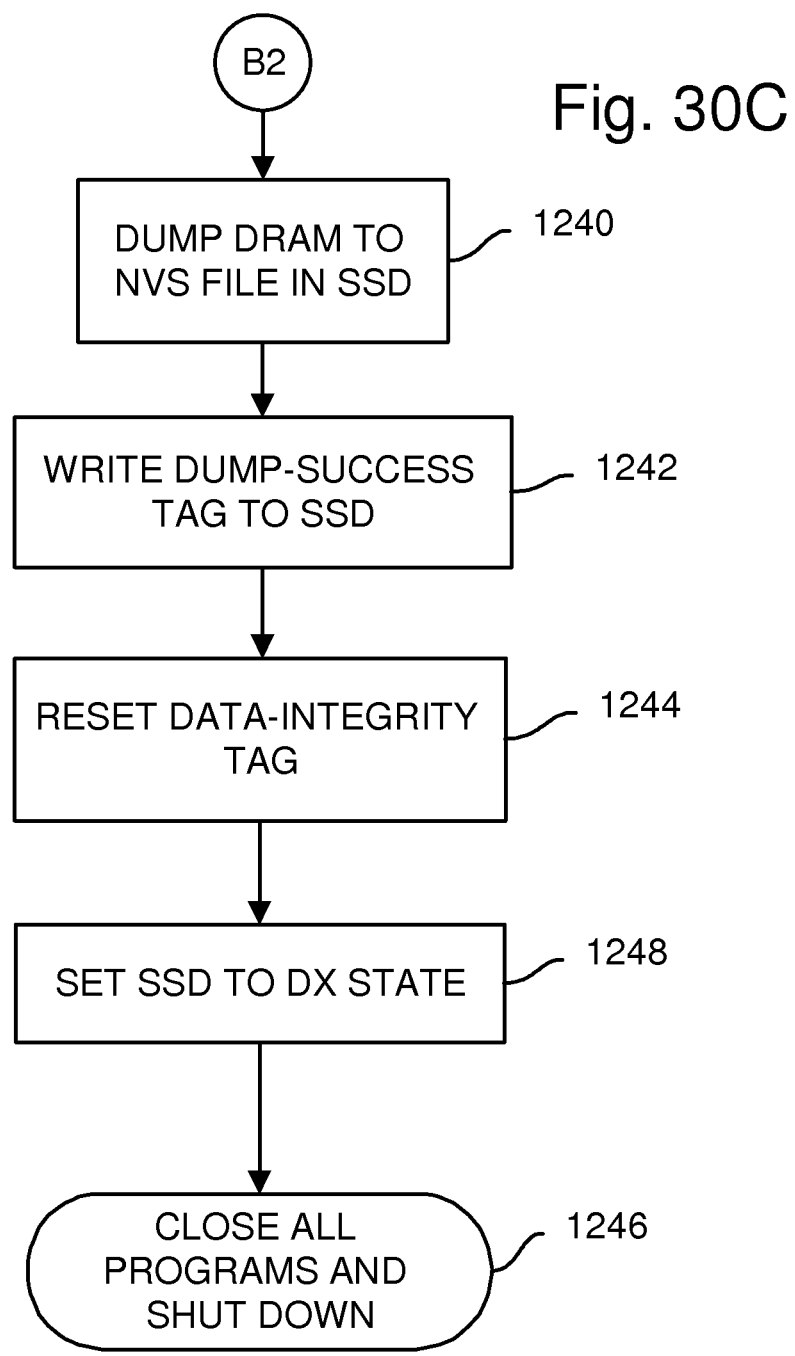

FIGS. 30A-C show a power-down routine for the GND driver when a UPS or battery backup is available. A power monitor routine queries the status of the UPS or battery, step 1212, such as by reading an AC line status (on-line or off-line) from the supply, and reading a battery flag from the supply, which might indicate high when 66% or more of the battery's energy remains, indicating low when 33% remains, indicating critical when 5% remains, indicating charging, no battery present, etc.

When the status is AC off-line, step 1214, the battery status is obtained from the battery, UPS, or other supply, step 1216. When the battery capacity is high, step 1218, then shut down may proceed normally as shown in FIG. 30B. The registry settings may also be configured for a normal shut down, step 1220. Otherwise the GND driver runs continuously and does not shut down, but the GND driver does close unnecessary apps and services, step 1222, to conserve battery power. The GND driver then continues to monitor the battery status, step 1216, such as periodically.

In FIG. 30B, the battery level falls below the shut down threshold, step 1218, or the registry is configured to shut down the GND driver, step 1220.When persistent (PRST) mode is not enabled, step 1226, then the power save done flag is set, step 1230, and all programs including the GND driver are closed and the host powers down, step 1236.

When persistent mode is enabled, step 1226, and the data integrity flag is not set, step 1228, then all devices are set to the DX state, where devices stop the activity and wait for power off, step 1232. All programs including the GND driver are closed and the host powers down, step 1236.

When persistent mode is enabled, step 1226, and the data integrity flag is set, step 1228, then all other devices are set to the DX state, step 1234.

In FIG. 30C, the host DRAM contents are dumped to a non-volatile storage NVS file, such as persistent mode DRAM image 203 or a file with the image in the SSD, step 1240. The dump-success flag is written to the SSD, step 1242, and the data-integrity flag is reset, step 1244. The SSD is set to the DX state, step 1248. All programs including the GND driver are closed and the host powers down, step 1246.

Figure 31A:
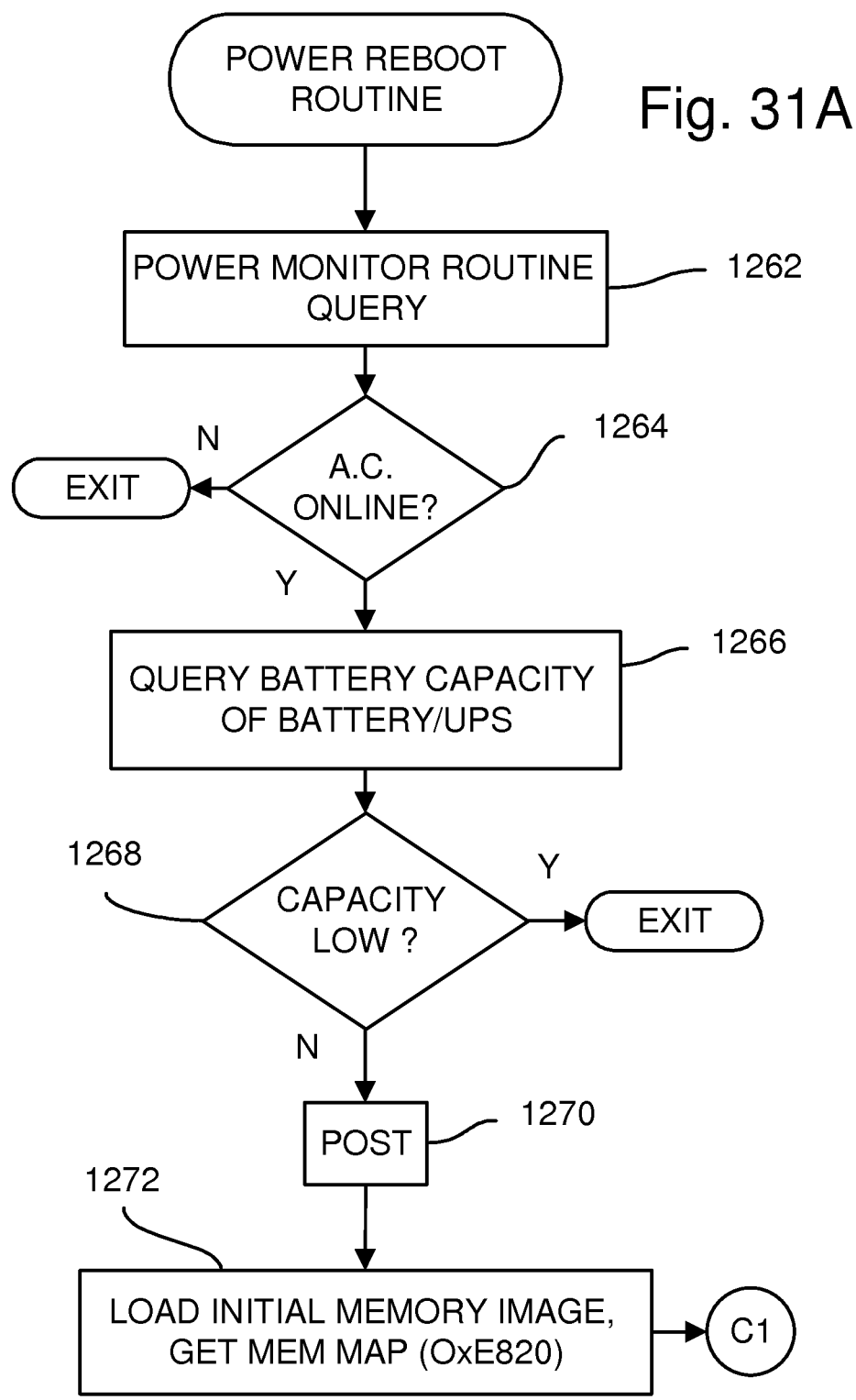
FIGS. 31A-B show a power-on rebooting routine for the GND driver when a UPS or battery backup is available.
Figure 31B:
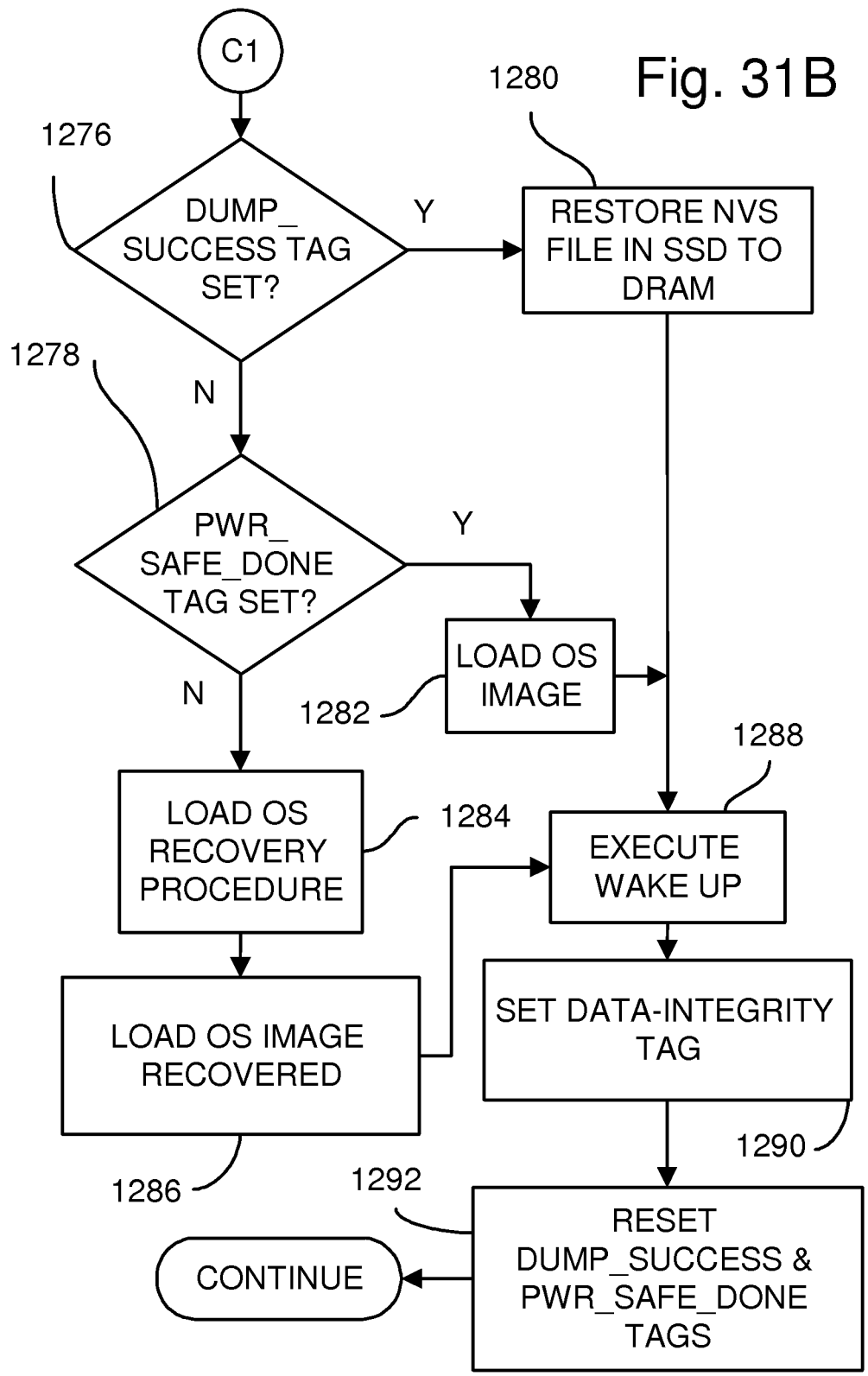

FIGS. 31A-B show a power-on rebooting routine for the GND driver when a UPS or battery backup is available. A power monitor routine queries the status of the UPS or battery, step 1262, such as by reading an AC line status (on-line or off-line) from the supply. When the status is AC on-line, step 1264, the battery status is obtained from the battery, UPS, or other supply, step 1266. When the battery capacity is not low, step 1268, then the Power-On-Self-Test (POST) routine is executed on the host, step 1270. The initial memory image is loaded and a memory map read, step 1272.

In FIG. 31B, when the dump success flag was set, step 1276, then the NVS file in the SSD may be read from SSD and loaded into the host DRAM, step 1280. A wake-up routine is then executed by the host, step 1288. The data-integrity flag is set, step 1290, and the dump-success and power-safe-done flags are reset for the next power down, step 1292.

When the dump success flag was not set, step 1276, but the power-safe-done flag was set, step 1278, then the OS image may be loaded from the SSD, step 1282, and the wake-up routine can be executed, step 1288, and the following steps 1290, 1292 performed.

When the dump success flag was not set, step 1276, and the power-safe-done flag was not set, step 1278, then an OS recovery procedure is loaded, step 1284, and the recovered OS image that the OS recovery procedure generates is loaded, step 1286. The wake-up routine is then executed, step 1288, and the following steps 1290, 1292 performed.

Figure 32A:
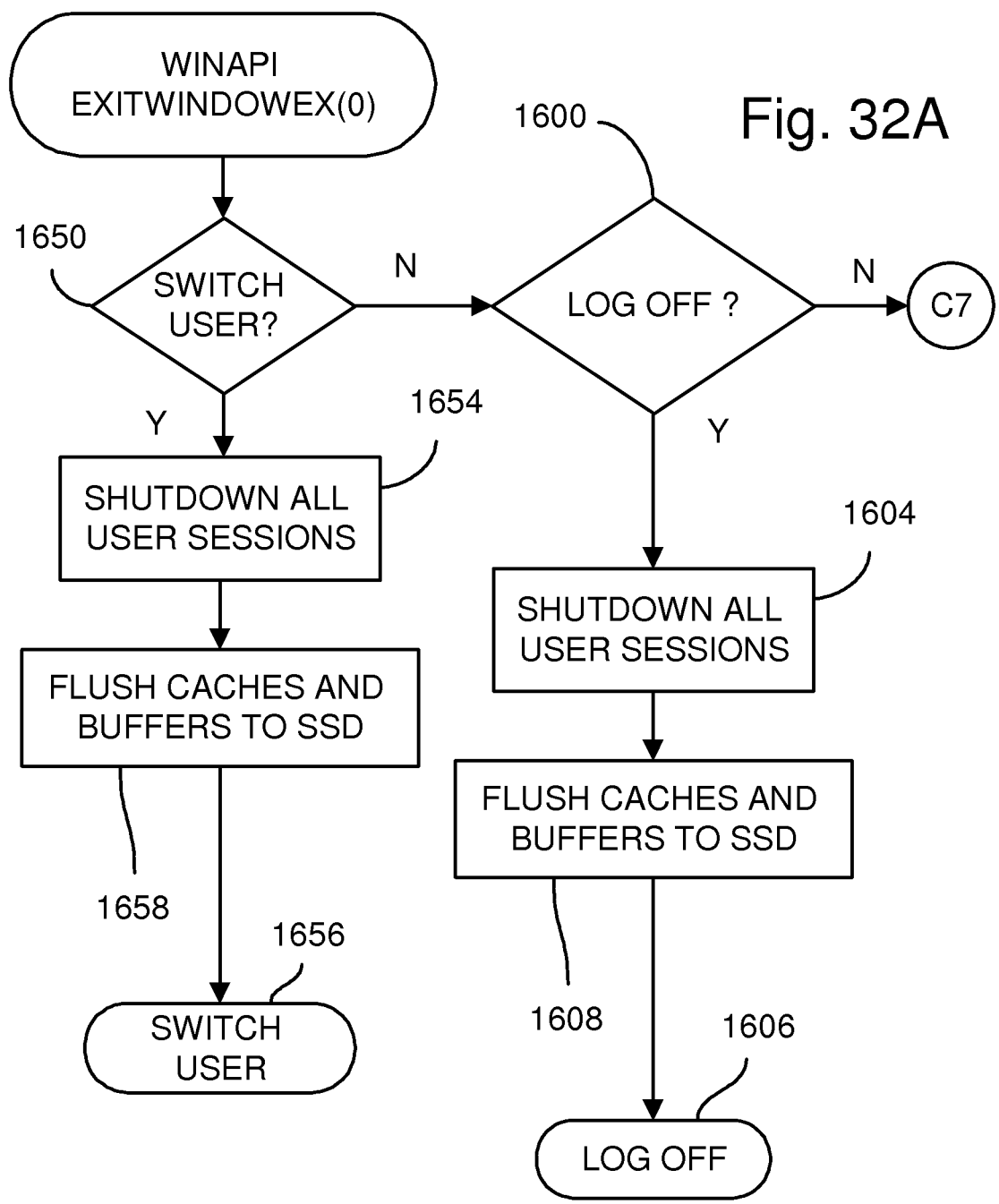

FIGS. 32A-E show a user-selected exit window procedure with the GND driver in control. In FIG. 32A, when the user is switched, step 1650, all user sessions are shut down, step 1654. Caches and buffers are flushed to SSD, step 1658, and the user is ready for a new user to switch to, step 1656.When the user selects log off, step 1600, all user sessions are shut down, step 1604. Caches and buffers are flushed to SSD, step 1608, and the users are logged off, step 1606.

Figure 32B:
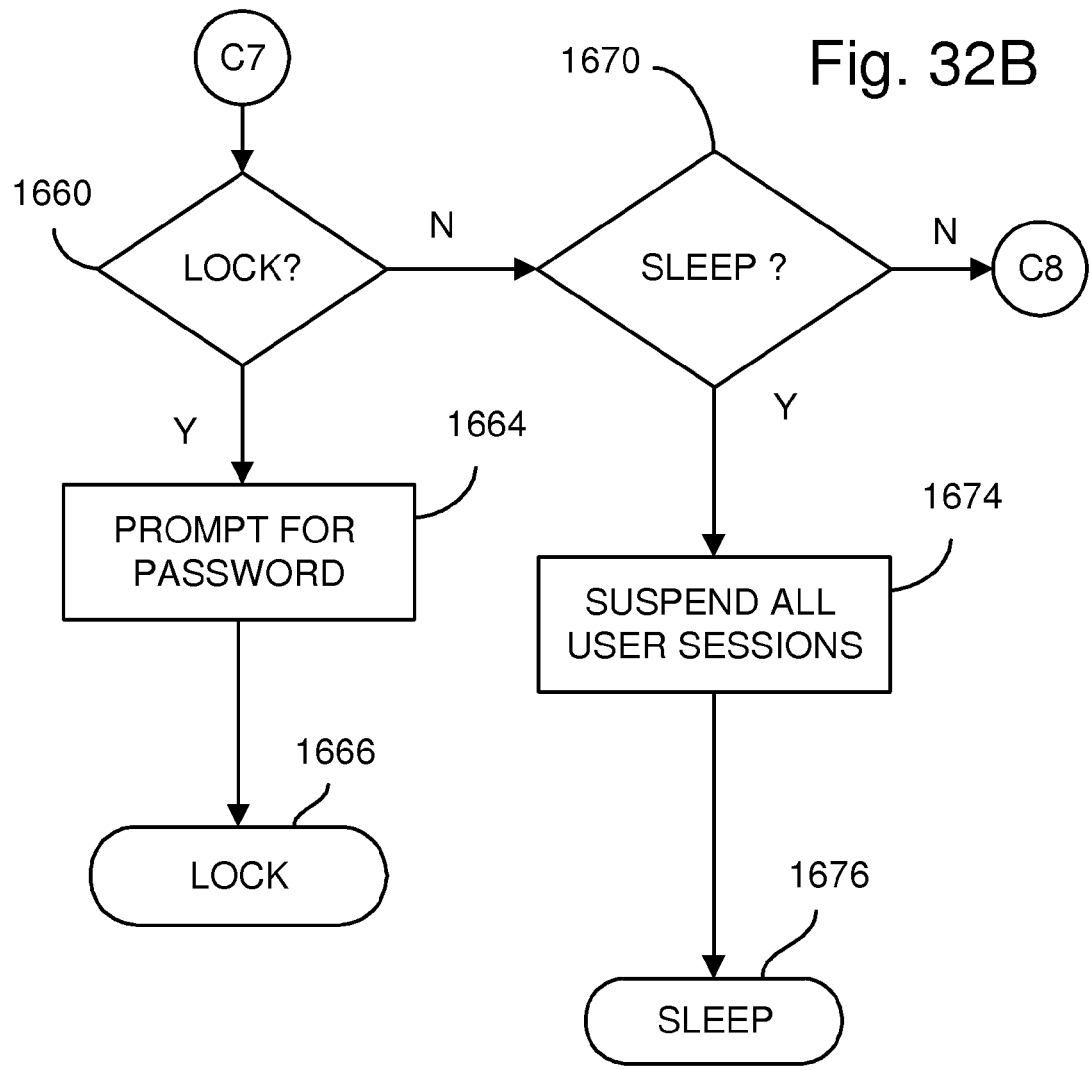

In FIG. 32B, when lock is selected by the user, step 1660, the user is prompted for his password, step 1664. The system is locked, step 1666. When the user selects sleep, step 1670, all user sessions are suspended, step 1674. Sleep mode is entered, step 1676.

Figure 32C:
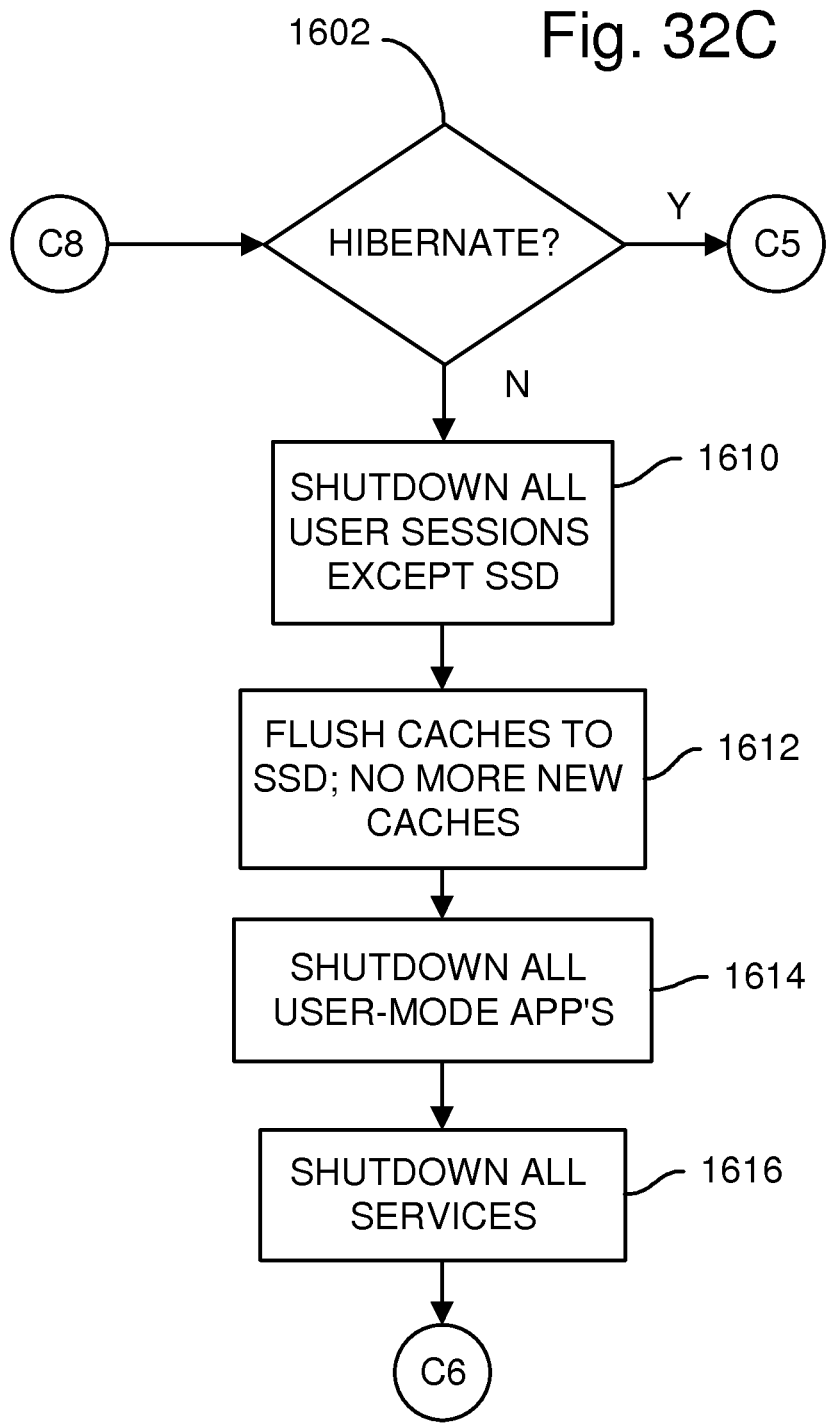
Figure 32E:
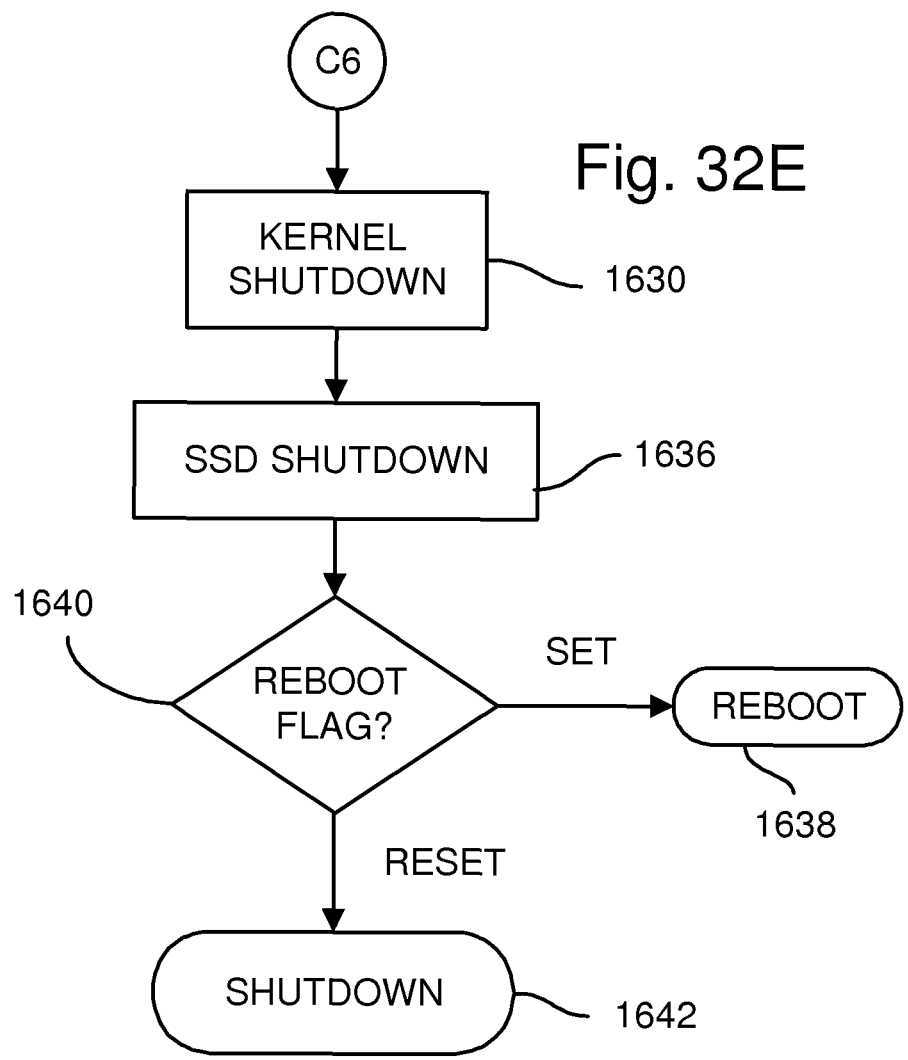

In FIG. 32C, when hibernate is not activated, step 1602, all user sessions except the SSD are shut down, step 1610. Caches are flushed to the SSD, step 1612, and no new caches are allowed. All user-mode apps are shut down, step 1614, and all services are shut down, step 1616. Continuing in FIG. 32E, the kernel is shut down, step 1630, and the SSD is shut down, step 1636. When the reboot flag is set, step 1640, then the system is rebooted, step 1638, otherwise the system is shut down, step 1642.

When hibernate is selected, step 1602, the process continues in FIG. 32D. All applications are suspended, step 1620. All services except the GND driver service are suspended, step 1622. All devices are queried, step 1624, and a vendor command is used to inform the SSD to prepare to suspend, step 1626. All devices except the SSD are suspended, step 1628. The hibernate file is written to the SSD, step 1632. The SSD suspends operation, step 1634, and hibernation is entered, step 1644.

Figure 33A:
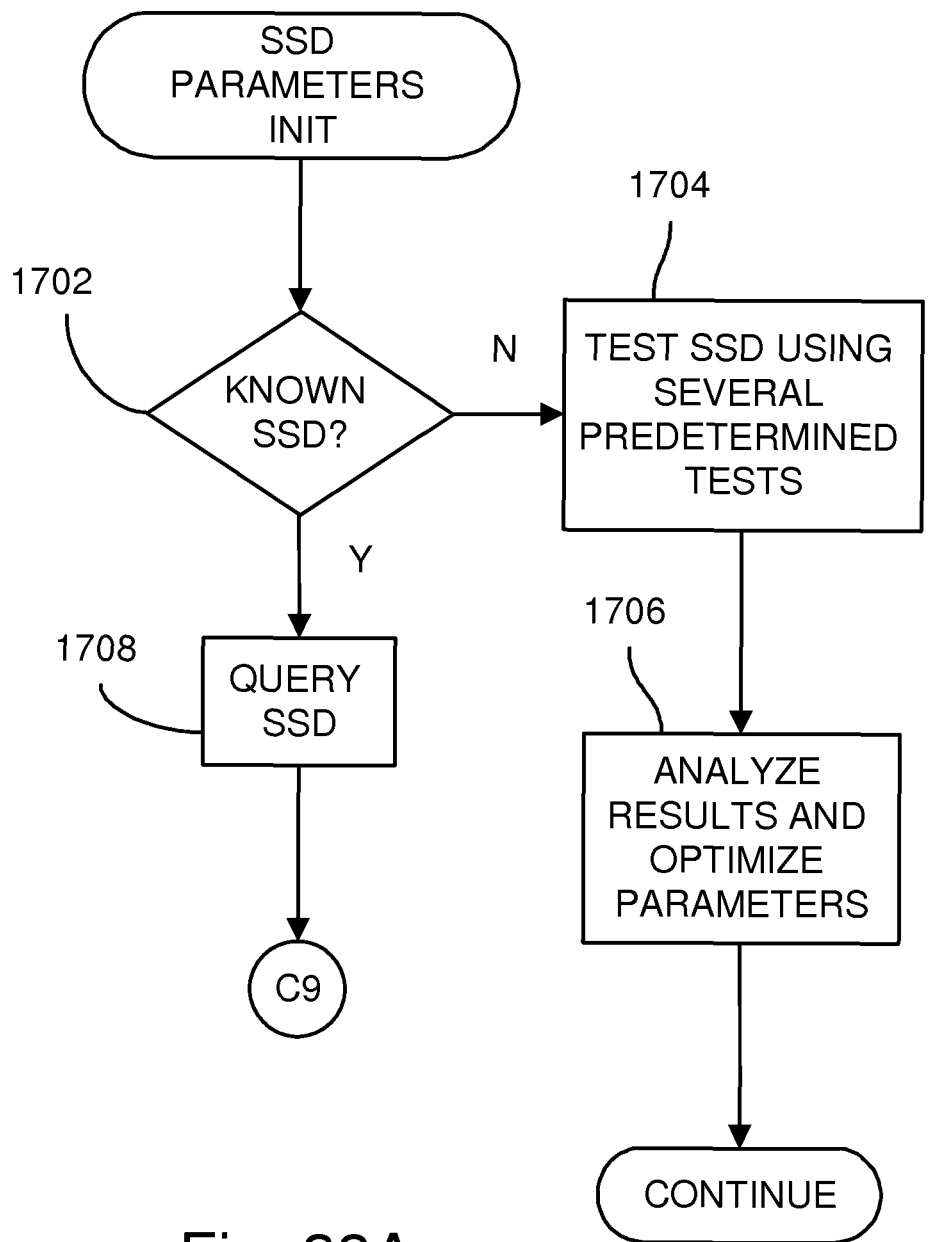

FIGS. 33A-B show a GND driver parameters initialization routine. When the SSD is not of a known type, step 1702, then the attached SSD is tested using several predetermined tests, step 1704. The test results are analyzed and the parameters optimized, step 1706.

When the SSD is of a known type, step 1702, the SSD is queried, step 1708. When the SSD is of a standard type, step 1710, the standard SSD ID is obtained from the SSD, step 1712. Parameters are selected for the standard SSD matching this standard SSD ID, which includes the adjustment of the SSD partition alignment, step 1714. A vendor command sent to the SSD is used to disable some duplicated functions, such as compression, encryption, data splitting, that are performed by GND driver 100, step 1720.

When the SSD is not of a standard type, step 1710, a vendor command is sent to the SSD to get various information about the attached SSD, such as channel numbers, a flash memory ID (Identify the capacity, page size, block size, planes, SLC/MLC/TLC of each flash memory), DRAM size, firmware version, etc., step 1716. Parameters such as the meta-page size are optimized for the SSD to optimize performance, it includes the adjustment of SSD partition alignment, step 1718. A vendor command sent to the SSD disables some duplicated functions, such as compression, encryption, and data splitting, that are performed at a different level, step 1720.

For SSD Partition Alignment, SSDs are divided into blocks composed of multiple pages, and each flash block must be fully erased prior to re-writing. The write speed will suffer greatly if the SSD controller has to perform unnecessary block erase operations due to partition misalignment. Proper partition alignment is one of the most critical attributes that can greatly boost the I/O performance of an SSD and increase its lifespan due to reduced read-modify-write operations.

In fact, for best performance the partition offset should align with a multiple of the NAND Page Size (generally 8 KB), NAND Erase Block Size (generally 2 MB), and File Allocation Unit (cluster size 4 KB by default in NTFS).

Green NAND Device (GND) Driver

Overall, a GND driver having a persistent mode needs a battery power backup when the power source's power is lost. It will be activated when the power is unexpectedly lost or is shut down by the user's selection. The CPU states, caches, and resume routine will be stored to DRAM first then the DRAM contents will be stored to SSD at power off or failure. At power reboot, the previous DRAM contents will be reloaded from SSD to DRAM. In this mode and normal operation, all the GND driver functions are not enabled.

For the Endurance plus persistent mode, during the normal operation, some of the GND driver will be enabled. The GND driver will encrypt/decrypt the data write/read between the host and SSD. It also performs compression/decompression on the data write/read between the host and SSD. Furthermore, it de-duplicates the write data from the host to the SSD.

The data manager's data splitter divides the data into different types such as user data, meta data, paging and temp. Each type of data will have its own write cache and meta-page grouping. It will group the partial page data to a meta-page before sending to the SSD and ungrouping the meta-page data from SSD to host. For an environment such as a server, the data manager's data splitter can be disabled.

IPDRAM can be used to identify the selected portion of DRAM data to store the data from the DRAM to the SSD controlled by the CPU. For the performance plus persistent mode, the write cache and ramdisk functions can be enabled fully.

A Green NAND Device driver having a power down mode may not have battery power backup when the power source's power is lost. It will be activated when the power is unexpectedly lost or is shut down by the user's selection. All the GND driver functions are not enabled during normal operation. The write data still being processed in the DRAM will be lost if unexpected power loss occurs and not battery backup power exists. For the Endurance plus power down mode the backup power may not available, such as for a desktop PC. The GND driver will utilize a limited portion of the host DRAM. At normal operation, the GND driver will encrypt/decrypt the data write/read between the host and SSD. It also performs compression/decompression of the data write/read between the host and SSD. Furthermore, it de-duplicates the write data from the host to SSD.

The data manager's data splitter divides the data into different types such as user data, meta data, paging and temp. Each type of data will have its own write cache and meta-page grouping. It will group the partial page data to meta-page before sending to the SSD and ungrouping the meta-page data from SSD to host. IPDRAM can be used to identify the selected portion of DRAM data to store the data from DRAM to the SSD controlled by the CPU. Ramdisk can be used to improve performance for the temp data such as temporary internet that can be disposed when power is lost unexpectedly.

In a backup power available environment such as a notebook, portable devices, or a smartphone, performance plus Power Down mode can be used. Write caches and ramdisk can be used in normal operation. The above six modes may use the transaction manager to ensure that data is completely written or transferred to the SSD. These six modes may also use the settings such as indexing, search indexing, defragmentation, host hibernation, prefetching, superfetching, write caching, and write cache buffer flushing to optimize the system to achieve the best endurance and performance result. Furthermore, the GND driver can be integrated into the OS and BIOS environment and make the system more robust.

Alternate Embodiments

Several other embodiments are contemplated by the inventors. For example many kinds of power supplies, batteries, super capacitors, etc. may be used and in various combinations. Isolating switches may be implemented in a variety of ways. There may be more than one isolating power domain on a motherboard.

While moving a full meta-page to the SEED, SSD, or to flash has been described, a nearly full meta-page could also be moved before being completely full. Thus full may refer to being within some threshold of full, such as the meta-page size minus 512 bytes.

Many encodings of the data-type bits and other status fields, pointers, etc. are possible. The data-type status bits do not need to be the first bits in an entry. Entries could be linked to entries in other tables, such as having a separate table for tags or valid bits. Temporary files could have a variety of extensions, and new extensions could be added to the list to search for. Temporary files created by well-known programs such as word processors and internet browsers have well-known files extensions, but additional extensions may be added at any time. These additional file extensions could be added through firmware updates to the control software for SEED and SSD controllers, or by software updated to SSD application 180 and VMD driver 100.

The size of DRAM buffer used by each part of ETL may be fixed by the firmware of the SSD controller. The each part of ETL also can be dynamically adjusted by the controller firmware automatically or manually based on the usage or preference of the user. Due to the limited size of DRAM buffers, not all ETL functions may be accommodated in it at the same time. The various ETL functions may be adaptive to the real working environment. The controller may adjust the size used by each ETL to optimize the DRAM buffer. The adaptive adjustment can be done periodically based on the usage patterns of the device.

For a TLC flash device, the DRAM buffer can be substituted with NVRAM such as phase-change memory (PCM), ferroelectric random-access memory (FRAM), Magnetoresistive RAM (MRAM), Memristor, PRAM, Resistive RAM (RRAM), Racetrack memory, and nano RAM (NRAM) etc. The advantage of NVRAM is that all the ETL supported tables etc. may remain in NVRAM (no need to put in the flash memory) and other flash memory destined data (such as data write cache etc.) is retained even with power off, so the backup power circuit is no longer needed even when power is turned off suddenly. A tmp etc. & mapping table, and read cache & mapping tables can be optionally discarded at the power down or at the next power up initialization. Other than MLC, the disadvantage of NVRAM is the cost. For MLC, the disadvantage is slow speed and limitations on write/erase times. The MLC can be derived from TLC by allocating part of TLC that only has strong pages programmed. Some of the ETL functions may be implemented in an SRAM in SEED SSD 200.

In the TLC flash device, the DRAM buffer also can be substituted with combinations such as DRAM+SRAM, DRAM+MLC, DRAM+PCRAM or DRAM+MRAM. When combinations of DRAM buffering are used such as DRAM+ MLC, the ETL supported functions are managed in DRAM but some of them are stored in MLC. Some of the data in the DRAM buffer can be discarded eventually such as temp data and mapping tables, and read cache and mapping tables that are not moved to MLC when power is off. Tables and data that need to be kept when power is off such as the block erase count table, the page Status table, S.M.A.R.T. data collector, etc. need to be stored to MLC when power is turned off suddenly. Copying to MLC is faster compared to TLC flash memory. In case of server applications, temp data and mapping tables, and read cache and mapping tables cannot be discarded; those areas will be stored to MLC using power backup when power is turned off suddenly. Another way is to insure the data of interest in ETL of the DRAM is copied to the MLC. In case of a power off, a valid copy of data in ETL can be kept at MLC. At power up, the data in ETL can be loaded back to DRAM from MLC. The copying method can be modified by recording minor differences, which will reduce the amount of copying data and therefore reduce the writes to MLC.

DRAM and MLC or DRAM and SLC do not necessary use different types of flash memory 196, 342 such as SLC, MLC, TLC, QLC, PLC, 3D NAND etc. Instead, the MLC can be derived from the TLC by allocating a part of the TLC that only has strong pages programmed. The SLC can be derived from MLC, TLC, QLC, PLC, etc. by allocating part of the MLC, TLC, QLC, PLC, etc. that only has strong pages programmed. For example, an Enhanced TLC Flash can be realized by a portion of TLC configured as SLC (with strong pages) using such as one quarter of the TLC used as SLC (strong page) and the reminder of TLC as TLC (weak page). Or a portion of TLC configured as MLC (strong page) and the reminder of TLC as TLC (weak page). Additionally, program/erase manager 41 (FIG. 14) may slow down page writing and block erasing time to help prolong the life of the oxide layer of cells of the flash. The slower page write/block erase time can be applied to the Enhanced TLC Flash to increase the endurance at the expense of decreased retention time. By using refresh manager 202, the retention time can be increased. Due to the Enhanced TLC Flash including SLC (strong page) and TLC (weak page) and with differing retention times, refresh manager 202 can track the usage of blocks as SLC (strong page) or TLC (weak page) and then adjust the refresh time accordingly. Alternatively, an enhanced TLC Flash can be realized by a portion of TLC configured as SLC (strong page) usage such as one quarter of TLC used as SLC (strong page). Similarly, MLC can be used as combination of SLC(strong page)/MLC(weak page) and QLC can be used as combinations such as SLC(strong page)/QLC(weak page), MLC(strong page)/QLC(strong page), TLC(strong page)/QLC(strong page), or any combination of SLC/MLC/TLC/QLC. Alternatively, MLC can be used as SLC (strong page), etc. The above functions also can be implemented in SEED SSD 200.

The endurance technologies described herein attempt to solve the endurance issues of NAND flash memory. There are several non-volatile memories, such as MRAM, PCM, RRAM, Memristors, NRAM, etc. which are using competing technologies to replace NAND flash memory.

The super-endurance flash drive can be combined with a Hard Disk Drive (HDD), with a super-endurance flash drive as the cache and HDD as storage. The super-endurance flash drive is of high endurance and is a better fit as a cache. The overall performance may improve for this hybrid device. Another way to insure the data of interest in ETL of DRAM is copying to the HDD. In case of power off, a valid copy of data in ETL can be kept in HDD. At power up, those data in ETL can be loaded back to DRAM from HDD. The copying method can be modified by recording the minor differences, which will reduce the amount of copying data and therefore reduce the writes to HDD.

The boot image of the OS can be preloaded to the DRAM buffer to speed up the host boot up. Once the boot up process ends, the DRAM buffer is released for later normal operation. The dirty DRAM buffer may be written to flash memory when the host is in sleep or stand-by mode. The dirty DRAM buffer can be written to flash memory when the user of the host is logged out.

The grouping of write data is not limited to a page as a unit. Grouping data can be in a larger unit such as multiple-pages (meta-pages) and whole blocks, etc.

While categorization of the data-type of a host access has been described as comparing the logical address from the host to one or more address ranges, this compare may compared only a portion of the logical address to ranges that represent the address ranges. Data types could also be identified by parsing the host write data for certain formats, such as a FAT format or a FDB format. Earlier host writes in a sequence could also be checked for their data formats. The FAT file system has been used as an example. FDB/FAT are the meta data of the FAT file system. Other file systems such as LINUX, Apple OS, and Android etc., have their own meta data with different names but are equivalents.

Each block may be divided into multi-page zones. For example, a block may have 16 pages and 4 zones, with 4 pages per zone. Some of the mapping may be for zones rather than for individual pages or blocks in this alternative embodiment. Alternatively, in a special case, there can be one page per zone. Fewer mapping entries are needed with zone-mode than for page-mode, since each zone is multiple pages.

The upper bits of the logical-sector address (LSA) from the host may select a cluster or district. All of the entries in a mapping table may be for the same district. When the district number from the LSA matches the district number of all the entries in the mapping table, the LBA from the LSA selects an entry in the mapping table. Hybrid or multi-level mapping tables may also be used. Since the LBA ranges for the FAT1/2 are known, the table contents data type bits "100" can be omitted. The Mapping table can have a granularity of block or page.

Copying of blocks for relocation is less frequent with page mapping since the sequential-writing rules of the non-SLC flash are violated less often in page mode than in block mode. This increases the endurance of the flash system and increases performance.

The mapping tables may be located in an extended address space, and may use virtual addresses or illegal addresses that are greater than the largest address in a user address space. Pages may remain in the host's page order or may be remapped to any page location. In another embodiment such as for data center applications, the paging and temporary files can be treated as normal user data to simplify the controller operation but with the expense of flash endurance. The endurance spare/swap area can provide extended over-provisioning by using a DRAM buffer as endurance spare/swap buffer instead of using flash memory. The backup power is needed to write the spare/swap data to the flash in case of power off. The backup power can be capacitors, super capacitors, a battery, or UPS. The compression function can be optionally turned off in situations when the host is already providing a compression function.

In other embodiments, the controller can treat the paging file as user data file to simplify the controller function.

Many variations of the block diagrams are possible. A ROM such as an EEPROM could be connected to or part of a controller and be dedicated to storing firmware for a virtual storage processor. This firmware could also be stored in the main flash modules. The Host interface bus can be a Serial AT-Attachment (SATA) bus, a Peripheral Components Interconnect Express (PCIe) bus, a compact flash (CF) bus, or a Universal-Serial-Bus (USB), NVMe, a Firewire 1394 bus, a Fibre Channel (FC) bus, Thunderbolt, etc. Internal buses may use standards such as for a Serial AT-Attachment (SATA) bus, an integrated device electronics (IDE) bus, a Peripheral Components Interconnect Express (PCIe) bus, a compact flash (CF) bus, a Universal-Serial-Bus (USB) bus, a Secure Digital (SD) bus, a Multi-Media Card (MMC) bus, a Firewire 1394 bus, a Fibre Channel (FC) bus, various Ethernet buses, etc. SCFD can include SLC or MLC flash only or can be combined SLC/MLC flash.

The flash memory may be embedded on a motherboard or SSD board or could be on separate modules. Capacitors, buffers, resistors, and other components may be added. The controller may be integrated on the motherboard or on a separate board or module. Flash memory can be integrated with the controller or with raw-NAND flash memory chips as a single-chip device or a plug-in module or board.

Using multiple levels of controllers, such as in a president-governor arrangement of controllers, the controllers in the SEED may be less complex than would be required for a single level of control for wear-leveling, bad-block management, re-mapping, caching, power management, etc. Less expensive hardware may be used in the controller, such as using an 8051 processor for a controller or a virtual storage processor or a transaction manager, rather than a more powerful processor core such as a an Advanced RISC Machine ARM-9 CPU core. For a certain applications, a more powerful processor is considered.

Different numbers and arrangements of flash storage blocks can connect to the SEED. Rather than use a LBA storage bus interface or differential serial packet buses, other serial buses such as synchronous Double-Data-Rate (DDR), ONFI, Toggle NAND, a differential serial packet data bus, a legacy flash interface, etc.

Mode logic could sense the state of a pin only at power-on rather than sense the state of a dedicated pin. A certain combination or sequence of states of pins could be used to initiate a mode change, or an internal register such as a configuration register could set the mode. A multi-bus-protocol chip could have an additional personality pin to select which serial-bus interface to use, or could have programmable registers that set the mode to hub or switch mode.

A transaction manager, controllers, processes, and functions can be implemented in a variety of ways. Functions and processes can be programmed and executed by a CPU or other processor, or can be implemented in dedicated hardware, firmware, or in some combination. Many partitionings of the functions can be substituted. The SEED controller may be hardware, or may include firmware or software or combinations thereof.

Overall system reliability is greatly improved by employing Parity/ECC with multiple flash channels, and stripping data segments into a plurality of NVM blocks. For example, a ninth flash chip can be used with the flash memory interface. The Parity of the other eight flash chips is written to this ninth flash chip to provide extra protection of data in case one of the eight flash chips encounters a fatal read error. However, it may require the usage of a CPU engine with a DDR/SDRAM cache in order to meet the computing power requirement of the complex ECC/Parity calculation and generation. Another benefit is that, even if one flash block or flash module is damaged, data may be recoverable, or the SEED can initiate a "Fault Recovery" or "Auto-Rebuild" process to insert a new flash module, and to recover or to rebuild the "Lost" or "Damaged" data. The overall system fault tolerance is significantly improved.

The flash cell's floating gate is programmed by injection of electrons into it. The flash memory controls the injection of electrons at page write so that it stays within two reference voltage levels. The NAND flash structure's bit-lines are connected to a string of 32 cells and each cell is also connected to 32 different word-lines. After a cell is written with data, any write and read to the adjacent cells will cause interference to the cell. The interference will either inject or remove electrons from the floating gate of the cell. A long period of time will also affect the number of electrons in the floating gate of the cell. Due to the changing of the quantity of electrons in the floating gate, the output voltage level will shift accordingly when read. If the output voltage level shifts across the reference voltage boundary, the read result will be wrong.

Wider or narrower data buses and flash-memory chips could be substituted, such as with 16 or 32-bit data channels. Alternate bus architectures with nested or segmented buses could be used internal or external to the SEED. Two or more internal buses can be used in the SEED to increase throughput. More complex switch fabrics can be substituted for the internal or external bus.

Data striping can be done in a variety of ways, as can parity and error-correction code (ECC). Packet re-ordering can be adjusted depending on the data arrangement used to prevent re-ordering for overlapping memory locations. The SEED can be integrated with other components or can be a stand-alone chip.

Additional pipeline or temporary buffers and FIFO's could be added. Separate page buffers could be provided in each channel. A clock source could be added.

A single package, a single chip, or a multi-chip package may contain one or more of the plurality of channels of flash memory and/or the SEED or SSD. The invention is not limited to the usage of SCFD. SCFD can be replaced with any kind of nonvolatile device with nonvolatile flash memory and a controller.

A MLC-based flash device may have four MLC flash chips with two parallel data channels, but different combinations may be used to form other flash modules, for example, four, eight or more data channels, or eight, sixteen or more MLC chips. The flash devices and channels may be in chains, branches, or arrays. For example, a branch of 4 flash devices could connect as a chain to the SEED. Other size aggregation or partition schemes may be used for different access of the memory.

The host can be a desktop PC motherboard or other PC platform such as a server, a Notebook, a Netbook, a tablet, a smart phone, a mobile communication device, a personal digital assistant (PDA), a digital camera, a production tool or tester, a combination device, or other device. The host bus or host-device interface can be SATA, PCIE, Thunderbolt, SD, USB, NVMe, eMMC, iSSD, or other host bus, while the internal bus to a flash module can be PATA, multi-channel SSD using multiple SD/MMC, compact flash (CF), USB, or other interfaces in parallel. A flash module could be a standard PCB or may be a multi-chip modules packaged in a TSOP, BGA, LGA, COB, PIP, SIP, CSP, POP, or Multi- Chip-Package (MCP) packages and may include raw-NAND flash memory chips or raw-NAND flash memory chips may be in separate flash chips, or other kinds of NVM flash memory such as toggle, ONFI, eMMC, iSSD, 3D NAND. SEED SSD may use eMMC with a RAID and eMMC may use a SEED structure. The internal bus may be fully or partially shared or may be separate buses. The SSD system may use a circuit board with other components such as LED indicators, capacitors, resistors, etc. Power management may be added at one or more levels. The SEED SSD can work with or without a VMD driver. A PCIe RAID DRAM cache card may incorporate a VMD driver and multiple SEED structured SSD's.

Directional terms such as upper, lower, up, down, top, bottom, etc. are relative and changeable as the system or data is rotated, flipped over, etc. These terms are useful for describing the device but are not intended to be absolutes.

NVM flash memory may be on a flash module that may have a packaged controller and flash die in a single chip package that can be integrated either onto a PCBA, or directly onto the motherboard to further simplify the assembly, lower the manufacturing cost and reduce the overall thickness. Flash chips could also be used with other embodiments including the open frame cards.

Rather than use a controller only for flash-memory storage, additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IrDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

The size of data such as sectors, pages, blocks may vary. A sector may have 512 bytes, a page may have 16 sectors, and a block may have 128 pages as one of many examples.

The write data in the ETL alternatively can be packed and logged one-by-one to the data write cache as a page unit by the flash controller. The packed data size from the host can be either a large size such as more than a meta-page unit or a small size such as less than a sector. A header is added the show the relation of the data to the LBA from host. A separate packed table maps the LBA from the host to the offset location of the data and header in the meta-page unit of the data write cache. The data write cache can have a capacity of more than two meta-page units in size. When the data write cache is full or an elapsed time is reached, a selected meta-page unit will be moved to the flash memory from the data write cache. The packed table maps the LBA from the host to the offset location of the data and header in the meta-page unit of the flash memory. In the case of overwriting old data from host, if the packed data is still in the data write cache, the old data can be discarded by moving the packed data up and appending the new updated data into the data write cache and updating the packed table. Otherwise, if the packed data is in the flash memory, the new and old data will be compared and a delta data will be generated to show the difference. The delta data and its header will be appended to the data write cache. The new header will also include the previous old data location. The packed table will map the LBA to the delta data position.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A Super Enhanced Endurance Device (SEED) Solid State Drive (SSD) with a Green NAND Device (GND) driver comprising:
   a host interface for receiving host reads and host writes from a host GND driver with capabilities of encryption, compression, meta-page grouping;
   a controller for controlling access to a flash memory and to a SEED Dynamic-Random-Access Memory (DRAM) buffer in response to host reads and host writes received by the host interface, the controller writing host data to the SEED DRAM buffer;
   the SEED DRAM buffer for storing a host Endurance Translation Layer (ETL);
   a flash interface for accessing a flash memory or a flash memory device
   an error-correction code (ECC) manager for generating ECC code to append to grouped meta-pages written to the flash memory;
   a bad page manager for tracking bad pages of the flash memory; and a wear leveler for assigning new data to empty blocks of the flash memory having a low erase count or move the block data with low erase count to an empty high erase count block;

a data type of file type identifier received from a host GND driver;

a data split manager for sorting host write data based on the data type generated by the file type identifier;

a data write cache for storing host write data having a user data type;

a meta-data cache for storing host write data having a meta-data data type;

a paging cache for storing host write data having a paging file data type;

a temp cache for storing host write data having a temp data type.

2. A Super Enhanced Endurance Device (SEED) Solid State Drive (SSD) with a Green NAND Device (GND) driver comprising:

a host interface for receiving host reads and host writes from a host GND driver with capabilities of encryption, compression, meta-page grouping;

a controller for controlling access to a flash memory and to a SEED Dynamic-Random-Access Memory (DRAM) buffer in response to host reads and host writes received by the host interface, the controller writing host data to the SEED DRAM buffer;

the SEED DRAM buffer for storing a host Endurance Translation Layer (ETL);

a flash interface for accessing a flash memory or a flash memory device an error-correction code (ECC) manager for generating ECC code to append to grouped meta-pages written to the flash memory;

a bad page manager for tracking bad pages of the flash memory; and a wear leveler for assigning new data to empty blocks of the flash memory having a low erase count or move the block data with low erase count to an empty high erase count block;

a DRAM buffer, controlled by the controller;

a spare/swap area in the DRAM buffer;

wherein the controller uses the spare/swap area in the DRAM buffer to merge valid data in the flash memory with new data from the host to generate combined data when over-writing a full page or a partial page of an existing block in the flash memory, by writing new data to a spare block in the DRAM buffer related to the existing block in the flash memory, and when the spare block is needed by additional new data for a different block in the flash memory, writing a combination of the spare block with the new data and data from the existing block in the flash memory into a swap block in the flash memory and marking a page status for pages of the existing block in the flash memory as a garbage page.

3. The SEED SSD with GND driver of claim 2 further comprising:

a backup power supply on the SEED SSD that provides power to the SEED SSD when the host is off;

wherein the spare/swap area in the DRAM buffer is used for over-provisioning the flash memory as spare blocks.

4. A Super Enhanced Endurance Device (SEED) Solid State Drive (SSD) with a Green NAND Device (GND) driver comprising:

a host interface for receiving host reads and host writes from a host GND driver with capabilities of encryption, compression, meta-page grouping;

a controller for controlling access to a flash memory and to a SEED Dynamic-Random-Access Memory (DRAM) buffer in response to host reads and host writes received by the host interface, the controller writing host data to the SEED DRAM buffer;

the SEED DRAM buffer for storing a host Endurance Translation Layer (ETL);

a flash interface for accessing a flash memory or a flash memory device an error-correction code (ECC) manager for generating ECC code to append to grouped meta-pages written to the flash memory;

a bad page manager for tracking bad pages of the flash memory; and a wear leveler for assigning new data to empty blocks of the flash memory having a low erase count or move the block data with low erase count to an empty high erase count block;

a power backup supply on a host that provides power to the SEED SSD or a backup power supply on the SEED SSD that provides power to the SEED SSD when the host is off;

a processor in a low power state and a timer that is kept alive when the host is off;

wherein the DRAM and the flash memory have no power provided;

wherein when the timer reaches a timeout threshold, the timer wakes up the processor and power is provided to the DRAM and to the flash memory;

whereby the processor checks a write date of a flash block and refreshes the flash block when a retention time is over a retention limit.

* * * * *